US012575243B2

(12) United States Patent
Lee et al.

(10) Patent No.: US 12,575,243 B2
(45) Date of Patent: Mar. 10, 2026

(54) DISPLAY DEVICE AND METHOD OF MANUFACTURING THE SAME

(71) Applicant: Samsung Display Co., Ltd., Yongin-si (KR)

(72) Inventors: Hyun Wook Lee, Yongin-si (KR); Kyung Tae Chae, Yongin-si (KR); Ki Bum Kim, Yongin-si (KR); Jin Taek Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 17/449,114

(22) Filed: Sep. 28, 2021

(65) Prior Publication Data

US 2022/0102422 A1     Mar. 31, 2022

(30) Foreign Application Priority Data

Sep. 28, 2020     (KR) ........................ 10-2020-0126343

(51) Int. Cl.
H10H 29/14          (2025.01)
H10H 20/01          (2025.01)
(Continued)

(52) U.S. Cl.
CPC .......... H10H 29/142 (2025.01); H10H 20/01 (2025.01); H10H 20/821 (2025.01);
(Continued)

(58) Field of Classification Search
CPC ............................ H10H 29/142; H01L 27/156
(Continued)

(56) References Cited

U.S. PATENT DOCUMENTS 7,456,566 B2     11/2008  Seo et al.
7,741,640 B2     6/2010   Seo et al.
(Continued)

FOREIGN PATENT DOCUMENTS

JP                4414358 B2     2/2010
KR     10-2005-0029826 A     3/2005
(Continued)

OTHER PUBLICATIONS

US 10,854,671 B2, 12/2020, Chae et al. (withdrawn)
(Continued)

*Primary Examiner* — Hsin Yi Hsieh
(74) *Attorney, Agent, or Firm* — Womble Bond Dickinson (US) LLP

(57)          ABSTRACT

A display device according to one embodiment of the present disclosure includes: a base layer including a display area; a circuit layer including a conductive pattern in a pixel area of the display area; a first insulating film on the circuit layer, the first insulating film being opened in a contact portion on the conductive pattern; a reflective film on the first insulating film and including a first opening that corresponds to the contact portion; a second insulating film on the reflective film and including a second opening overlapping the first opening; and a display layer on the second insulating film, connected to the conductive pattern through the contact portion, and including a first electrode, a second electrode, and a light-emitting element overlapping the reflective film, wherein, in the contact portion, the reflective film has a wider opening than the second insulating film.

13 Claims, 38 Drawing Sheets

(51) Int. Cl.

| | |
|---|---|
| *H10H 20/821* | (2025.01) |
| *H10H 20/831* | (2025.01) |
| *H10H 20/833* | (2025.01) |
| *H10H 20/84* | (2025.01) |
| *H10H 20/851* | (2025.01) |
| *H10H 20/855* | (2025.01) |
| *H10H 20/856* | (2025.01) |
| *H10H 20/80* | (2025.01) |

(52) U.S. Cl.
CPC ........ *H10H 20/831* (2025.01); *H10H 20/833* (2025.01); *H10H 20/84* (2025.01); *H10H 20/8512* (2025.01); *H10H 20/855* (2025.01); *H10H 20/856* (2025.01); *H10H 20/032* (2025.01); *H10H 20/0363* (2025.01); *H10H 20/882* (2025.01)

(58) Field of Classification Search
USPC .......................................................... 257/98
See application file for complete search history.

(56) References Cited

U.S. PATENT DOCUMENTS

| | | | |
|---|---|---|---|
| 9,599,857 B2 | 3/2017 | Bibl et al. | |
| 9,966,553 B2 | 5/2018 | Choi et al. | |
| 10,381,424 B2 | 8/2019 | Ohchi | |
| 10,818,647 B2 | 10/2020 | Kim et al. | |
| 12,176,469 B2* | 12/2024 | Biebersdorf | ........ H01L 25/0753 |
| 2017/0062679 A1 | 3/2017 | Lee et al. | |
| 2020/0020741 A1 | 1/2020 | Woo | |
| 2022/0037623 A1* | 2/2022 | Park | ..................... H10K 50/865 |
| 2023/0066558 A1* | 3/2023 | Kim | ........................ H01L 33/10 |

FOREIGN PATENT DOCUMENTS

| | | |
|---|---|---|
| KR | 10-0560792 B1 | 3/2006 |
| KR | 10-2017-0026958 A | 3/2017 |
| KR | 10-2018-0007025 A | 1/2018 |
| KR | 10-2018-0025425 A | 3/2018 |
| KR | 10-2018-0032715 A | 4/2018 |
| KR | 10-2018-0056646 A | 5/2018 |
| KR | 10-2020-0008075 A | 1/2020 |
| KR | 10-2020-0028065 A | 3/2020 |
| KR | 10-2020-0085770 A | 7/2020 |

OTHER PUBLICATIONS

Korean Notice of Allowance dated Jan. 16, 2026 regarding Korean Patent Application No. 10-2020-0126343 corresponding to U.S. Appl. No. 17/449,114 (6 pages).

* cited by examiner $$PXL \begin{cases} PXL1 \\ PXL2 \\ PXL3 \end{cases}$$

PXL (PCL)

SCP2

SL

CNT1
CH
BRP1
BRP6

DL

SENL_V

PL1_V

Cst_E1
Cst_E3
Cst_E2

PL2_V

BRP2
BGE
BRP3
SCP1
SCP3

CNT2

SSL

BRP4
SENL_H

PL1 (PL2)

BRP5

M2

M1

M3

DR2

DR1

BML : BGE, Cst_E1, SENL_H
SCL : SCP1, SCP2, SCP3
GAT : Cst_E2, SL, SSL, PL1 (PL2)
SD1 : BRP1~BRP5, Cst_E3, DL, SENL_V
SD2 : BRP6, PL1_V, PL2_V

INS2
RFL
INS1
ILD2
ILD1
GI
BFL
BSL

CNT2

PL2 { MTL TCL

BRP { TCL MTL

CNT1

PCL

TE1(DE)
BGE SCP
GE TE2(SE)
M

CDP { BRP
PL2

CNT { CNT1
CNT2

DISPLAY DEVICE AND METHOD OF MANUFACTURING THE SAME

CROSS-REFERENCE TO RELATED APPLICATION

This application claims priority to and the benefit of Korean Patent Application No. 10-2020-0126343 filed in the Korean Intellectual Property Office on Sep. 28, 2020, the entire content of which is incorporated herein by reference.

BACKGROUND

1. Field

The present disclosure relates to a display device and a method of manufacturing the same.

2. Description of the Related Art

Recently, interest in information displays is increasing. Accordingly, research and development for display devices are continuously being conducted.

SUMMARY

One embodiment of the present disclosure provides a display device capable of securing front luminous efficiency of a pixel including a light-emitting element and also improving manufacturing efficiency, and a method of manufacturing the same.

A display device according to one embodiment of the present disclosure includes: a base layer including a display area; a circuit layer including a conductive pattern in a pixel area of the display area; a first insulating film on the circuit layer, the first insulating film being opened in a contact portion on the conductive pattern; a reflective film on the first insulating film and including a first opening that corresponds to the contact portion; a second insulating film on the reflective film and including a second opening overlapping the first opening; and a display layer on the second insulating film, connected to the conductive pattern through the contact portion, and including a first electrode, a second electrode, and a light-emitting element overlapping the reflective film, wherein, in the contact portion, the reflective film has a larger opening than the second insulating film, and a peripheral area around the second opening of the second insulating film covers a peripheral area around the first opening of the reflective film.

In the contact portion, the second insulating film may completely cover a surface of the reflective film including a side surface of the reflective film.

The conductive pattern may be formed as a multi-layer pattern including a metal film and a transparent conductive film on the metal film.

In the contact portion, the first electrode may be in contact with an upper surface of the transparent conductive film to be connected to the conductive pattern.

The reflective film may be formed as a metal film including at least one type of a metal or an alloy.

The reflective film may include a plurality of first openings each corresponding to respective contact portions positioned in respective pixel areas, and the second insulating film may include a plurality of second openings respectively overlapping the plurality of first openings at all points at which the plurality of first openings are located.

The second insulating film has an opening in the contact portion that has a different slope as compared with the first insulating film and the reflective film.

The reflective film may completely cover at least one area of each of the first electrode and the second electrode and a lower portion of an emission area in which the light-emitting element is located.

Each of the first electrode and the second electrode may include a transparent conductive material.

The first electrode and the second electrode may be spaced from each other on the second insulating film, and the light-emitting element may be aligned between the first electrode and the second electrode.

The display layer may further include: a first contact electrode connecting a first end portion of the light-emitting element to the first electrode; and a second contact electrode connecting a second end portion of the light-emitting element to the second electrode.

The circuit layer may include circuit elements and lines in respective pixel areas, and the conductive pattern may include at least one of a bridge pattern connecting at least one of the circuit elements and the first electrode, and a power line connected to the second electrode.

The contact portion may include at least one of a first contact portion on the bridge pattern connecting the bridge pattern and the first electrode, and a second contact portion on the power line connecting the power line and the second electrode.

The reflective film may include a plurality of division patterns disconnected at a peripheral area of the pixel area to be separated from each other.

A method of manufacturing a display device according to one embodiment includes forming a circuit layer including a circuit element of a pixel and a conductive pattern connected to the circuit element, on a base layer; sequentially forming a first insulating film, a reflective film, and a second insulating film on the circuit layer; etching the second insulating film such that the reflective film is exposed in a contact portion corresponding to the conductive pattern; sequentially etching the reflective film and the first insulating film in the contact portion using the second insulating film as a mask such that the conductive pattern is exposed; performing a reflow process on the second insulating film to cover a periphery of the reflective film with the second insulating film in the contact portion; and forming a display layer connected to the conductive pattern through the contact portion, on the second insulating film.

The sequentially etching of the reflective film and the first insulating film may include: etching the reflective film through wet etching using the second insulating film as the mask; and etching the first insulating film through dry etching using the second insulating film as the mask.

In the etching of the reflective film, the reflective film may be over-etched such that the reflective film has a larger opening than the second insulating film.

The etching of the second insulating film may include: etching the second insulating film by an entire thickness thereof in the contact portion such that the reflective film is exposed in the contact portion; and etching the second insulating film by a partial thickness thereof in a peripheral area of the pixel, using a halftone mask.

The method may further include: between the sequentially etching of the reflective film and the first insulating film and the performing of the reflow process on the second insulating film, performing an ashing process on the second insulating film to expose the reflective film in the peripheral area of the pixel; and secondary etching the reflective film through wet etching using the second insulating film as the mask such that the reflective film is disconnected in the peripheral area of the pixel.

The forming of the display layer may include: forming a first electrode and a second electrode connected to respective conductive patterns through respective contact portions, on the second insulating film; aligning a light-emitting element between the first electrode and the second electrode; and connecting the light-emitting element between the first electrode and the second electrode.

BRIEF DESCRIPTION OF THE DRAWINGS

FIGS. 8A, 8B, and 9 are cross-sectional views each illustrating a display area according to one embodiment of the present disclosure.

FIGS. 11A-11K are cross-sectional views illustrating a method of manufacturing a display device according to one embodiment.

FIGS. 14A-14G are cross-sectional views illustrating a method of manufacturing a display device according to one embodiment.

FIGS. 15 and 16 are cross-sectional views each illustrating a display panel according to one embodiment of the present disclosure.

DETAILED DESCRIPTION

Figure 1A:
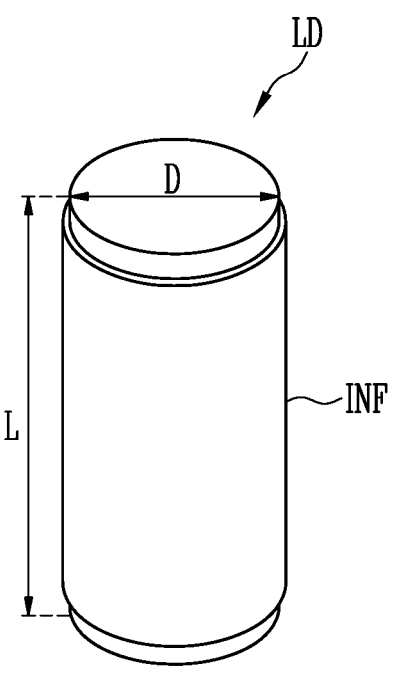
FIG. 1A is a perspective view illustrating a light-emitting element according to one embodiment of the present disclosure.

The present disclosure can be variously modified in various embodiments and specific embodiments will be described and illustrated in the drawings. In the following description, the singular forms "a," "an," and "the" are intended to include the plural forms as well, unless the context clearly indicates otherwise.

On the other hand, the present disclosure is not limited to the following embodiments disclosed herein and may be modified and implemented in various forms. Further, each of the following embodiments may be implemented alone or may be implemented in combination with at least another embodiment.

In the drawings, some components that are not directly related to features of the present disclosure may be omitted in order to clearly illustrate the present disclosure. Further, some components in the drawings may be illustrated in exaggerated sizes, ratios, and the like. In the drawings, the same or similar components are denoted by the same reference numerals and signs as possible although they are illustrated in different drawings, and redundant descriptions thereof will be omitted.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration.

As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Figure 1B:
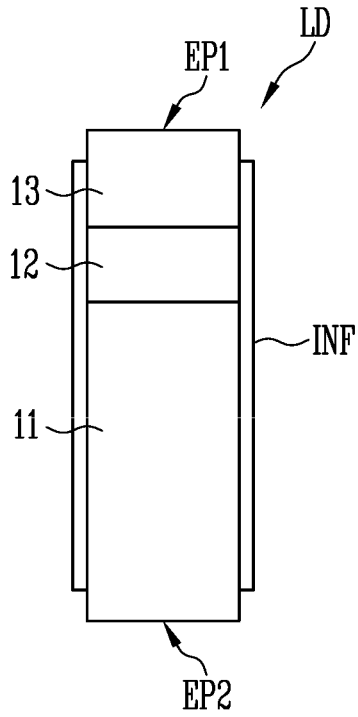
FIGS. 1B-1D are cross-sectional views illustrating different embodiments of a configuration of the light-emitting element of FIG. 1A.
Figure 1C:
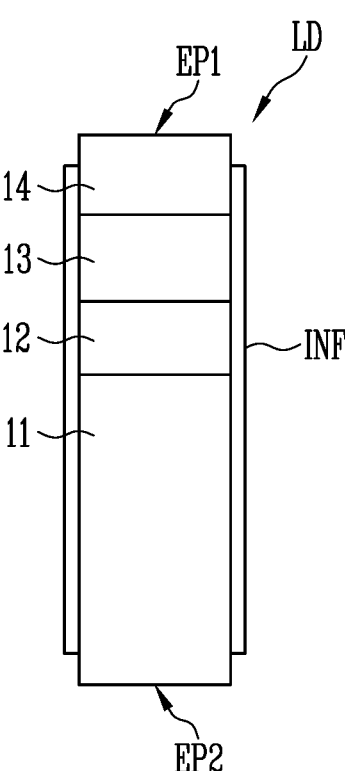
Figure 1D:
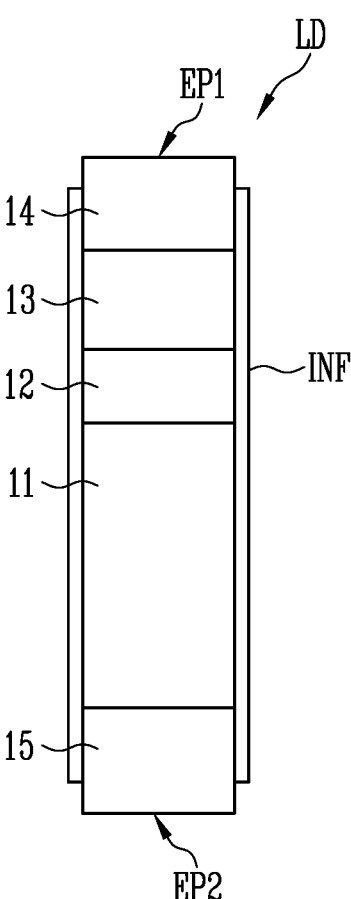

FIG. 1A is a perspective view illustrating a light-emitting element LD according to one embodiment of the present disclosure. FIGS. 1B-1D are cross-sectional views illustrating different embodiments of a configuration of the light-emitting element LD of FIG. 1A. Rod-shaped light-emitting elements LD having a circular column shape (e.g., a cylindrical shape) are illustrated in FIGS. 1A-1D, but the types and/or shapes of the light-emitting elements LD according to the present disclosure are not limited thereto.

Referring to FIGS. 1A-1D, the light-emitting element LD includes a first semiconductor layer 11, a second semiconductor layer 13, and an active layer 12 interposed between the first semiconductor layer 11 and the second semiconductor layer 13. As an example, the light-emitting element LD may include the first semiconductor layer 11, the active layer 12, and the second semiconductor layer 13 sequentially stacked in a direction of a length L thereof.

The light-emitting element LD may be provided in a rod-like shape or bar-like shape extending in one direction. When it is assumed that an extending direction of the light-emitting element LD is the direction of the length L, the light-emitting element LD may have a first end portion EP1 and a second end portion EP2 in the extending direction.

One of the first and second semiconductor layers 11 and 13 may be disposed at the first end portion EP1 of the light-emitting element LD. The other one of the first and second semiconductor layers 11 and 13 may be disposed at the second end portion EP2 of the light-emitting element LD.

According to some embodiments, the light-emitting element LD may be a rod-shaped light-emitting element (also referred to as a "rod-shaped light-emitting diode") manufactured in a rod-like shape through an etching method or the like. In the present disclosure, the term "rod-like shape" includes all of a rod-like shape and a bar-like shape, such as a circular column and a polygonal column, which are long in the direction of the length L (i.e., have an aspect ratio greater than one). A shape of a cross section of the rod-like shape is not particularly limited. For example, the length L of the light-emitting element LD may be greater than a diameter D (or width of a cross section) thereof.

The light-emitting element LD may have a small size ranging from a nanoscale to a microscale. As an example, the light-emitting element LD may have the diameter D (or width) and/or the length L which range from a nanoscale to a microscale. However, the size of the light-emitting element LD is not limited thereto. For example, the size of the light-emitting element LD may be variously changed according to design conditions of various devices, for example, a display device which uses a light-emitting device including the light-emitting element LD as a light source.

The first semiconductor layer 11 may be a first-conductivity type semiconductor layer. For example, the first semiconductor layer 11 may include at least one N-type semiconductor layer. As an example, the first semiconductor layer 11 may include an N-type semiconductor layer which includes any one semiconductor material selected from InAlGaN, GaN, AlGaN, InGaN, AlN, and InN and is doped with a first-conductivity type dopant such as silicon (Si), germanium (Ge), tin (Sn), or the like. However, a material constituting the first semiconductor layer 11 is not limited thereto, and the first semiconductor layer 11 may be made of various materials.

The active layer 12 may be disposed on the first semiconductor layer 11 and may be formed to have a single-quantum well or multi-quantum well structure. The position of the active layer 12 may be variously changed according to the type of the light-emitting element LD. The active layer 12 may emit light having a wavelength of 400 nm to 900 nm and may have a double hetero structure.

A clad layer doped with a conductive dopant may be formed on and/or under the active layer 12. As an example, the clad layer may be formed as an AlGaN layer or an InAlGaN layer. According to some embodiments, a material such as AlGaN or AlInGaN may be used to form the active layer 12. In some embodiments, the active layer 12 may be made of various materials.

The second semiconductor layer 13 may be disposed on the active layer 12 and may include a semiconductor layer which is a different type from the first semiconductor layer 11. For example, the second semiconductor layer 13 may include at least one P-type semiconductor layer. As an example, the second semiconductor layer 13 may include a P-type semiconductor layer which includes any one semiconductor material selected from InAlGaN, GaN, AlGaN, InGaN, AlN, and InN and is doped with a second-conductivity type dopant such as magnesium (Mg). However, a material constituting the second semiconductor layer 13 is not limited thereto, and the second semiconductor layer 13 may be made of various materials.

In one embodiment, the first semiconductor layer 11 and the second semiconductor layer 13 may have different lengths (or thicknesses) in the direction of the length L of the light-emitting element LD. As an example, the first semiconductor layer 11 may have a length (or thickness) that is relatively greater than that of the second semiconductor layer 13 in the direction of the length L of the light-emitting element LD. Accordingly, the active layer 12 of the light-emitting element LD may be positioned closer to the first end portion EP1 than the second end portion EP2.

When a voltage greater than equal to a threshold voltage is applied to both end portions of the light-emitting element LD, electrons and holes are combined with each other in the active layer 12, and thus, the light-emitting elements LD emits light. By controlling light emission of the light-emitting element LD using such a principle, the light-emitting element LD may be used as a light source of various light-emitting devices including pixels of a display device.

In one embodiment, the light-emitting element LD may further include additional components in addition to the first semiconductor layer 11, the active layer 12, the second semiconductor layer 13, and/or an insulating film INF surrounding the first semiconductor layer 11, the active layer 12, and the second semiconductor layer 13. For example, the light-emitting element LD may additionally include at least one fluorescent layer, active layer, semiconductor layer, and/or electrode layer disposed at one end sides of the first semiconductor layer 11, the active layer 12, and/or the second semiconductor layer 13.

For example, as illustrated in FIG. 1C, the light-emitting element LD may further include an electrode layer 14 disposed at one end side of the second semiconductor layer 13. In this case, the electrode layer 14 may be positioned at the first end portion EP1 of the light-emitting element LD.

In some embodiments, as illustrated in FIG. 1D, the light-emitting element LD may further include another electrode layer 15 disposed at one end side of the first semiconductor layer 11. As an example, the electrode layers 14 and 15 may be disposed at the first and second end portions EP1 and EP2 of the light-emitting element LD, respectively.

The electrode layers 14 and 15 may be ohmic contact electrodes but are not limited thereto. For example, the electrode layers 14 and 15 may be Schottky contact electrodes.

In some embodiments, the electrode layers 14 and 15 may include a metal or a conductive oxide. For example, the first and second electrode layers 14 and 15 may be made of at least one metal selected from chromium (Cr), titanium (Ti), aluminum (Al), gold (Au), nickel (Ni), an oxide or alloy thereof, and indium tin oxide (ITO), or a mixture thereof. Materials included in each of the electrode layers 14 and 15 may be the same or different from each other.

The electrode layers 14 and 15 may be substantially transparent or semi-transparent. Accordingly, light generated by the light-emitting element LD may pass through the electrode layers 14 and 15 to be emitted to the outside of the light-emitting element LD. In another embodiment, when the light generated by the light-emitting element LD does not pass through the electrode layers 14 and 15 and is emitted to the outside of the light-emitting element LD through an area excluding both end portions of the light-emitting element LD, the electrode layers 14 and 15 may include an opaque metal.

In one embodiment, the light-emitting element LD may further include the insulating film INF provided on a surface thereof. The insulating film INF may be formed on the surface (e.g., an outer peripheral surface) of the light-emitting element LD so as to surround an outer surface (e.g., an outer peripheral surface) of the active layer 12 at least and may also surround one area of the first and second semiconductor layers 11 and 13.

When the light-emitting element LD includes the electrode layers 14 and 15, the insulating film INF may or may not partially cover outer peripheral surfaces of the electrode layers 14 and 15 at least. That is, the insulating film INF may be selectively formed on surfaces of the electrode layers 14 and 15.

The insulating film INF may expose both end portions of the light-emitting element LD in the direction of the length L of the light-emitting element LD. For example, the insulating film INF may expose at least one of the first and second semiconductor layers 11 and 13 and the electrode layers 14 and 15 at the first and second end portions EP1 and EP2 of the light-emitting element LD. Alternatively, in another embodiment, the insulating film INF may not be provided in the light-emitting element LD.

When the insulating film INF is provided to cover the surface of the light-emitting element LD, e.g., the outer surface (e.g., an outer peripheral surface) of the active layer 12, it is possible to prevent or protect the active layer 12 from being short-circuited with at least one electrode (for example, a first or second electrode of the pixel). Accordingly, electrical stability of the light-emitting element LD may be secured. In describing each embodiment of the present disclosure, the term "connection (or coupling)" may comprehensively refer to a physical and/or electrical connection (or coupling). Further, the term "connection (or coupling)" may comprehensively refer to a direct or indirect connection (or coupling) and an integral or non-integral connection (or coupling).

The insulating film INF may include a transparent insulating material. For example, the insulating film INF may include at least one insulating material selected from $SiO_2$ or silicon oxide ($SiO_x$) not determined as $SiO_2$, $Si_3N_4$ or silicon nitride ($SiN_x$) not determined as $Si_3N_4$, $Al_2O_3$ or aluminum oxide ($Al_xO_y$) not determined as $Al_2O_3$, and $TiO_2$ or titanium oxide ($TiO_y$) not determined as $TiO_2$, but the present disclosure is not limited thereto. That is, the structural material of the insulating film INF is not particularly limited, and the insulating film INF may be made of various suitable insulating materials known to those of ordinary skill in the art.

When the insulating film INF is provided on the surface of the light-emitting element LD, surface defects of the light-emitting element LD may be reduced or minimized, thereby improving a lifetime and efficiency of the light-emitting element LD.

In some embodiments, when the insulating film INF is formed on each light-emitting element LD, it is possible to prevent an undesired short circuit between the light-emitting elements LD even when the plurality of light-emitting elements LD are closely disposed.

In one embodiment of the present disclosure, the light-emitting element LD may be manufactured through a surface treatment process. For example, when the plurality of light-emitting elements LD are mixed in a flowable solution (or solvent) and supplied to each emission area (for example, an emission area of each pixel), the light-emitting elements LD may each be surface-treated so as to be uniformly dispersed without being non-uniformly aggregated in the solution. As a non-limiting embodiment related thereto, the insulating film INF itself may be formed as a hydrophobic film using a hydrophobic material, or a hydrophobic film made of a hydrophobic material may be additionally formed on the insulating film INF.

A light-emitting device including the light-emitting element LD may be used in various types of devices, such as a display device, which require a light source For example, the plurality of light-emitting elements LD may be disposed in each pixel of a display panel, and the light-emitting elements LD may be used as light sources of each pixel. However, an application field of the light-emitting element LD is not limited to the above-described example. For example, the light-emitting element LD may be used in other types of devices, such as a lighting device, which require a light source.

Figure 2A:
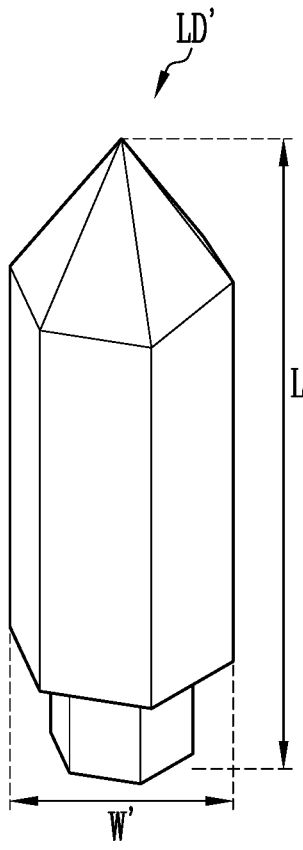
FIG. 2A is a perspective view illustrating a light-emitting element according to one embodiment of the present disclosure.
Figure 2B:
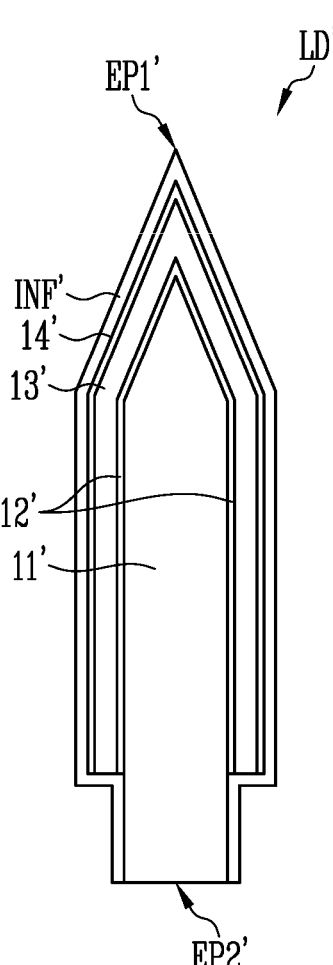
FIG. 2B is a cross-sectional view illustrating the light-emitting element of FIG. 2A.

FIG. 2A is a perspective view illustrating a light-emitting element LD' according to one embodiment of the present disclosure. FIG. 2B is a cross-sectional view illustrating the light-emitting element LD' of FIG. 2A.

According to some embodiments, FIGS. 2A and 2B illustrate the light-emitting element LD' having a structure different from those of the light-emitting elements LD illustrated in FIGS. 1A-1D, for example, a light-emitting element having a core-shell structure. That is, in the present disclosure, the type, structure, and/or shape of the light-emitting element LD may be variously changed. In the embodiments of FIGS. 2A and 2B, components similar or identical to those of the embodiments of FIGS. 1A-1D (for example, corresponding components) may be denoted by the same or similar reference numerals, and detailed descriptions thereof may be omitted. Any light-emitting elements LD and LD' of various embodiments illustrated in and/or described in reference to FIGS. 1A-2B may be applied to any display device according to embodiments of the present disclosure as light-emitting elements LD, either individually or in any suitable combinations.

Referring to FIGS. 2A and 2B, the light-emitting element LD' may include a first semiconductor layer 11', a second semiconductor layer 13', and an active layer 12' interposed between the first semiconductor layer 11' and the second semiconductor layer 13'. According to some embodiments, the first semiconductor layer 11' may be disposed in a central area (e.g., an inner area or region) of the light-emitting element LD', and the active layer 12' may be disposed on a surface of the first semiconductor layer 11' so as to cover at least one area of the first semiconductor layer 11'. The second semiconductor layer 13' may be disposed on a surface of the active layer 12' so as to surround at least one area of the active layer 12'.

Further, the light-emitting element LD' may selectively further include an electrode layer 14' surrounding at least one area of the second semiconductor layer 13' and/or an insulating film INF' disposed on an outermost surface of the light-emitting element LD'. For example, the light-emitting element LD' may further include the electrode layer 14' disposed on a surface of the second semiconductor layer 13' so as to surround at least one area of the second semiconductor layer 13' and the insulating film INF' disposed on a surface of the electrode layer 14' so as to surround at least one area of the electrode layer 14'.

According to some embodiments, the insulating film INF' may be provided on the surface of the light-emitting element LD' so as to cover a portion of an outer surface (e.g., an outer peripheral surface) of the first semiconductor layer 11' and an outer surface (e.g., an outer peripheral surface) of the electrode layer 14'. In some embodiments, after the insulating film INF' is first formed to cover the entire outer surface (e.g., an outer peripheral surface) of the electrode layer 14' included in the light-emitting element LD', the insulating film INF' may be partially removed to expose one area of the electrode layer 14' in order for the electrode layer 14' to be electrically connected to an electrode (for example, a first or second electrode of a pixel). The insulating film INF' may include a transparent insulating material.

The light-emitting element LD' according to the above-described embodiment may be a light-emitting element having a core-shell structure (also referred to as a "core-shell light-emitting diode") manufactured through a growth method or the like. For example, the light-emitting element LD' may have a core-shell structure including the first semiconductor layer 11', the active layer 12', the second semiconductor layer 13', the electrode layer 14', and the insulating film INF' which are sequentially disposed outward from a center thereof. According to some embodiments, the light-emitting element LD' may not include at least one of the electrode layer 14' and the insulating film INF'.

In one embodiment, the light-emitting element LD' may have a polygonal cone shape extending in any one direction. As an example, at least one area of the light-emitting element LD' may have a hexagonal cone shape. However, the shape of the light-emitting element LD' may be variously changed according to embodiments.

When it is assumed that an extending direction of the light-emitting element LD' is a direction of a length L', the light-emitting element LD' may have a first end portion EP1' and a second end portion EP2' in the extending direction. One of the first and second semiconductor layers 11' and 13' (or electrode layer surrounding one of the first and second semiconductor layers 11' and 13') may be disposed at the first end portion EP1' of the light-emitting element LD', and the other one of the first and second semiconductor layers 11' and 13' (or electrode layer surrounding the other one of the first and second semiconductor layers 11' and 13') may be disposed at the second end portion EP2' of the light-emitting element LD'.

In one embodiment, the light-emitting element LD' may be a light-emitting diode having a micro-size and a core-shell structure in which the first end portion EP1' protrudes in a polygonal cone shape (for example, a hexagonal cone shape). As an example, the light-emitting element LD' may have a shape in which a hexagonal cone and a hexagonal column are combined and has a small size ranging from a nanoscale to a microscale, for example, a diameter D' (or width W) and/or a length L' which are in a range of a nanoscale or a microscale. However, the size, shape, and the like of the light-emitting element LD' may be variously changed according to design conditions of various devices, for example, a display device which uses the light-emitting element LD' as a light source.

In one embodiment, both end portions of the first semiconductor layer 11' may have shapes protruding in the direction of the length L' of the light-emitting element LD'. The protruding shapes of both end portions of the first semiconductor layer 11' may be different. As an example, among both end portions of the first semiconductor layer 11', one end portion disposed at an upper side may have a cone shape (for example, a hexagonal cone shape) which converges to one vertex while a width thereof is gradually decreased at an upper portion thereof. In some embodiments, among both end portions of the first semiconductor layer 11', the other end portion disposed at a lower side may have a polygonal column shape (for example, a hexagonal column shape) having a set or predetermined width, but the present disclosure is not limited thereto. For example, in another embodiment of the present disclosure, the first semiconductor layer 11' may have a cross section having as a polygonal shape or a step shape in which a width thereof is gradually decreased toward at a lower portion thereof. The shapes of both end portions of the first semiconductor layer 11' may be variously changed according to various embodiments.

The first semiconductor layer 11' may be positioned at a core, that is, a center (or central or inner area) of the light-emitting element LD'. In some embodiments, the light-emitting element LD' may be provided in a shape corresponding to the shape of the first semiconductor layer 11'. As an example, when the first semiconductor layer 11' has a hexagonal cone shape at one end portion at an upper side, the light-emitting element LD' may have a hexagonal cone shape at one end portion at an upper side (for example, a first end portion EP1').

The active layer 12' may be provided and/or formed to surround an outer surface (e.g., an outer peripheral surface) of the first semiconductor layer 11'. For example, the active layer 12' is provided in a form that surrounds the remaining area excluding one end portion (for example, one end at a lower side) of the first semiconductor layer 11' in the direction of the length L' of the light-emitting element LD'.

The second semiconductor layer 13' may be provided and/or formed to surround an outer surface (e.g., an outer peripheral surface) of the active layer 12' and may include a semiconductor layer that is a different type from the first semiconductor layer 11'. As an example, when the first semiconductor layer 11' includes an N-type semiconductor layer, the second semiconductor layer 13' may include a P-type semiconductor layer.

In one embodiment, the light-emitting element LD' may further include an electrode layer 14' surrounding an outer surface (e.g., an outer peripheral surface) of the second semiconductor layer 13'. The electrode layer 14' may be an ohmic contact electrode or a Schottky contact electrode electrically connected to the second semiconductor layer 13' but is not limited thereto.

As described above, the light-emitting element LD' may be formed in a core-shell structure of which both end portions have the protruding shapes and may include the first semiconductor layer 11' provided at the center thereof, the active layer 12' surrounding the first semiconductor layer 11', and the second semiconductor layer 13' surrounding the active layer 12'. In some embodiments, the light-emitting element LD' may selectively further include the electrode layer 14' surrounding the second semiconductor layer 13'. One end portion of the electrode layer 14' may be disposed at the first end portion EP1' of the light-emitting element LD', and one end portion of the first semiconductor layer 11' may be disposed at the second end portion EP2' of the light-emitting element LD'.

The light-emitting element LD or LD' may be used in various types of devices, such as a display device, which require a light source. For example, one or more light-emitting elements LD or LD' may be disposed in each pixel area of a display panel and used as a light source.

In one embodiment, each pixel may include one or more rod-shaped light-emitting elements LD, one or more light-emitting elements LD' having a core-shell structure, or a combination of the one or more rod-shaped light-emitting elements LD and the one or more light-emitting elements LD' having a core-shell structure. In another embodiment, each pixel may include one or more other light-emitting elements having a different type and/or shape from the rod-shaped light-emitting elements LD or the light-emitting elements LD' having a core-shell structure.

Figure 3:
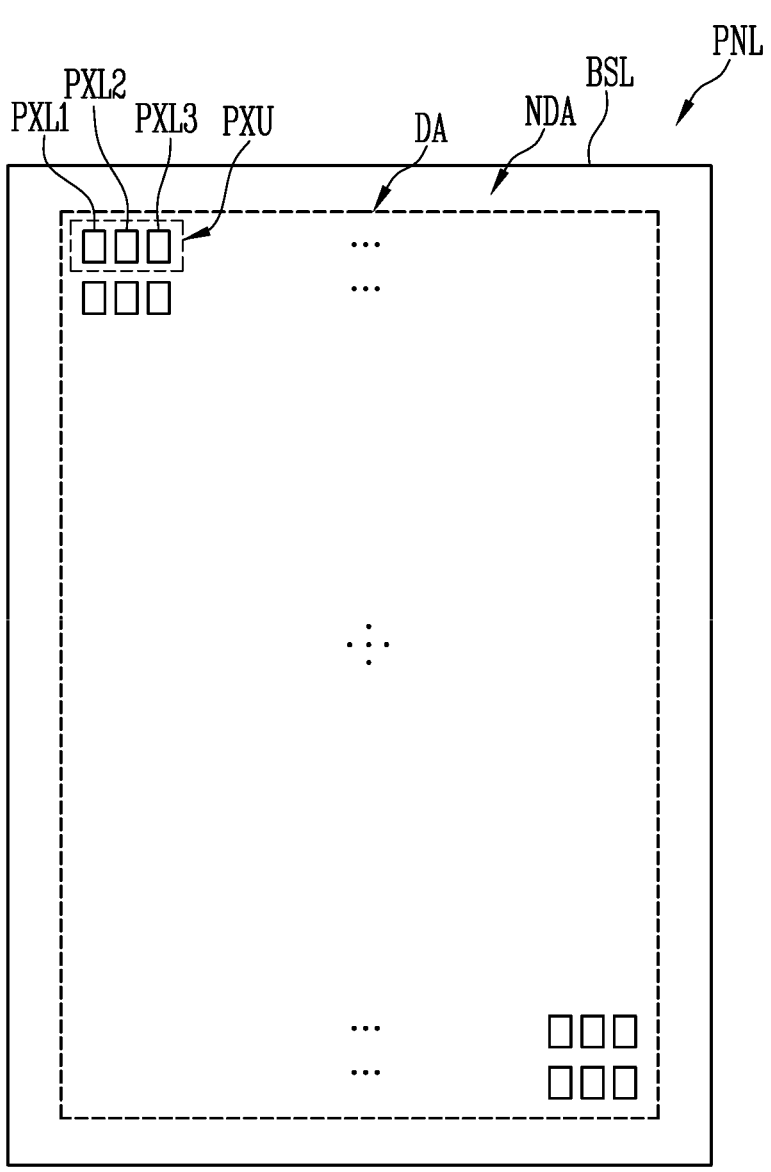
FIG. 3 is a plan view illustrating a display device according to one embodiment of the present disclosure.

FIG. 3 is a plan view illustrating a display device according to one embodiment of the present disclosure. As an example of an electronic device which may use the light-emitting elements LD or LD' described in the embodiments of FIGS. 1A-2B as a light source, a display device, e.g., a display panel PNL included in the display device is illustrated in FIG. 3. As an example, each pixel unit PXU of the display panel PNL and each pixel constituting the same may include one or more light-emitting elements LD or LD'.

For convenience, the structure of the display panel PNL is briefly illustrated in FIG. 3 based on a display area DA. However, according to some embodiments, at least one driving circuit unit (for example, a scan driver), lines, and/or pads, which are not illustrated, may be further disposed in the display panel PNL.

Referring to FIG. 3, the display panel PNL according to one embodiment of the present disclosure may include a base layer BSL and pixels PXL disposed on the base layer BSL. The pixels may include first color pixels PXL1, second color pixels PXL2, and/or third color pixels PXL3. Hereinafter, when at least one pixel of the first color pixels PXL1, the second color pixels PXL2, and the third color pixels PXL3 is arbitrarily described, the pixel refers to "pixel PXL," or when at least two pixels thereof are collectively described, the pixels refer to "pixels PXL."

For example, the display panel PNL and the base layer BSL for forming the display panel PNL may include a display area DA for displaying an image and a non-display area NDA other than the display area DA. The pixels PXL may be disposed in the display area DA on the base layer BSL.

The display area DA may be disposed in a central area of the display panel PNL, and the non-display area NDA may be disposed in an edge area of the display panel PNL so as to surround the display area DA (e.g., the non-display area NDA may be disposed along the edge or periphery of the display area DA surrounding the display area DA). However, the positions of the display area DA and the non-display area NDA are not limited thereto and may be changed. The display area DA may constitute a screen on which an image is displayed, and the non-display area NDA may be an area other than the display area DA.

The base layer BSL may constitute a base member of the display panel PNL and may be a rigid or flexible substrate or film. As an example, the base layer BSL may be a rigid substrate made of glass or tempered glass, a flexible substrate (or thin film) made of plastic or metal, or at least one layer of an insulating film. The material and/or physical properties of the base layer BSL are not particularly limited.

In one embodiment, the base layer BSL may be substantially transparent. Here, the term "substantially transparent" may mean that light can be transmitted at a suitable transmittance (e.g., a set or predetermined transmittance or more). In another embodiment, the base layer BSL may be semi-transparent or opaque. In some embodiments, the base layer BSL may include a reflective material.

One area of the base layer BSL may be defined as the display area DA, and thus, the pixels PXL are disposed therein. The remaining area of the base layer BSL may be defined as the non-display area NDA. As an example, the base layer BSL may include the display area DA including a plurality of pixel areas in which the pixels PXL are formed, and the non-display area NDA disposed outside the display area DA. Various lines, pads, and/or an embedded circuit unit connected to the pixels PXL of the display area DA may be disposed in the non-display area NDA.

The pixels PXL may be disposed in the display area DA. As an example, the pixels PXL may be regularly arranged in the display area DA according to a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display area DA in various suitable structures and/or manners.

According to some embodiments, two or more types of pixels PXL emitting light having different colors may be disposed in the display area DA. As an example, the first color pixels PXL1 emitting first color light, the second color pixels PXL2 emitting second color light, and the third color pixels PXL3 emitting third color light may be arranged in the display area DA. At least one first color pixel PXL1, at least one second color pixel PXL2, and at least one third color pixel PXL3 disposed adjacent to each other may constitute one pixel unit PXU capable of emitting light having various colors.

According to some embodiments, the first color pixel PXL1 may be a red color pixel which emits red color light, the second color pixel PXL2 may be a green color pixel which emits green color light, and the third color pixel PXL3 may be a blue color pixel which emits blue color light. In one embodiment, the first color pixel PXL1, the second color pixel PXL2, and the third color pixel PXL3 may respectively include a first color light-emitting element, a second color light-emitting element, and a third color light-emitting element as a light source to respectively emit light having a first color, light having a second color, and light having a third color. In another embodiment, the first color pixel PXL1, the second color pixel PXL2, and the third color pixel PXL3 may include light-emitting elements which emit the same color light. Further, the first color pixel PXL1, the second color pixel PXL2, and the third color pixel PXL3 may include color conversion layers and/or color filters having different colors, which are disposed on the light-emitting elements, thereby emitting light having a first color, light having a second color, and light having a third color.

However, the color, type, and/or number of the pixels PXL constituting each pixel unit PXU are not particularly limited. For example, the color of light emitted by each pixel PXL may be variously changed.

Each pixel PXL may include at least one light source driven by control signals (e.g., set or predetermined control signals) (for example, a scan signal and a data signal) and/or power sources (e.g., set or predetermined power sources) (for example, a first power source and a second power source). In some embodiments, the light source may include one or more light-emitting elements LD according to one embodiment of the embodiments of FIGS. 1A-1D, for example, one or more rod-shaped light-emitting elements LD having a small size ranging from a nanoscale to a microscale and/or one or more light-emitting elements LD' according to the embodiment of FIGS. 2A and 2B, for example, one or more micro core-shell structure light-emitting elements LD' having a small size ranging from a nanoscale to a microscale. Further, various types of the light-emitting elements LD or LD' may be used as the light source of the pixel PXL.

In some embodiments, each pixel PXL may have a structure according to at least one of embodiments to be described below. For example, each pixel PXL may have a structure of any one embodiment of embodiments illustrated in FIGS. 4A-10 and embodiments illustrated in FIGS. 12 and 13 or a structure in which at least two of the embodiments are coupled.

In one embodiment, each pixel PXL may be formed as an active pixel. However, the type, structure, and/or driving method of the pixels PXL applicable to a display device of the present disclosure are not particularly limited. For example, each pixel PXL may be formed as a pixel of a passive or active light-emitting display device having various structures and/or driving method.

Figure 4A:
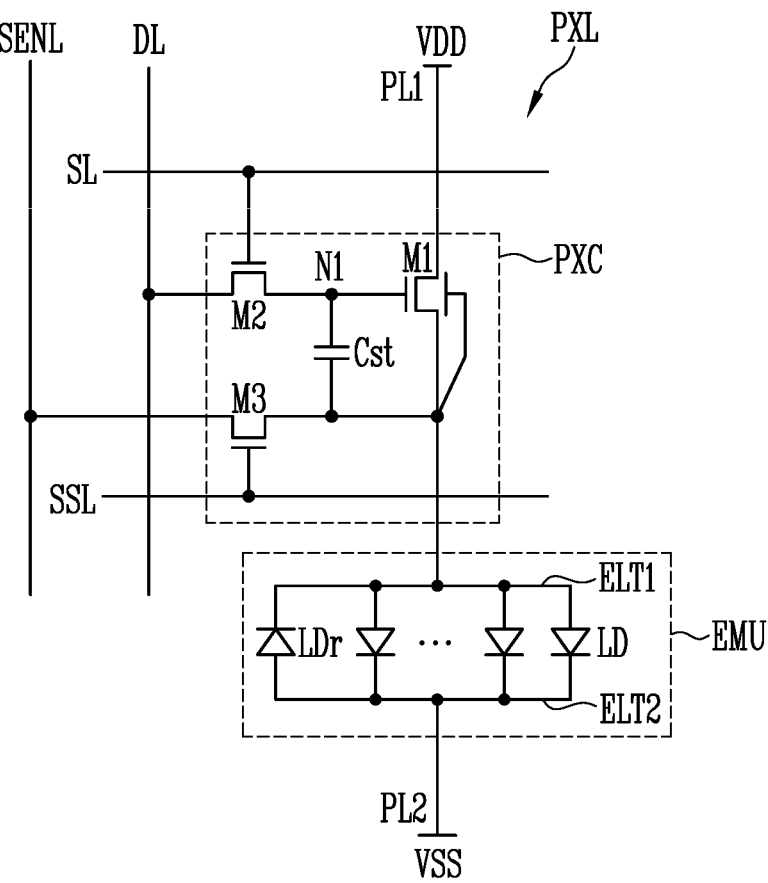
FIGS. 4A and 4B are circuit diagrams each illustrating a pixel according to one embodiment of the present disclosure.
Figure 4B:
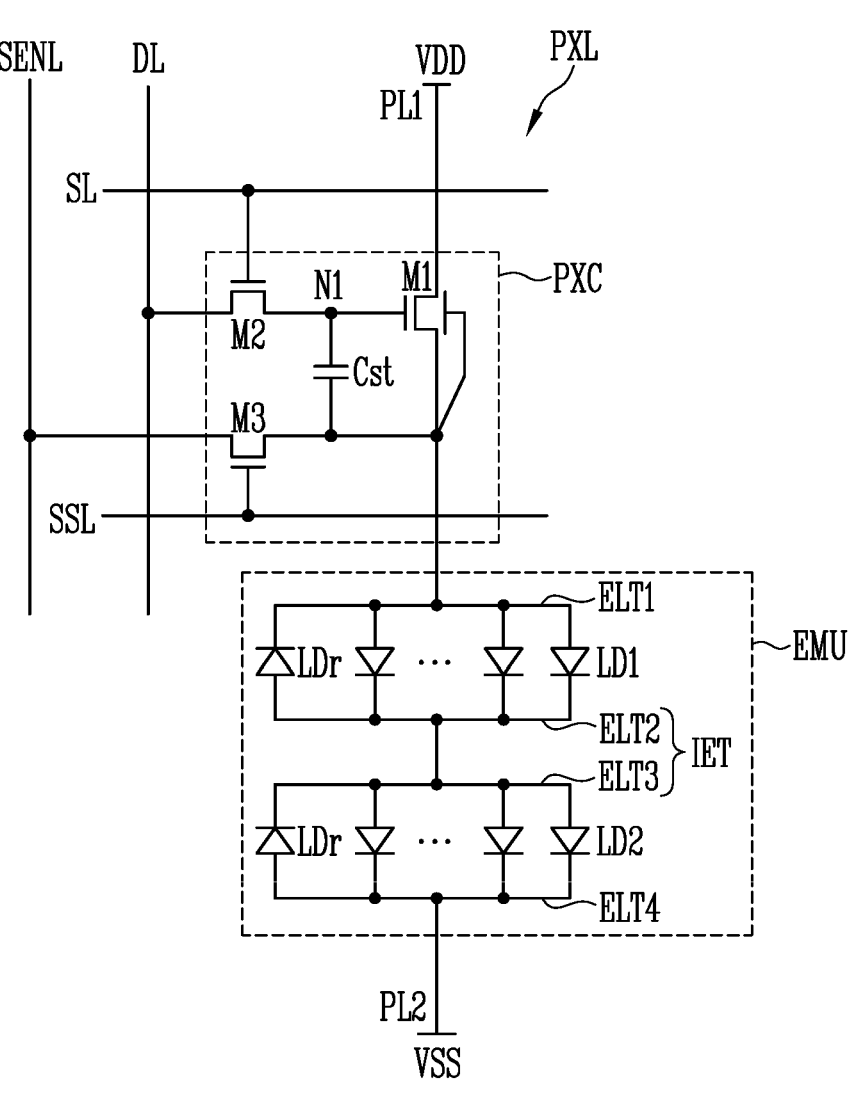

FIGS. 4A and 4B are circuit diagrams each illustrating a pixel PXL according to one embodiment of the present disclosure. For example, FIGS. 4A-4B illustrate embodiments of the pixel PXL applicable to an active type display device and illustrate different embodiments in relation to a structure of a light-emitting unit EMU. However, the types of the pixel PXL and a display device to which the embodiments of the present disclosure are applicable are not limited thereto.

According to some embodiments, the pixels PXL illustrated in FIGS. 4A and 4B may be any one of the first color pixel PXL1, the second color pixel PXL2, and the third color pixel PXL3 provided in the display panel PNL of FIG. 3. In some embodiments, the first color pixel PXL1, the second color pixel PXL2, and the third color pixel PXL3 may have substantially the same or similar structure.

Referring to FIGS. 4A and 4B, the pixel PXL may include the light-emitting unit EMU which generates light having luminance corresponding to a data signal. In some embodiments, the pixel PXL may further include a pixel circuit PXC for driving the light-emitting unit EMU.

The light-emitting unit EMU may include one or more light-emitting elements LD connected between a first power source VDD and a second power source VSS, for example, the plurality of light-emitting elements LD connected between a first power source VDD and a second power source VSS. For example, as illustrated in FIG. 4A, the light-emitting unit EMU may include a first electrode ELT1 (also referred to as "first pixel electrode" or "first alignment electrode") connected to the first power source VDD through the pixel circuit PXC and a first power line PL1, a second electrode ELT2 (also referred to as "second pixel electrode" or "second alignment electrode") connected to the second power source VSS through a second power line PL2, and the plurality of light-emitting elements LD connected in parallel in the same direction between the first electrode ELT1 and the second electrode ELT2. In one embodiment, the first electrode ELT1 may be an anode, and the second electrode ELT2 may be a cathode.

Each of the light-emitting elements LD may include a first end portion (for example, a P-type end portion) connected to the first power source VDD through the first electrode ELT1 and/or the pixel circuit PXC and a second end portion (for example, an N-type end portion) connected to the second power source VSS through the second electrode ELT2. That is, the light-emitting elements LD may be connected in parallel in a forward direction between the first electrode ELT1 and the second electrode ELT2. Each of the light-emitting elements LD connected in the forward direction between the first power source VDD and the second power source VSS constitutes each effective light source, and the effective light sources may be collected to form the light-emitting unit EMU of the pixel PXL.

The first power source VDD and the second power source VSS may have different potentials such that the light-emitting elements LD emit light. As an example, the first power source VDD may be set as a high potential power source, and the second power source VSS may be set as a low potential power source. In this case, a potential difference between the first power source VDD and the second power source VSS may be set to be greater than or equal to a threshold voltage of the light-emitting elements LD during an emission period of the pixel PXL.

One end portions (for example, the P-type end portions) of the light-emitting elements LD constituting each light-emitting unit EMU may be connected in common to the pixel circuit PXC through one electrode of the light-emitting unit EMU (for example, the first electrode ELT1 of each pixel PXL) and may be connected to the first power source VDD through the pixel circuit PXC and the first power line PL1. The other end portions (for example, the N-type end portions) of the light-emitting elements LD may be connected in common to the second power source VSS through the other electrode of the light-emitting unit EMU (for example, the second electrode ELT2 of each pixel PXL) and the second power line PL2.

The light-emitting elements LD may emit light at a luminance corresponding to a driving current supplied through the corresponding pixel circuit PXC. For example, during each frame period, the pixel circuit PXC may supply a driving current corresponding to a gradation value expressed in a corresponding frame to the light-emitting unit EMU. The driving current supplied to the light-emitting unit EMU may be divided to flow in the light-emitting elements LD connected in the forward direction. Accordingly, while each light-emitting element LD emits light at luminance corresponding to a current flowing therein, the light-emitting unit EMU may emit light at luminance corresponding to the driving current.

In one embodiment, the light-emitting unit EMU may further include at least one ineffective light source in addition to the light-emitting elements LD constituting each effective light source. As an example, at least one reverse light-emitting element LDr may be further connected between the first electrode ELT1 and the second electrode ELT2. Even when a driving voltage (e.g., a set or predetermined driving voltage) (for example, a forward driving voltage) is applied between the first electrode ELT1 and the second electrode ELT2, the reverse light-emitting element LDr may maintain an inactive state and thus may maintain substantially a non-emission state. In some embodiments, at least one pixel PXL may further include at least one ineffective light source that is not fully connected between the first electrode ELT1 and the second electrode ELT2.

FIG. 4A illustrates the embodiment in which the pixel PXL includes the light-emitting unit EMU having a parallel structure, but the present disclosure is not limited thereto. For example, the pixel PXL may include the light-emitting unit EMU having a series structure or a series-parallel structure. In this case, the light-emitting unit EMU may include the plurality of light-emitting elements LD connected in a series structure or a series-parallel structure between at least two pairs of electrodes. As an example, as shown in the embodiment of FIG. 4B, the light-emitting unit EMU may include the plurality of light-emitting elements LD divided and connected at two series stages.

Referring to FIG. 4B, the light-emitting unit EMU may include a first series stage which includes a first electrode ELT1, a second electrode ELT2, and one or more light-emitting elements LD1 (also referred to as "first light-emitting elements") connected in a forward direction between the first electrode ELT1 and the second electrode ELT2 and a second series stage which includes a third electrode ELT3, a fourth electrode ELT4, and one or more light-emitting elements LD2 (referred to as "second light-emitting element") connected in a forward direction between the third electrode ELT3 and the fourth electrode ELT4. The number of series stages constituting each light-emitting unit EMU may be variously changed according to various embodiments. For example, the light-emitting unit EMU may include the plurality of light-emitting elements LD divided and connected at three or more series stages. The numbers of the light-emitting elements LD constituting the series stages may be the same or different, and the number of the light-emitting elements LD is not particularly limited.

A first electrode of the light-emitting unit EMU, for example, the first electrode ELT1 may be a first pixel electrode of the light-emitting unit EMU (for example, an anode). A last electrode of the light-emitting unit EMU, for example, the fourth electrode ELT4 may be a second pixel electrode of the light-emitting unit EMU (for example, a cathode). The remaining electrodes of the light-emitting unit EMU may constitute each intermediate electrode. For example, the second and third electrodes ELT2 and ELT3 may be integrally or non-integrally connected to each other to form one intermediate electrode IET.

In the same manner, when the light-emitting unit EMU includes three or more series stages, the first electrode and the last electrode of the light-emitting unit EMU may constitute the first pixel electrode and the second pixel electrode, respectively. Two electrodes constituting an equipotential node, which are integrally or non-integrally connected between two consecutive series stages, may constitute one intermediate electrode. In this case, the two electrodes may be regarded as the same electrode. However, hereinafter, the two electrodes will be separately named. In the following embodiment, when at least one electrode of the first to fourth electrodes ELT1 to ELT4 is arbitrarily described, the electrode refers to "pixel electrode," or when the first to fourth electrodes ELT1 to ELT4 are collectively described, the first to fourth electrodes ELT1 to ELT4 refer to "pixel electrodes."

Assuming that the light-emitting unit EMU is formed using the light-emitting elements LD under the same conditions (for example, the same size and/or number), when the light-emitting elements LD are connected in a series structure or a series-parallel combination structure, power efficiency may be improved. For example, in the light-emitting unit EMU in which the light-emitting elements LD are connected in series or in series-parallel, higher luminance may be expressed with the same current as compared with a light-emitting unit in which the light-emitting elements LD are connected only in parallel. In some embodiments, in the light-emitting unit EMU in which the light-emitting elements LD are connected in series or in series-parallel, the same luminance may be expressed with a lower driving current as compared with a light-emitting unit in which the light-emitting elements LD are connected in parallel.

Furthermore, in the pixel PXL in which the light-emitting elements LD are connected in series structure or a series-parallel combination structure, even when short circuit defects occur in some series stages, a certain degree of luminance may be expressed through the light-emitting elements LD of the remaining series stage, thereby reducing the possibility of dark spot defects of the pixel PXL.

FIGS. 4A and 4B illustrate the embodiments in which the light-emitting elements LD are connected in a parallel structure or a series-parallel combination structure, but present disclosure is not limited thereto. For example, in another embodiment, the light-emitting elements LD constituting the light-emitting unit EMU of each pixel PXL may be connected only in series.

The pixel circuit PXC may be connected between the first power source VDD and the first electrode ELT1. The pixel circuit PXC may be connected to a scan line SL and a data line DL of the corresponding pixel PXL. In some embodiments, the pixel circuit PXC may be further selectively connected to a sensing signal line SSL and a sensing line SENL.

The pixel circuit PXC may include a first transistor M1, a second transistor M2, a third transistor M3, and a storage capacitor Cst.

The first transistor M1 (e.g., a driving transistor) is connected between the first power source VDD and the first electrode ELT1 of the light-emitting unit EMU. A gate electrode of the first transistor M1 is connected to a first node N1. The first transistor M1 controls a driving current supplied to the light-emitting unit EMU in response to a voltage of the first node N1. That is, the first transistor M1 may be a driving transistor which controls a driving current of the pixel PXL.

In some embodiments, the first transistor M1 may selectively further include a back gate electrode connected to the first electrode ELT1. The back gate electrode may be disposed to overlap the gate electrode with an insulating layer interposed therebetween.

The second transistor M2 (e.g., a switching transistor) is connected between the data line DL and the first node N1. A gate electrode of the second transistor M2 is connected to the scan line SL. When a scan signal having a gate-on voltage (for example, a high level voltage) is supplied from the scan line SL, the second transistor M2 is turned on to electrically connect the data line DL and the first node N1.

During each frame period, a data signal of a corresponding frame is supplied to the data line DL, and the data signal is transmitted to the first node N1 through the second transistor M2 turned on during a period in which the scan signal having a gate-on voltage is supplied. That is, the second transistor M2 may be a switching transistor for transmitting each data signal into the pixel PXL.

One electrode of the storage capacitor Cst is connected to the first node N1, and the other electrode thereof is connected to the first electrode ELT1 of the light-emitting unit EMU (or a second electrode of the first transistor M1). The storage capacitor Cst is charged with a voltage (or hold a charge) corresponding to a data signal supplied to the first node N1 during each frame period.

The third transistor M3 is connected between the first electrode ELT1 of the light-emitting unit EMU and the sensing line SENL. A gate electrode of the third transistor M3 is connected to the sensing signal line SSL. The third transistor M3 may transmit a voltage value applied to the first electrode ELT1 of the light-emitting unit EMU (or a voltage value applied to the anode of the light-emitting element LD) to the sensing line SENL according to a sensing signal supplied to the sensing signal line SSL during a sensing period (e.g., a set or a predetermined sensing period). The voltage value transmitted through the sensing line SENL may be provided to an external circuit (for example, a timing controller), and the external circuit may extract characteristic information of each pixel PXL (for example, a threshold voltage and the like of the first transistor M1) based on the supplied voltage value. The extracted characteristic information may be used to convert image data so that a characteristic deviation between the pixels PXL is compensated for.

In FIGS. 4A and 4B, the transistors included in the pixel circuit PXC, for example, all of the first, second, and third transistors M1, M2, and M3 are illustrated as being N-type transistors, but the present disclosure is not necessarily limited thereto. That is, at least one of the first to third transistors M1 to M3 may be changed to a P-type transistor. In another embodiment, the pixel circuit PXC may include both P-type and N-type transistors. For example, some of the transistors included in the pixel circuit PXC may be P-type transistors, and the others thereof may be N-type transistors. In this case, a voltage level of control signals (for example, a scan signal, a data signal, and/or a sensing signal) for driving each transistor may be adjusted according to the type of transistors.

In some embodiments, the structure and driving method of the pixel PXL may be variously changed according to embodiments. For example, the pixel circuit PXC may be provided as a pixel circuit having various structures and/or driving methods in addition to the embodiments illustrated in FIGS. 4A and 4B.

As an example, the pixel circuit PXC may not include the third transistor M3. In some embodiments, the pixel circuit PXC may further include other circuit elements such as a transistor for compensating for a threshold voltage of the first transistor M1, a transistor for initializing a voltage of the first node N1 or the first electrode ELT1 of the light-emitting unit EMU, a transistor for controlling a period in which a driving current is supplied to the light-emitting unit EMU, and/or a boosting capacitor for boosting the voltage of the first node N1.

In another embodiment, when each pixel PXL is provided in a passive light-emitting display device or the like, the pixel circuit PXC may be omitted. Each of the first and last electrodes of the light-emitting unit EMU (for example, the first and second electrodes ELT1 and ELT2 or the first and fourth electrodes ELT1 and ELT4) may be connected directly to the scan line SL, the data line DL, the first power line PL1, the second power line PL2, or other signal lines or power lines.

Figure 5:
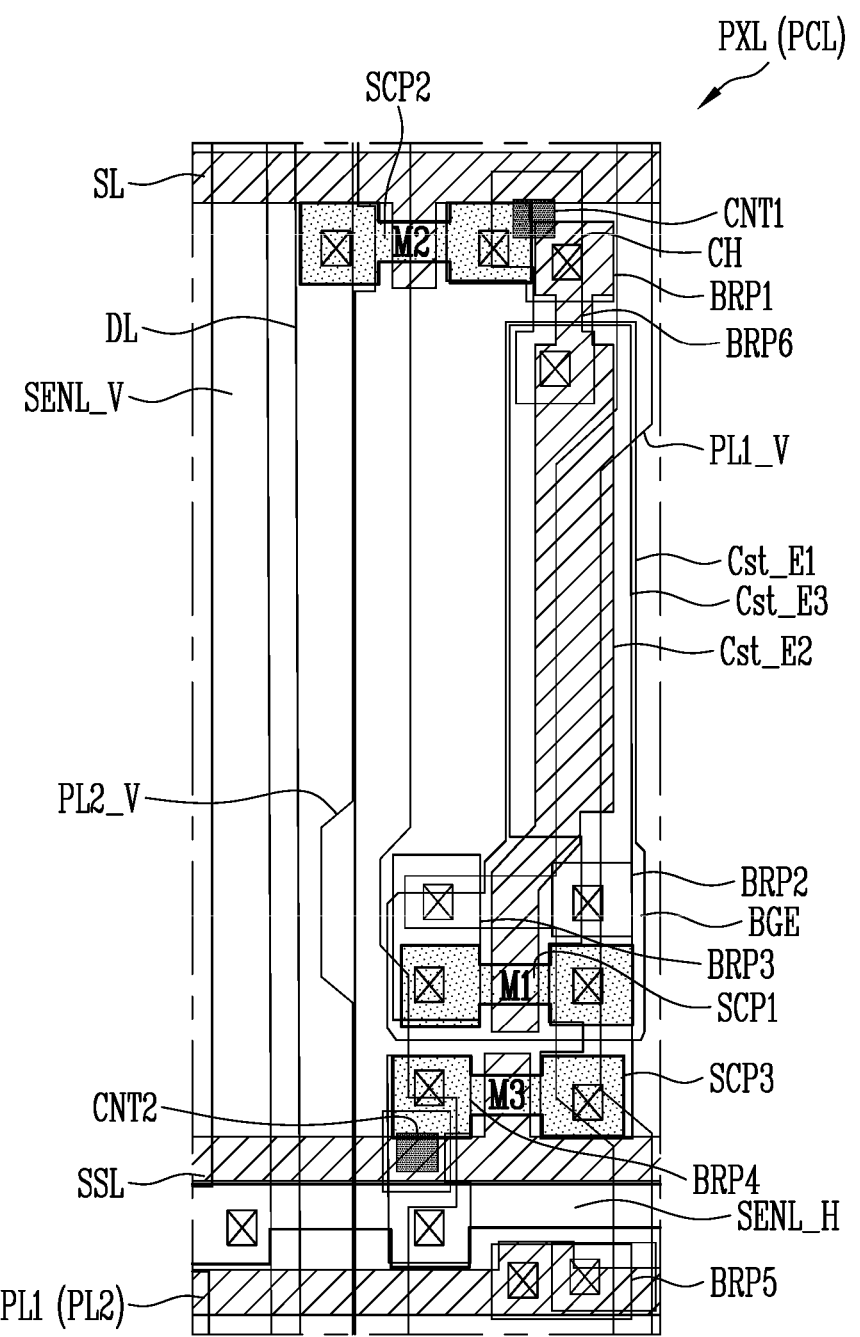
FIG. 5 is a plan view illustrating a pixel according to one embodiment of the present disclosure, for example, an embodiment of a layout of a circuit layer in the pixel.

FIG. 5 is a plan view illustrating a pixel PXL according to one embodiment of the present disclosure, for example, an embodiment of a layout of a circuit layer PCL in the pixel PXL. The circuit layer PCL may include circuit elements constituting each pixel circuit PXC and lines connected to the circuit elements.

For example, FIG. 5 illustrates an embodiment of a layout of the circuit layer PCL in which first, second, and third transistors M1, M2, and M3, a storage capacitor Cst, a scan line SL, a data line DL, a sensing signal line SSL, a sensing line SENL, a first power line PL1, and a second power line PL2 of the pixel PXL are disposed based on a pixel area in which the pixel PXL is formed.

Referring to FIGS. 3-5, the pixel PXL may include a first conductive layer BML, a semiconductor layer SCL, a second conductive layer GAT, a third conductive layer SD1, and a fourth conductive layer SD2 sequentially disposed on one surface of a base layer BSL. At least one insulating layer may be interposed between the first conductive layer BML, the semiconductor layer SCL, the second conductive layer GAT, the third conductive layer SD1, and the fourth conductive layer SD2.

The first conductive layer BML is disposed on one surface of the base layer BSL. The first conductive layer BML may include a back gate electrode BGE, a first capacitor electrode Cst_E1, and a horizontal sensing line SENL_H disposed in each pixel area.

The back gate electrode BGE is disposed to cover a lower portion of the first transistor M1 at least. To this end, the back gate electrode BGE may be disposed in an area in which the first transistor M1 is to be formed.

The first capacitor electrode Cst_E1 may extend in a second direction DR2 from the back gate electrode BGE and may be designed to have a size in consideration of an area of a pixel area allocated to each pixel PXL to be disposed in one area of the pixel area. For example, the first capacitor electrode Cst_E1 may be formed to have an area (e.g., a set or predetermined area) in a right area of each pixel area in a plan view.

The horizontal sensing line SENL_H is spaced from the back gate electrode BGE and extends in a first direction DR1. For example, the horizontal sensing line SENL_H may be disposed at a lower side of each pixel area in a plan view and may extend in the first direction DR1 in a display area DA so as to be connected in common to a plurality of pixels PXL disposed in the same pixel row.

The first conductive layer BML may include at least one conductive material. For example, conductive patterns and/or lines disposed on the first conductive layer BML (for example, the back gate electrode BGE, the first capacitor electrode Cst_E1, and the horizontal sensing line SENL_H) may include at least one metal selected from various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an ally including the at least one metal, or may include at least one conductive material selected from a conductive oxide such as indium tin oxide (ITO), indium zinc oxide (IZO), indium tin zinc oxide (ITZO), zinc oxide (ZnO), aluminum-doped zinc oxide (AZO), gallium-doped zinc oxide (GZO), zinc tin oxide (ZTO), gallium tin oxide (ZTO), or fluorine-doped tin oxide (FTO), and a conductive polymer such as poly(3,4-ethyl-enedioxythiophene) (PEDOT), but the present disclosure is not limited thereto. For example, the back gate electrode BGE, the first capacitor electrode Cst_E1, and the horizontal sensing line SENL_H may include other conductive materials such as carbon nanotubes or graphene. That is, each conductive pattern and/or line disposed on the first conductive layer BML may include at least one selected from various conductive materials to have conductivity, and the structural material thereof is not particularly limited.

The first conductive layer BML may be formed as a single-layer or multi-layer. Each of the back gate electrode BGE, the first capacitor electrode Cst_E1, and the horizontal sensing line SENL_H may be formed as a single-layered or multi-layered conductive pattern.

The semiconductor layer SCL may be disposed on the first conductive layer BML with at least one insulating layer interposed therebetween. The semiconductor layer SCL may include a first semiconductor pattern SCP1, a second semiconductor pattern SCP2, and a third semiconductor pattern SCP3.

The first semiconductor pattern SCP1, the second semiconductor pattern SCP2, and the third semiconductor pattern SCP3 may be respectively active patterns for forming channels of the first transistor M1, the second transistor M2, and the third transistor M3 and may be respectively disposed in areas in which the first transistor M1, the second transistor M2, and the third transistor M3 are to be formed. Each of the first to third semiconductor patterns SCP1, SCP2, and SCP3 may include a channel region overlapping a gate electrode of each transistor and a source region and a drain region positioned at both sides of the channel region.

The semiconductor layer SCL may include polysilicon, amorphous silicon, and/or an oxide semiconductor. In one embodiment, the first to third semiconductor patterns SCP1, SCP2, and SCP3 may include substantially the same or similar semiconductor material. For example, the first to third semiconductor patterns SCP1, SCP2, and SCP3 may include the same semiconductor material selected from polysilicon, amorphous silicon, and an oxide semiconductor. In another embodiment, some and the others of the first to third semiconductor patterns SCP1, SCP2, and SCP3 may include different semiconductor materials. For example, some of the first to third semiconductor patterns SCP1, SCP2, and SCP3 (for example, the first semiconductor pattern SCP1) may include an oxide semiconductor, and the others (for example, the second and third semiconductor patterns SCP2 and SCP3) may include polysilicon or amorphous silicon.

The second conductive layer GAT may be disposed on the semiconductor layer SCL with at least one insulating layer interposed therebetween. The second conductive layer GAT includes a second capacitor electrode Cst_E2, a scan line SL, a sensing signal line SSL, and a first power line PL1 (and/or a second power line PL2).

The second capacitor electrode Cst_E2 may overlap the first capacitor electrode Cst_E1 and may form one electrode of the storage capacitor Cst. For example, the second capacitor electrode Cst_E2 may be formed to extend in the second direction DR2 from a right area of each pixel area in a plan view. In some embodiments, the second capacitor electrode Cst_E2 may extend to an area overlapping the first semiconductor pattern SCP1 to form a gate electrode of the first transistor M1.

The scan line SL may extend in the first direction DR1 and may extend to another adjacent pixel area. For example, the scan line SL may be disposed at an upper side of each pixel area in a plan view and may extend in the first direction DR1 in the display area DA so as to be connected in common to the plurality of pixels PXL disposed in the same pixel row. Furthermore, the scan line SL may extend to an area overlapping the second semiconductor pattern SCP2 to form a gate electrode of the second transistor M2.

The sensing signal line SSL may extend in the first direction DR1 and may extend to another adjacent pixel area. For example, the sensing signal line SSL may be disposed at a lower side of each pixel area in a plan view and may extend in the first direction DR1 in the display area DA so as to be connected in common to the plurality of pixels PXL disposed in the same pixel row. Furthermore, the sensing signal line SSL may extend to an area overlapping the third semiconductor pattern SCP3 to form a gate electrode of the third transistor M3.

The first power line PL1 (and/or second power line PL2) may extend from the display area DA in the first direction DR1 to extend to another adjacent pixel area. For example, the first power line PL1 (and/or the second power line PL2) may be disposed at a lower side of each pixel area in a plan view and may be disposed at a lower side of an edge of each pixel area so as to be spaced from the sensing signal line SSL. In one embodiment, the first power line PL1 (or first horizontal power line) and the second power line PL2 (or second horizontal power line) may be alternately disposed for each horizontal line of the display area DA arranged along the second direction DR2.

The second conductive layer GAT may including at least one selected from various conductive materials to have conductivity, and the structural material thereof is not particularly limited. For example, each conductive pattern and/or line disposed on the second conductive layer GAT may include at least one selected from the conductive materials described above as the materials capable of constituting the first conductive layer BML. In some embodiments, the second conductive layer GAT may include a conductive material identical to or different from that of the first conductive layer BML.

The second conductive layer GAT may be formed as a single-layer or a multi-layer. For example, each of the second capacitor electrode Cst_E2, the scan line SL, the sensing signal line SSL, and the first power line PL1 (and/or the second power line PL2) may be formed as a single-layered or multi-layered conductive pattern.

The third conductive layer SD1 may be disposed on the second conductive layer GAT with at least one insulating layer interposed therebetween. The third conductive layer SD1 may include a third capacitor electrode Cst_E3, the data line DL, a vertical sensing line SENL_V, and first to fifth bridge patterns BRP1, BRP2, BRP3, BRP4, and BRP5.

The third capacitor electrode Cst_E3 may overlap the first and second capacitor electrodes Cst_E1 and Cst_E2. For example, the third capacitor electrode Cst_E3 may be formed to extend in the second direction DR2 from a right area of each pixel area on a plane and may form one electrode of the storage capacitor Cst together with the first capacitor electrode Cst_E1. That is, the storage capacitor Cst may include a first capacitor formed by the first capacitor electrode Cst_E1 and the second capacitor electrode Cst_E2 and a second capacitor formed by the second capacitor electrode Cst_E2 and the third capacitor electrode Cst_E3. The first capacitor and the second capacitor may be connected in parallel. Due to an overlapping structure of the first capacitor electrode Cst_E1, the second capacitor electrode Cst_E2, and the third capacitor electrode Cst_E3, the capacity of the storage capacitor Cst can be sufficiently secured within a pixel area having a limited area.

The data line DL may extend in the second direction DR2 and may extend to another adjacent pixel area. For example, the data line DL may be disposed at a left side of each pixel area in a plan view. The data line DL may overlap one area of the second semiconductor pattern SCP2 and may be connected to one area of the second semiconductor pattern SCP2 through a contact hole CH. A portion of the data line DL may form a first transistor electrode of the second transistor M2. Here, each transistor may include a first transistor electrode and a second transistor electrode, and one of the first and second transistor electrodes may be a source electrode and the other thereof may be a drain electrode.

The vertical sensing line SENL_V may extend in the second direction DR2 and may extend to another adjacent pixel area. For example, the vertical sensing line SENL_V may be disposed at a left side of each pixel area in a plan view. The vertical sensing line SENL_V may overlap the horizontal sensing line SENL_H and may be connected to the horizontal sensing line SENL_H through the contact hole CH.

The first bridge pattern BRP1 may be disposed at an upper side of each pixel area so as to overlap one area of the second semiconductor pattern SCP2. The first bridge pattern BRP1 may be connected to an area of the second semiconductor pattern SCP2 through the contact hole CH to form a second transistor electrode of the second transistor M2. In addition, the first bridge pattern BRP1 may overlap the second capacitor electrode Cst_E2 and may be connected to the second capacitor electrode Cst_E2 through the contact hole CH. Accordingly, the second transistor electrode of the second transistor M2 may be connected to the second capacitor electrode Cst_E2.

The second bridge pattern BRP2 may extend downward from the third capacitor electrode Cst_E3 and may overlap one area of the first semiconductor pattern SCP1 and one area of the third semiconductor pattern SCP3. The second bridge pattern BRP2 may be connected to one area of the first semiconductor pattern SCP1 through the contact hole CH and may form the first transistor electrode of the first transistor M1. Furthermore, the second bridge pattern BRP2 may be connected to one area of the third semiconductor pattern SCP3 through the contact hole CH and may form the first transistor electrode of the third transistor M3.

In some embodiments, the second bridge pattern BRP2 may be connected to the first capacitor electrode Cst_E1 through the contact hole CH. The second bridge pattern BRP2 may be integrally formed with the third capacitor electrode Cst_E3 to form one electrode of the storage capacitor.

The third bridge pattern BRP3 may overlap one area of the first semiconductor pattern SCP1 and may be connected to one area of the first semiconductor pattern SCP1 through the contact hole CH. The third bridge pattern BRP3 may constitute a second transistor electrode of the first transistor M1.

The fourth bridge pattern BRP4 may overlap one area of the third semiconductor pattern SCP3 and may be connected to one area of the third semiconductor pattern SCP3 through the contact hole CH. The fourth bridge pattern BRP4 may constitute the second transistor electrode of the third transistor M3. In some embodiments, the fourth bridge pattern BRP4 may overlap the horizontal sensing line SENL_H and may be connected to the horizontal sensing line SENL_H through the contact hole CH. Accordingly, the third transistor M3 may be connected to the vertical sensing line SENL_V through the horizontal sensing line SENL_H.

The fifth bridge pattern BRP5 may overlap the first power line PL1 (and/or the second power line PL2) and may be connected to the first power line PL1 (and/or the second power line PL2) through the contact hole CH.

The third conductive layer SD1 may include at least one selected from various conductive materials to have conductivity, and a structural material thereof is not particularly limited. For example, each conductive pattern and/or line disposed on the third conductive layer SD1 may include at least one selected from the conductive materials described above as the materials capable of constituting the first conductive layer BML. In addition, the third conductive layer SD1 may include a conductive material identical to or different from that of the first conductive layer BML and/or the second conductive layer GAT.

The third conductive layer SD1 may be formed as a single-layer or a multi-layer. For example, each of the third capacitor electrode Cst_E3, the data line DL, the vertical sensing line SENL_V, and the first to fifth bridge patterns BRP1, BRP2, BRP3, BRP4, and BRP5 may be formed as a single-layered or multi-layered conductive pattern.

The fourth conductive layer SD2 may be disposed on the third conductive layer SD1 with at least one insulating layer interposed therebetween. The fourth conductive layer SD2 may include a first vertical power line PL1_V, a second vertical power line PL2_V, and a sixth bridge pattern BRP6.

The first vertical power line PL1_V may extend in the second direction DR2 and may extend to another adjacent pixel area. For example, the first vertical power line PL1_V may be disposed at a right side of each pixel area and may extend in the second direction DR2 in the display area DR to be connected in common to the plurality of pixels PXL disposed in the same pixel column. The first vertical power line PL1_V may include a protrusion overlapping the third bridge pattern BRP3 and may be connected to the third bridge pattern BRP3 through the contact hole CH. Accordingly, the first vertical power line PL1_V may be connected to the first transistor M1 through the third bridge pattern BRP3.

In addition, the first vertical power line PL1_V may overlap the fifth bridge pattern BRP5 and may be connected to the fifth bridge pattern BRP5 through the contact hole CH. Accordingly, the first vertical power line PL1_V is connected to the first power line PL1 through the fifth bridge pattern BRP5. As a result, the first vertical power line PL1_V and the first power line PL1 may have a mesh structure in the display area DA.

The second vertical power line PL2_V may extend in the second direction DR2 and may extend to another adjacent pixel area. For example, the second vertical power line PL2_V may be disposed at a left side of each pixel area and may extend in the second direction DR2 in the display area DA to be connected in common to the plurality of pixels PXL disposed in the same pixel column. The second vertical power line PL2_V may be connected to the second electrode ELT2 of the light-emitting unit EMU through a second contact portion CNT2.

The sixth bridge pattern BRP6 may be disposed in a right area (for example, an upper right area) of each pixel area and may overlap the third capacitor electrode Cst_E3. The sixth bridge pattern BRP6 may be connected to the third capacitor electrode Cst_E3 through the contact hole CH. In some embodiments, the sixth bridge pattern BRP6 may be connected to the first electrode ELT1 of the light-emitting unit EMU through a first contact portion CNT1. Accordingly, the first electrode ELT1 may be connected to the first transistor electrode of the first transistor M1 through the sixth bridge pattern BRP6 and the third capacitor electrode Cst_E3 (and the second bridge pattern BRP2).

The fourth conductive layer SD2 may include at least one selected from various conductive materials to have conductivity, and a structural material thereof is not particularly limited. For example, each conductive pattern and/or line disposed on the fourth conductive layer SD2 may include at least one selected from the conductive materials described above as the materials capable of constituting the first conductive layer BML. In addition, the fourth conductive layer SD2 may include a conductive material identical to or different from that of the first conductive layer BML, the second conductive layer GAT, and the third conductive layer SD1.

The fourth conductive layer SD2 may be formed as a single-layer or a multi-layer. For example, each of the first vertical power line PL1_V, the second vertical power line PL2_V, and the sixth bridge pattern BRP6 may be formed as a single-layered or multi-layered conductive pattern.

In the present disclosure, the layout structure of the circuit layer PCL is not limited to the embodiment illustrated in FIG. 5. That is, the configuration and arrangement structure of the pixel circuit PXC of the pixels PXL disposed in the display area DA and the lines connected thereto may be variously changed according to embodiments.

Figure 6A:
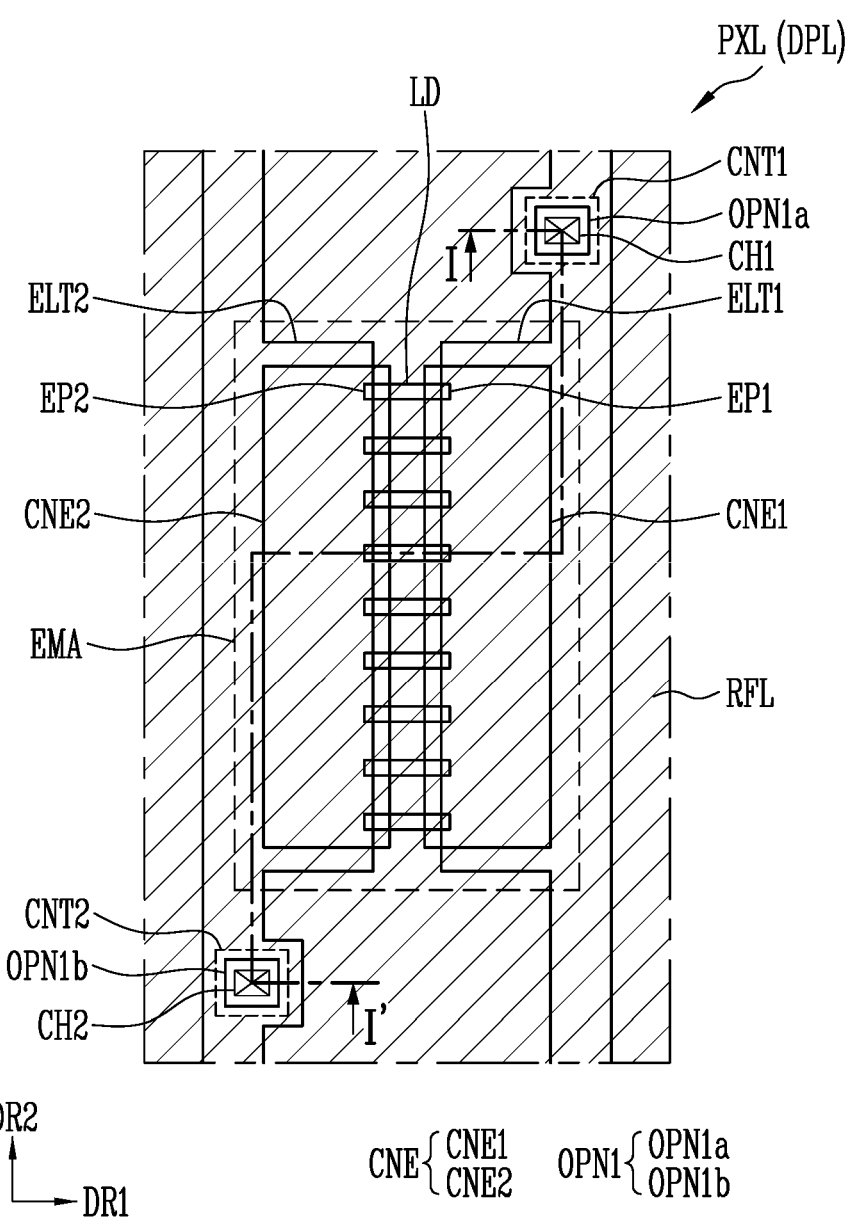
FIGS. 6A and 6B are plan views each illustrating a pixel according to one embodiment of the present disclosure, for example, embodiments of a layout of a display layer including a light-emitting unit of the pixel, and a reflective film disposed under the display layer.
Figure 6B:
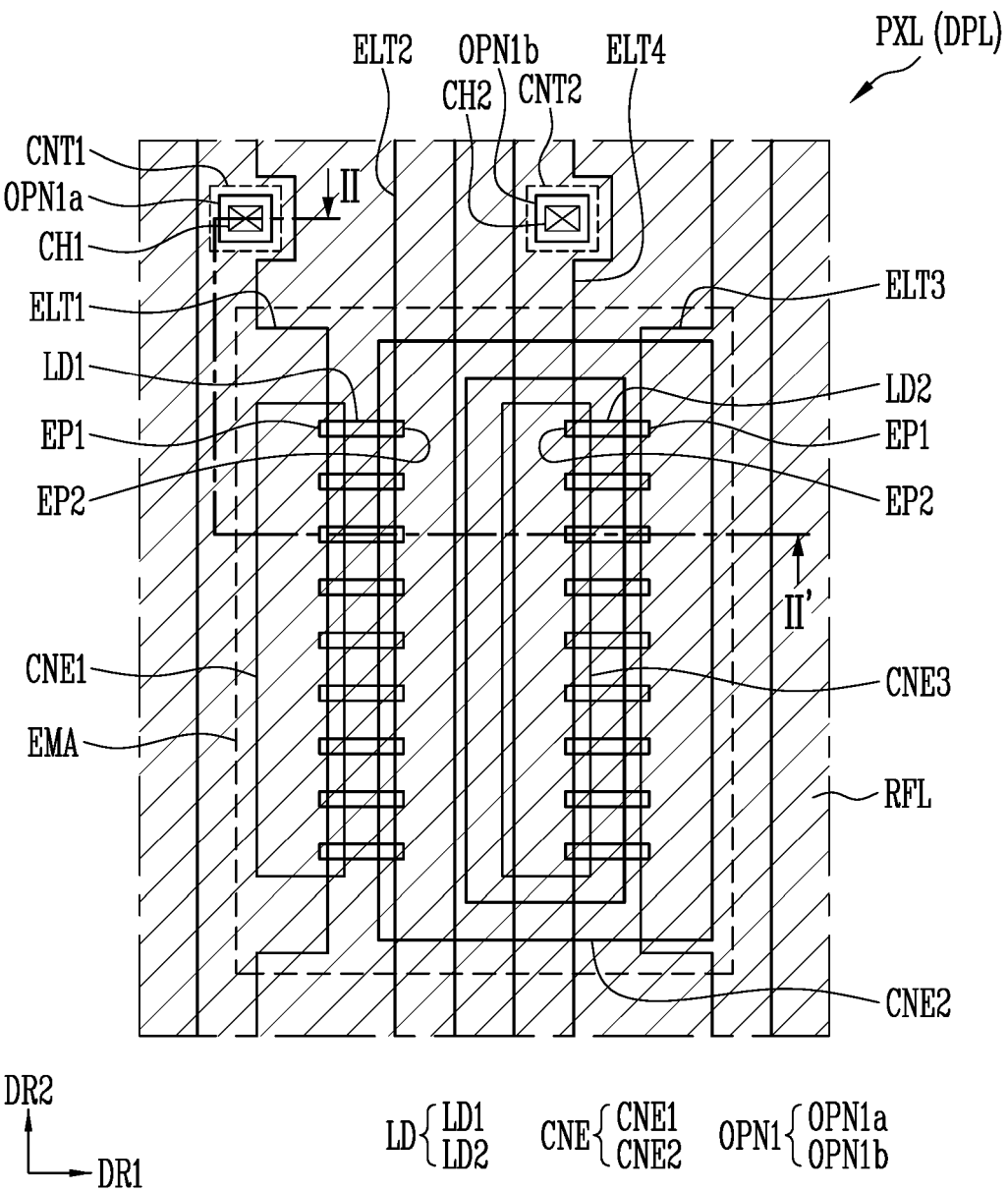

FIGS. 6A and 6B are plan views each illustrating a pixel PXL according to one embodiment of the present disclosure, e.g., embodiments of a layout of a display layer DPL including a light-emitting unit EMU of a pixel PXL. For example, FIG. 6A illustrates an embodiment of a layout of the display layer DPL of the pixel PXL including the light-emitting unit EMU according to the embodiment of FIG. 4A, and FIG. 6B illustrates an embodiment of a layout of the display layer DPL of the pixel PXL including the light-emitting unit EMU according to the embodiment of FIG. 4B.

The display layer DPL may include pixel electrodes and light-emitting elements LD constituting each light-emitting unit EMU. The pixel electrodes may include at least one pair of electrodes constituting each series stage of the light-emitting unit EMU (for example, a first electrode ELT1 and a second electrode ELT2, and/or a third electrode ELT3 and a fourth electrode ELT4) and may additionally further include one or more contact electrodes (for example, a first contact electrode CNE1, a second contact electrode CNE2, and/or a third contact electrode CNE3).

For example, FIG. 6A illustrates the embodiment of the layout of the display layer DPL of FIG. 4A including the first and second electrodes ELT1 and ELT2, the light-emitting elements LD, and the first contact electrode CNE1 and the second contact electrode CNE2 for stably connecting the light-emitting elements LD between the first electrode ELT1 and the second electrode ELT2. FIG. 6B illustrates the embodiment of the layout of the display layer DPL of FIG. 4B including the first to fourth electrodes ELT1 to ELT4, the light-emitting elements LD (e.g., LD1, LD2), and the first to third contact electrodes CNE1 to CNE3 for stably connecting the light-emitting elements LD (e.g., LD1, LD2) between the first to fourth electrodes ELT1 to ELT4. Further, FIGS. 6A and 6B illustrate a reflective film RFL disposed under the display layer DPL in an embodiment of the present disclosure in addition to the display layer DPL.

Figure 7:
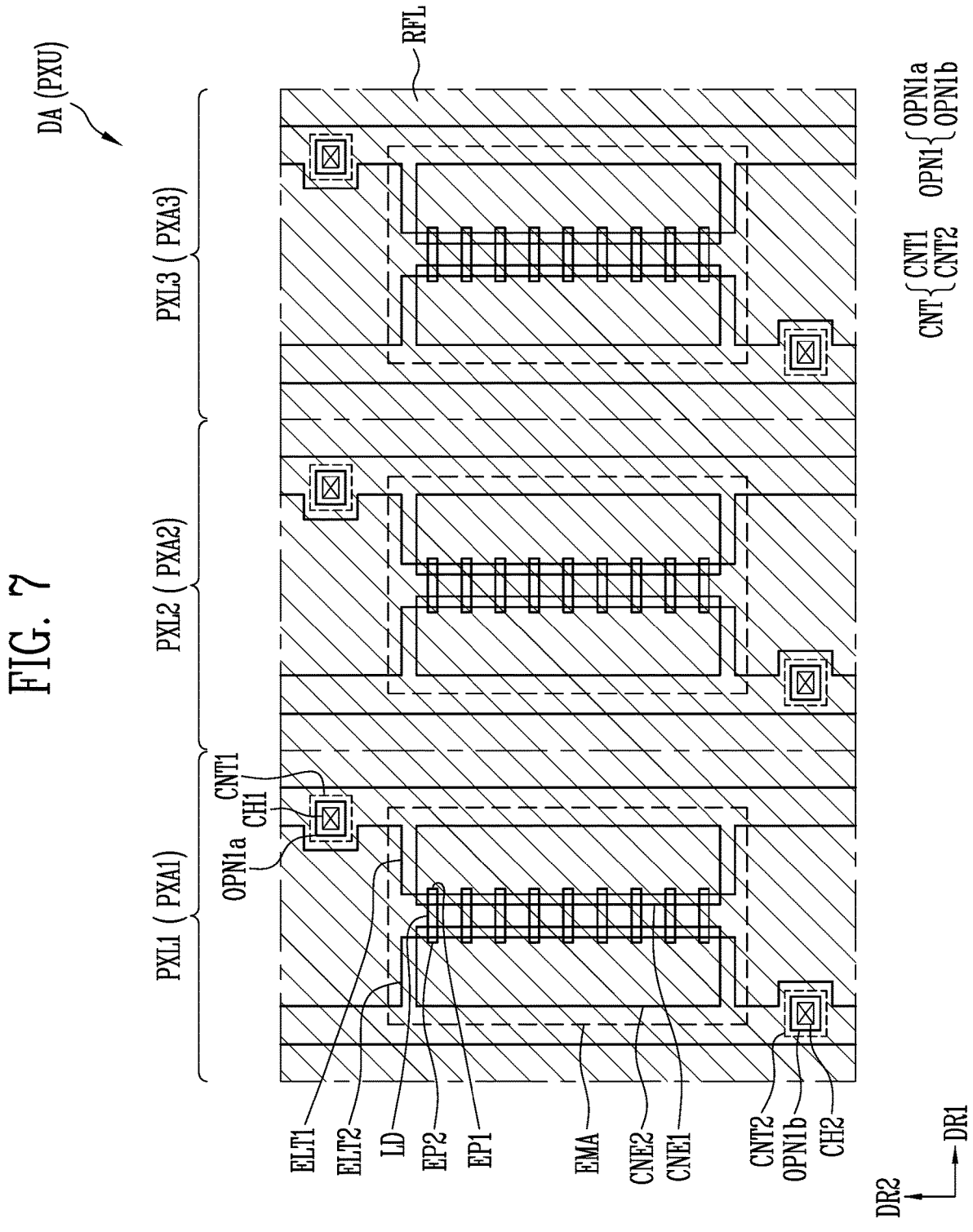
FIG. 7 is a plan view illustrating a display area according to one embodiment of the present disclosure.

FIG. 7 is a plan view illustrating a display area DA according to one embodiment of the present disclosure. For example, FIG. 7 illustrates first to third pixel areas PXA1, PXA2, and PXA3 in which first to third pixels PXL1, PXL2, and PXL3 corresponding to the pixel unit PXU of FIG. 3 are disposed, and e.g., a display layer DPL in which light-emitting units EMU of the first to third pixels PXL1, PXL2, and PXL3 are disposed, and a reflective film RFL disposed under the display layer DPL. According to some embodiments, in FIG. 7, each of the first to third pixels PXL1, PXL2, and PXL3 is illustrated as having the structure according to the embodiment of FIG. 6A, but the present disclosure is not limited thereto.

Figure 8A:
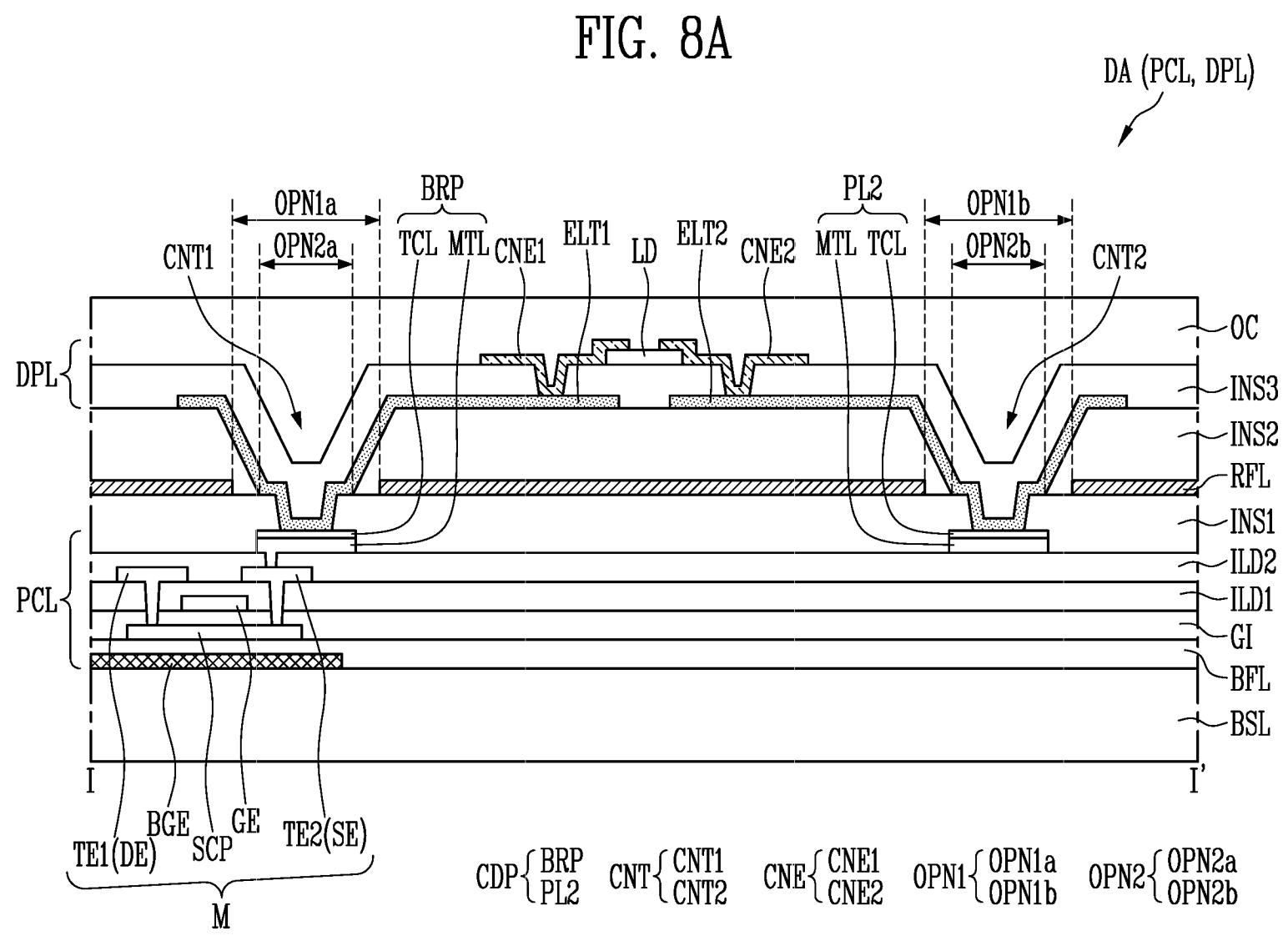
Figure 8B:
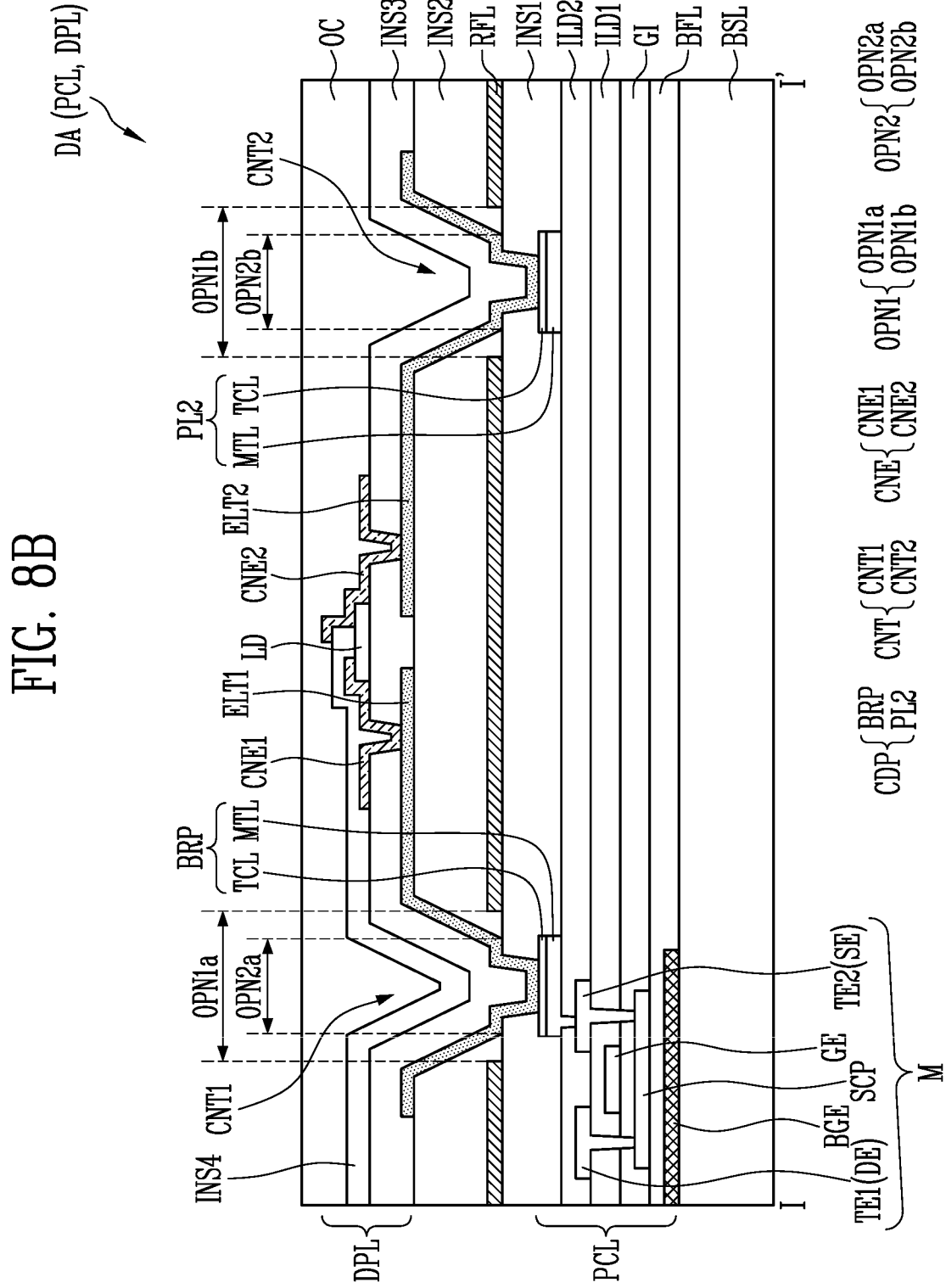
Figure 9:
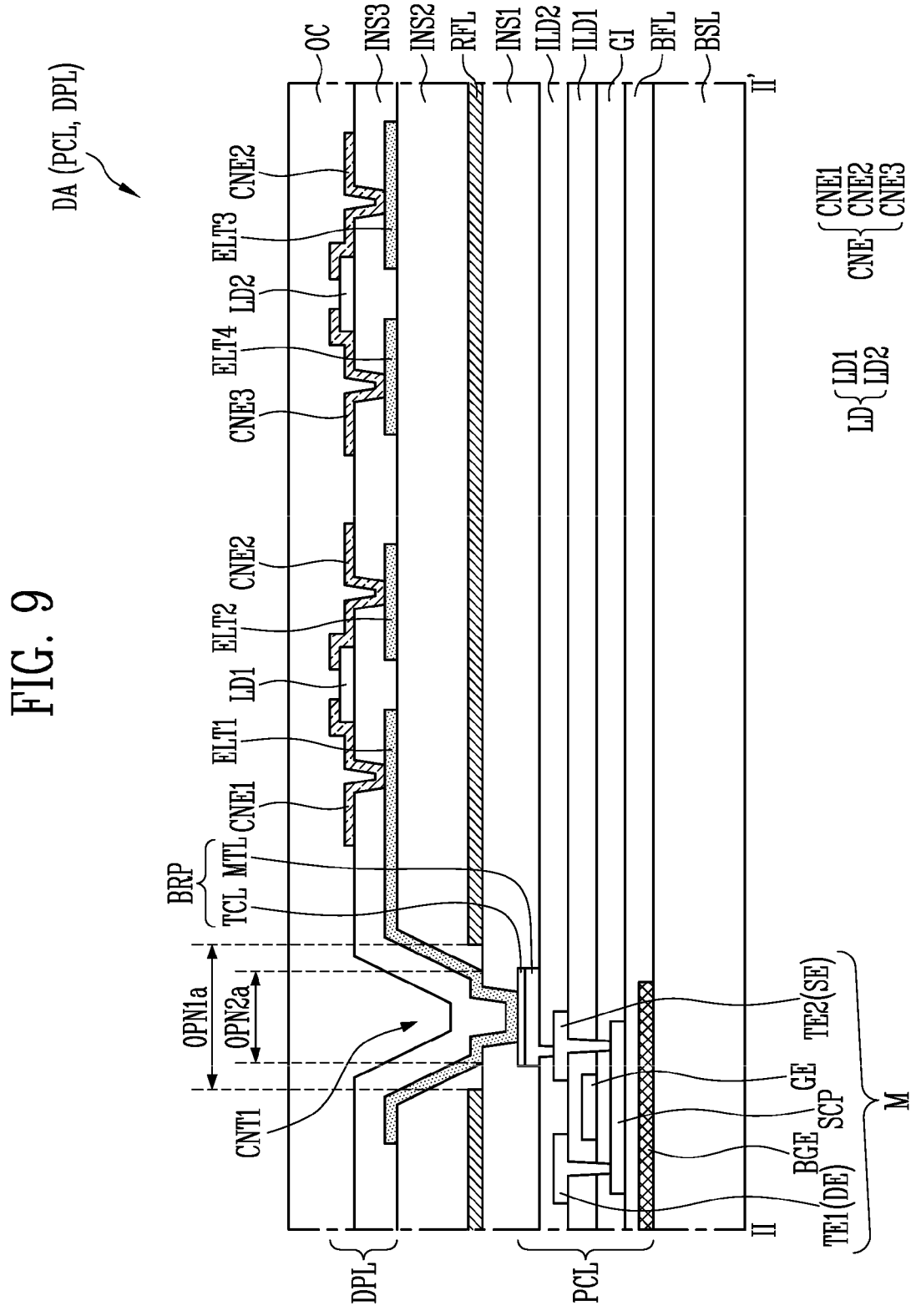

FIGS. 8A, 8B, and 9 are cross-sectional views each illustrating a display area DA according to one embodiment of the present disclosure. For example, FIGS. 8A and 8B illustrates different embodiments of a cross section taken along the line I to I' of FIG. 6A, and the embodiment of FIG. 8B further includes a fourth insulating film INS4 disposed on a first contact electrode CNE1 as compared with the embodiment of FIG. 8A. FIG. 9 illustrates an embodiment of a cross section taken along the line II to II' of FIG. 6B. FIG. 9 illustrates the embodiment in which a fourth insulating film INS4 is not included as in the embodiment of FIG. 8A, but the present disclosure is not limited thereto. For example, the embodiment of FIG. 9 may further include the fourth insulating film INS4 disposed on any one of one pair of contact electrodes in the same manner as in the embodiment of FIG. 8B.

In FIGS. 8A, 8B, and 9, an arbitrary transistor M is illustrated as an example of circuit elements that may be disposed on a circuit layer PCL. Further, as examples of a conductive pattern CDP that may be disposed on the circuit layer PCL, a bridge pattern BRP connected to a first electrode ELT1 through a first contact portion CNT1 and a second power line PL2 connected to a second electrode ELT2 through a second contact portion CNT2 are illustrated.

In one embodiment, when the circuit layer PCL is formed as in the embodiment of FIG. 5, the bridge pattern BRP of FIGS. 8A, 8B, and 9 may be the sixth bridge pattern BRP6 of FIG. 5, and a second power line PL2 of FIGS. 8A, 8B, and 9 may be the second vertical power line PL2_V of FIG. 5. However, in the embodiments of FIGS. 6A-9, the structure of the circuit layer PCL disposed under the display layer DPL is not limited to the embodiment of FIG. 5.

Figure 10:
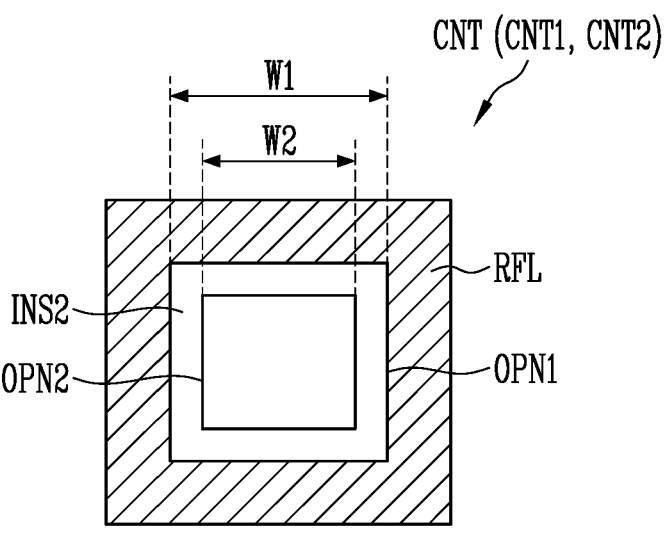
FIG. 10 is a plan view illustrating a contact portion according to one embodiment of the present disclosure and illustrates, for example, a mutual arrangement structure between a reflective film and a second insulating film in each contact portion of FIGS. 8A, 8B, and 9.

FIG. 10 is a plan view illustrating a contact portion CNT according to one embodiment of the present disclosure. For example, FIG. 10 illustrates a mutual arrangement structure between a reflective film RFL and a second insulating film INS2 in each contact portion CNT of FIGS. 8A, 8B, and 9. The contact portion CNT may comprehensively refer to a "first contact portion CNT1" and a "second contact portion CNT2" and may mean at least one of "first contact portion CNT1" and "second contact portion CNT2."

Referring to FIGS. 3, 4A, 4B, and 6A-10, a pixel PXL and a display device including the same according to one embodiment of the present disclosure includes a circuit layer PCL and a display layer DPL disposed to overlap each other on one surface of a base layer BSL. For example, the display area DA may include the circuit layer PCL disposed on one surface of the base layer BSL and the display layer DPL disposed on the circuit layer PCL.

Circuit elements constituting the pixel circuit PXC of a corresponding pixel and lines connected thereto are disposed in each pixel area of the circuit layer PCL. Pixel electrodes and light-emitting elements LD constituting a light-emitting unit EMU of the corresponding pixel are disposed in each pixel area of the display layer DPL.

In some embodiments, a first insulating film INS1 and a second insulating film INS2 are interposed between the circuit layer PCL and the display layer DPL. A reflective film RFL is interposed between the first insulating film INS1 and the second insulating film INS2. Accordingly, in embodiments of the present disclosure, it is possible to secure the front luminous efficiency of the pixel PXL including the light-emitting elements LD.

The circuit layer PCL may include a plurality of conductive layers and a plurality of insulating films interposed between the conductive layers. For example, the circuit layer PCL may include a first conductive layer, a buffer layer BFL, a semiconductor layer, a gate insulating film GI, a second conductive layer, an interlayer insulating film ILD1, a third conductive layer, a second interlayer insulating film ILD2, and a fourth conductive layer which are sequentially disposed on one surface of the base layer BSL.

The first conductive layer may be disposed on one surface of the base layer BSL. The first conductive layer is a conductive layer on which a back gate electrode BGE of a transistor M and the like may be disposed and may correspond to, for example, the first conductive layer BML according to the embodiment of FIG. 5.

The buffer layer BFL may be disposed on one surface of the base layer BSL including the first conductive layer. The buffer layer BFL may prevent impurities from diffusing into each circuit element.

The semiconductor layer may be disposed on the buffer layer BFL. The semiconductor layer may be a conductive layer on which a semiconductor pattern SCP of the transistor M and the like may be disposed and may correspond to, for example, the semiconductor layer SCL according to the embodiment of FIG. 5.

The gate insulating film GI may be disposed on the semiconductor layer. For example, the gate insulating film GI may be interposed between the semiconductor layer and the second conductive layer.

The second conductive layer may be disposed on the gate insulating film GI. The second conductive layer may be a conductive layer on which a gate electrode GE of the transistor M and the like may be disposed and may correspond to, for example, the second conductive layer GAT according to the embodiment of FIG. 5.

The first interlayer insulating film ILD1 may be disposed on the second conductive layer. For example, the first interlayer insulating film ILD1 may be interposed between the second conductive layer and the third conductive layer.

The third conductive layer may be disposed on the first interlayer insulating film ILD1. The third conductive layer may be a conductive layer on which first and second transistor electrodes TE1 and TE2 of the transistor M and the like may be disposed and may correspond to, for example, the third conductive layer SD1 according to the embodiment of FIG. 5. Here, the first and second transistor electrodes TE1 and TE2 may be source and drain electrodes SE and DE of each transistor M. For example, when the first transistor electrode TE1 is a drain electrode, the second transistor electrode TE2 may be a source electrode.

The second interlayer insulating film ILD2 may be disposed on the third conductive layer. For example, the second interlayer insulating film ILD2 may be interposed between the third conductive layer and the fourth conductive layer.

The fourth conductive layer may be disposed on the second interlayer insulating film ILD2. The fourth conductive layer is a conductive layer on which a conductive pattern CD connected to the light-emitting unit EMU and the like may be disposed and may correspond to, for example, the fourth conductive layer SD2 according to the embodiment of FIG. 5.

For example, the fourth conductive layer may include a bridge pattern BRP which is disposed in each pixel area and connects a first electrode ELT1 of the light-emitting unit EMU and at least one circuit element (for example, at least one transistor M) from among circuit elements constituting the pixel circuit PXC of the corresponding pixel PXL. In some embodiments, the fourth conductive layer may include at least one power line and/or signal line. For example, the fourth conductive layer may include a second power line PL2 connected to a second electrode ELT2 (or fourth electrode ELT4) of the light-emitting unit EMU.

In one embodiment, at least one conductive pattern CDP formed on the fourth conductive layer may be formed as a multi-layer including a metal film MTL and a transparent conductive film TCL on the metal film MTL. For example, the transparent conductive film TCL is positioned on a top of the conductive pattern CDP and is in contact (e.g., in direct contact) with first, second, or fourth electrodes ELT1, ELT2, or ELT4 to be electrically connected to the first, second, or fourth electrodes ELT1, ELT2, or ELT4. As described above, when the transparent conductive film TCL is disposed on the top of the conductive pattern CDP exposed by first or second contact holes CH1 and CH2 in each contact portion CNT, damage to the conductive pattern CDP can be effectively prevented or reduced when the reflective film RFL and/or the first insulating film INS1 is etched to form each contact portion CNT. For example, the bridge pattern BRP exposed by the first contact hole CH1 in the first contact portion CNT1 and the second power line PL2 exposed by the second contact hole CH2 at a second contact portion CNT2 may be protected by each transparent conductive layer TCL.

The first insulating film INS1 may be disposed on the circuit layer PCL. For example, the first insulating film INS1 may be formed to cover one surface of the base layer BSL on which the circuit layer PCL is formed and may be opened in each contact portion CNT on the conductive pattern CDP connected to the display layer DPL. As an example, the first insulating film INS1 may be opened in the first contact portion CNT1 positioned on the bridge pattern BRP to connect the bridge pattern BRP and a first pixel electrode (for example, the first electrode ELT1) and the second contact portion CNT2 positioned on the second power line PL2 to connect the second power line PL2 and a last pixel electrode (for example, the second electrode ELT2 or the fourth electrode ELT4).

A reflective film RFL may be disposed on the first insulating film INS1. For example, the reflective film RFL may be formed to cover one surface of the base layer BSL on which the circuit layer PCL and the first insulating film INS1 are formed and may be opened in each contact portion CNT on the conductive pattern CDP connected to the display layer DPL. As an example, the reflective film RFL may include an opening OPN1a corresponding to the first contact portion CNT1 and an opening OPN1*b* corresponding to the second contact portion CNT2. Hereinafter, when any one of the openings OPN1*a* and OPN1*b* formed in the reflective film is arbitrarily described, or the openings OPN1*a* and OPN1*b* are collectively described, the openings OPN1*a* and OPN1*b* refer to "first opening OPN1."

The reflective film RFL may be formed as a metal film including at least one type of metal or alloy. For example, the reflective film RFL may be formed as a metal film including at least one selected from various metal materials such as aluminum (Al), gold (Au), and silver (Ag) having high reflectance at a visible light wavelength. In some embodiments, the reflective film RFL may have a thickness sufficient to secure a suitable reflectance (e.g., a set or predetermined reflectance). For example, when the reflective film RFL is formed to have a thickness of 40 nm or more, sufficient reflectance may be secured.

According to some embodiments, the reflective film RFL may completely cover a lower portion of an emission area EMA in which the light-emitting elements LD are disposed. Accordingly, light emitted in a downward direction of the light-emitting elements LD may be reflected in an upward direction of the pixel PXL. In some embodiments, the reflective film RFL may be disposed under the display layer DPL so as to be positioned adjacent to the light-emitting elements LD, thereby improving the luminous efficiency of the pixel PXL. For example, the light luminous efficiency of the entire pixel PXL may be improved by the reflective film RFL.

In one embodiment, the reflective film RFL may be formed entirely in the display area DA excluding each contact portion CNT. As an example, as illustrated in FIG. 7, an integral reflective film RFL may be formed in the entire display area DA including first to third pixel areas PXA1, PXA2, and PXA3.

The second insulating film INS2 may be disposed on the reflective film RFL. For example, the second insulating film INS2 may be formed to cover one surface of the base layer BSL on which the circuit layer PCL, the first insulating film INS1, and the reflective film RFL are formed and may be opened in each contact portion CNT for connecting the circuit layer PCL and the display layer DPL. As an example, the second insulating film INS2 may include an opening OPN2*a* overlapping the first opening OPN1*a* of the first contact portion CNT1 and an opening OPN2*b* overlapping the first opening OPN1*b* of the second contact portion CNT2. Hereinafter, when any one of the openings OPN2*a* and OPN2*b* formed in the second insulating film INS2 is arbitrarily described, or the openings OPN2*a* and OPN2*b* are collectively described, the openings OPN2*a* and OPN2*b* refer to "second opening OPN2."

The second insulating film INS2 may be formed as a single-layer or a multi-layer and may include at least one inorganic insulating material and/or organic insulating material. As an example, the second insulating film INS2 may include an organic insulating layer at least to planarize substantially a surface of the base layer BSL on which the circuit layer PCL, the first insulating film INS1, and the reflective film RFL are formed. The display layer DPL may be disposed on the second insulating film INS2.

As described above, when the second insulating film INS2 is interposed between the reflective film RFL and the display layer DPL, for example, between the reflective film RFL and the pixel electrodes, it is possible to secure electrical stability (for example, an insulating property) between the reflective film RFL and the display layer DPL.

In some embodiments of the present disclosure, the reflective film RFL is opened to be wider than the second insulating film INS2 at least in each contact portion CNT, and in each first opening OPN1, a peripheral area (e.g., a circumference area) around the first opening OPN1 of the reflective film RFL is covered with the second insulating film INS2. Accordingly, the reflective film RFL may be stably separated from surrounding circuit elements, lines, and/or various electrodes, thereby preventing the occurrence of short circuit defects due to the reflective film RFL in each contact portion CNT.

For example, as illustrated in FIG. 10, in each contact portion CNT, the reflective film RFL may be opened to have a first width W1, and the second insulating film INS2 may be opened to have a second width W2 smaller that the first width W1. Each second opening OPN2 may be positioned inside each first opening OPN1. In some embodiments, in each contact portion CNT, a peripheral area (e.g., a circumference area) around the second opening OPN2 of the second insulating film INS2 may cover the peripheral area around the first opening OPN1 of the reflective film RFL. For example, as illustrated in FIGS. 8A, 8B, and 9, in each contact portion CNT, the second insulating film INS2 may completely cover a surface including a side surface of the reflective film RFL.

In one embodiment, the reflective film RFL may be opened in each contact portion CNT through over-etching using the second insulating film INS2 as a mask. In this case, the second insulating film INS2 may include the second openings OPN2 overlapping the first openings OPN1 at all points at which the first openings OPN1 of the reflective film RFL are positioned.

In one embodiment, after the first opening OPN1 is formed in the reflective film RFL, the peripheral area around the first opening OPN1 of the reflective film RFL may be covered with the second insulating film INS2 by performing a reflow process on the second insulating film INS2. In this case, the second insulating film INS2 may be opened to have a gentle slope as compared with the first insulating film INS1 and the reflective film RFL in each contact portion CNT.

The display layer DPL may be disposed on the second insulating film INS2. The display layer DPL may be connected to the circuit layer PCL through each contact portion CNT. For example, in the embodiments of FIGS. 6A and 7-8B, the first electrode ELT1 of the display layer DPL may be connected to the bridge pattern BRP through the first contact portion CNT1, and the second electrode ELT2 of the display layer DPL may be connected to the second power line PL2 through the second contact portion CNT2. In the embodiments of FIGS. 6B and 9, the first electrode ELT1 of the display layer DPL may be connected to the bridge pattern BRP through the first contact portion CNT1, and the fourth electrode ELT4 of the display layer DPL may be connected to the second power line PL2 through the second contact portion CNT2.

At least one pair of pixel electrodes may be disposed in each pixel area of the display layer DPL, and one or more light-emitting elements LD may be disposed between the pixel electrodes. In some embodiments, in each pixel area of the display layer DPL, contact electrodes for stably connecting the light-emitting element LD in a desired direction may be further disposed between the pixel electrodes.

For example, in the embodiments of FIGS. 6A and 7-8B, the first electrode ELT1, the second electrode ELT2, and one or more light-emitting elements LD disposed between the first electrode ELT1 and the second electrode ELT2 (for example, the plurality of light-emitting elements LD connected in parallel between the first electrode ELT1 and the second electrode ELT2) may be disposed in each pixel area of the display layer DPL. In some embodiments, a first contact electrode CNE1 and a second contact electrode CNE2 for stably connecting the light-emitting element LD between the first electrode ELT1 and the second electrode ELT2 may be further disposed in the pixel area.

In the embodiments of FIGS. 6B and 9, first to fourth electrodes ELT1 to ELT4 and first and second light-emitting elements LD1 and LD2 connected in series and parallel between the first to fourth electrodes ELT1 to ELT4 may be disposed in each pixel area of the display layer DPL. In some embodiments, first to third contact electrodes for stably connecting the first and second light-emitting element LD1 and LD2 between the first to fourth electrodes ELT1-ELT4 may be further disposed in each pixel area.

The first electrode ELT1 and the second electrode ELT2 may be disposed on the second insulating film INS2 to be spaced from each other. For example, as illustrated in FIGS. 6A and 7, the first electrode ELT1 and the second electrode ELT2 may be disposed to be spaced from each other in the emission area EMA of each pixel PXL. As an example, the first and second electrodes ELT1 and ELT2 may be spaced from each other by an interval (e.g., a set or predetermined interval) in a first direction DR1 and may each extend in a second direction DR2 in each emission area EMA. The first direction DR1 may be a horizontal direction (or row direction), and the second direction DR2 may be a vertical direction (or column direction), but the present disclosure is not limited thereto.

Similarly, the third electrode ELT3 and the fourth electrode ELT4 may be disposed to be spaced from each other on the second insulating film INS2. For example, as illustrated in FIG. 6B, the third electrode ELT3 and the fourth electrode ELT4 may be disposed to be spaced from each other in the emission area EMA of each pixel PXL. As an example, the third and fourth electrodes ELT3 and ELT4 may be spaced from each other by an interval (e.g., a set or predetermined interval) in the first direction DR1 and may each extend the second direction DR2 in each emission area EMA.

The emission area EMA may be an area in which the light-emitting elements LD (in particular, effective light sources connected in a forward direction between one pair of pixel electrodes) constituting the light-emitting unit EMU of each pixel PXL are disposed. Furthermore, pixel electrodes (for example, the first, second, third, and/or fourth electrodes ELT1, ELT2, ELT3, and ELT4), the first, second, and/or third contact electrodes CNE1, CNE2, and CNE3, and/or one area of pixel electrodes, which are connected to the light-emitting elements LD, may be disposed in the emission area EMA.

The emission area EMA may be surrounded by light-blocking and/or reflective bank structures (for example, a pixel definition film and/or a black matrix) formed between the pixels PXL to define each pixel area and the emission area EMA therein. For example, a bank pattern may be further disposed in a peripheral area of each pixel area and/or between adjacent pixel areas on the display layer DPL so as to surround an area including the emission area EMA at least.

According to some embodiments, the pixel electrodes may have a pattern separated for each pixel PXL or have a pattern connected in common to the plurality of pixels PXL. For example, the first, second, third, and/or fourth electrodes ELT1, ELT2, ELT3, and ELT4 may have an independent pattern of which both ends are disconnected in a peripheral area of a corresponding pixel or between adjacent pixel areas. In another embodiment, some of the pixel electrode(s) may have an independent pattern disconnected in a peripheral area of a corresponding pixel or between adjacent pixel areas, and one end of the remaining pixel electrode(s) may extend in the first direction DR1 or the second direction DR2 and may be integrally connected to one pixel electrode of another adjacent pixel PXL in the first direction DR1 or the second direction DR2.

In some embodiments, before a process of forming the pixels PXL, e.g., before the alignment of the light-emitting elements LD is completed, the pixel electrodes of the pixels PXL disposed in the display area DA may be divided into a plurality of groups and may be integrally or non-integrally connected to each other for each group. For example, as in the embodiment of FIG. 6A, the first electrodes ELT1 of the pixels PXL (e.g., adjacent pixels in second direction DR2) may be connected to each other, and the second electrodes ELT2 of the pixels PXL (e.g., adjacent pixels in second direction DR2) may be connected to each other. Alternatively, as in the embodiment of FIG. 6B the first electrodes ELT1 of the pixels PXL may be connected to each other, the second and fourth electrodes ELT2 and ELT4 of the pixels PXL may be connected to each other, and the third electrodes ELT3 of the pixels PXL may be connected to each other. In this case, the third electrodes ELT3 of the pixels PXL may be selectively connected to the first electrodes ELT1.

The pixel electrodes may receive an alignment signal (e.g., a set or predetermined alignment signal) (or alignment voltage) for each group in an operation of aligning the light-emitting elements LD. As an example, the pixel electrodes may receive an alignment signal (e.g., a set or predetermined alignment signal) such that the light-emitting elements LD may be aligned between one pair of adjacent pixel electrodes constituting each series stage.

In this case, the pair of pixel electrodes may receive different alignment signals such that the light-emitting elements LD may be aligned therebetween. Accordingly, an electric field is formed between the pair of pixel electrodes, and the light-emitting elements LD supplied to each pixel area (e.g., the emission area EMA of each pixel PXL) may be self-aligned between the pair of pixel electrodes by the electric field. After the alignment of the light-emitting elements LD is completed, at least some of the pixel electrodes may be disconnected from each other between the pixels PXL, thereby forming the pixels PXL in a form in which individual driving is possible.

The pixel electrodes may have various shapes. For example, in the embodiment of FIG. 6A, the first electrode ELT1 and the second electrode ELT2 may be formed to have a maximum width in a certain emission area EMA so as to be close to each other in the emission area EMA. As an example, in the emission area EMA, the first electrode ELT1 and the second electrode ELT2 may be formed to be spaced from each other as close as possible so as to sufficiently form an electric field required for alignment of the light-emitting elements LD in a process of aligning the light-emitting elements LD.

Similarly, in the embodiment of FIG. 6B, the first electrode ELT1 and the second electrode ELT2 may be formed to be close to each other in one area of the emission area EMA (for example, a sub-emission area corresponding to a first series stage), and the third electrode ELT3 and the fourth electrode ELT4 may be formed to be close to each other in another area of the emission area EMA (for example, a sub-emission area corresponding to a second series stage).

The shape and size of the pixel electrodes may be variously changed according to embodiments. For example, at least some of the pixel electrodes may have a width varied according to areas in a form in which the pixel electrode has a partially enlarged width only in a middle area corresponding to the emission EMA and has a narrow width in the remaining areas (for example, upper and lower areas of each pixel area). In another embodiment, each pixel electrode may have a uniform width in each pixel area and/or the display area DA and may extend in a bar shape in the second direction DR2. In some embodiments, each pixel electrode may have a curved portion or may have various shapes such as spiral or circular shape. In some embodiments, the number and/or mutual arrangement structure of the pixel electrodes disposed in each emission area EMA may be variously changed.

Each pixel electrode may include a single electrode or may include a plurality of electrodes. As an example, a single first electrode ELT1 or a plurality of first electrodes ELT1 may be disposed in one pixel PXL. When the plurality of first electrodes ELT1 are disposed, the first electrodes ELT1 may be integrally or non-integrally connected to each other.

In some embodiments, the first pixel electrode (for example, the first electrode ELT1) may include a protrusion corresponding to the first contact portion CNT1 for a connection with the circuit layer PCL (for example, an electrical connection with a certain circuit element disposed on the circuit layer PCL), but the present disclosure is not limited thereto. Similarly, the last pixel electrode (for example, the second electrode ELT2 or the fourth electrode ELT4) may include a protrusion corresponding to the second contact portion CNT2 for a connection with the circuit layer PCL (for example, an electrical connection with the second power line PL2 disposed in the circuit layer PCL), but the present disclosure is not limited thereto.

That is, in the present disclosure, the shape, number, arrangement direction, and/or mutual arrangement relationship of the pixel electrodes disposed in each pixel PXL may be variously changed.

The first pixel electrode (for example, the first electrode ELT1) of each pixel PXL may be electrically connected to a certain circuit element (for example, the pixel circuit PXC), a power line (for example, the first power line PL1), and/or a signal line (for example, a scan line SL, a data line DL, or a certain control line) through the first contact hole CH1 formed in the first contact portion CNT1. However, the present disclosure is not limited thereto. For example, in another embodiment, the first pixel electrode may be connected directly to a certain power line or signal line.

In one embodiment, the first pixel electrode may be electrically connected to a certain circuit element disposed thereunder through the first contact hole CH1 and may be electrically connected to a first line through the circuit element. The first line may be a first power line PL1 for supplying first power VDD but is not limited thereto. For example, the first line may be a signal line to which a first driving signal (e.g., a set or predetermined first driving signal) (for example, a scan signal, a data signal, or a control signal (e.g., a set or predetermined control signal)) is supplied.

The last pixel electrode (for example, the second electrode ELT2 or the fourth electrode ELT4) of each pixel PXL may be electrically connected to a certain circuit element (for example, at least one transistor constituting the pixel circuit PXC), a power line (for example, the second power line PL2), and/or a signal line (for example, the scan line SL, the data line DL, or the certain control line) through the second contact hole CH2. However, the present disclosure is not limited thereto. For example, in another embodiment, the last pixel electrode may be connected directly to a certain power line or signal line.

In one embodiment, the last pixel electrode may be electrically connected to a second line disposed thereunder through the second contact hole CH2 formed in the second contact portion CNT2. The second line may be the second power line PL2 for supplying second power VSS but is not limited thereto. For example, the second line may be a signal line to which a second driving signal (e.g., a set or predetermined second driving signal) (for example, a scan signal, a data signal, or a control signal (e.g., a set or predetermined control signal)) is supplied.

Each pixel electrode may include at least one conductive material. In one embodiment, the pixel electrodes may each be made of a transparent conductive material and may include the same or different conductive materials.

For example, each of the first, second, third, and/or fourth electrodes ELT1, ELT2, ELT3, and ELT4 may include at least one selected from various transparent conductive materials such as ITO, IZO, ITZO, ZnO, AZO, GZO, ZTO, GTO, and FTO and may be implemented to be substantially transparent or semi-transparent so as to satisfy a transmittance (e.g., a set or predetermined transmittance). Accordingly, light generated by the light-emitting elements LD may pass through each pixel electrode to be incident on the reflective film RFL and may be reflected from the reflective film RFL to be emitted in an upward direction of the pixel PXL.

The third insulating film INS3 may be disposed on the pixel electrodes. The third insulating film INS3 may include at least one inorganic insulating material and/or organic insulating material. For example, the third insulating film INS3 may include various types of organic/inorganic insulating materials such as silicon nitride ($SiN_x$), silicon oxide ($SiO_x$), and aluminum oxide ($Al_xO_y$). The third insulating film INS3 may be formed as a single-layer or multi-layer.

The light-emitting elements LD may be disposed on the third insulating film INS3. The light-emitting elements LD may be aligned between at least one pair of pixel electrodes. For example, the light-emitting elements LD may be aligned between the at least one pair of pixel electrodes and connected in series, parallel, or series-parallel arrangement. As an example, each light-emitting element LD may be aligned in the first direction DR1 between one pair of pixel electrodes and may be electrically connected between the pair of pixel electrodes.

In some embodiments, in FIGS. 6A-7, all of the light-emitting elements LD are illustrated as being uniformly aligned in the first direction DR1, but the present disclosure is not limited thereto. For example, at least one of the light-emitting elements LD may be in a diagonal direction inclined with respect to the first and second directions DR1 and DR2 between the first and second electrodes ELT1 and ELT2.

According to some embodiments, each light-emitting element LD may be a micro-sized light-emitting element which is made of an inorganic crystal structure material and has a small size ranging from a nanoscale to a microscale. For example, as illustrated in FIGS. 1A-2B, each light-emitting element LD may be a micro-sized light-emitting element having a size ranging from a nanoscale to a microscale. However, the type and/or size of the light-emitting element LD may be variously changed according to embodiments.

In the embodiment of FIG. 6A, each of the light-emitting elements LD includes a first end portion EP1 disposed to face the first electrode ELT1 and a second end portion EP2 disposed to face the second electrode ELT2. Each light-emitting element LD may overlap the first and/or second electrodes ELT1 and ELT2 or may not overlap the first and/or second electrodes ELT1 and ELT2. For example, the first end portion EP1 of the light-emitting element LD or LD' may or may not overlap the first electrode ELT1. Similarly, the second end portion EP2 of the light-emitting element LD or LD' may or may not overlap the second electrode ELT2.

The first end portions EP1 of the light-emitting elements LD may be connected to the first electrode ELT1, and the second end portions EP2 of the light-emitting elements LD may be connected to the second electrode ELT2. For example, the first end portions EP1 of the light-emitting elements LD may be electrically connected to the first electrode ELT1 through the first contact electrode CNE1, and the second end portions EP2 of the light-emitting elements LD may be electrically connected to the second electrode ELT2 through the second contact electrode CNE2. In another embodiment, the first end portions EP1 of the light-emitting elements LD may be in direct contact with the first electrode ELT1 to be electrically connected to the first electrode ELT1. Similarly, the second end portions EP2 of the light-emitting elements LD may be in direct contact with the second electrode ELT2 to be electrically connected to the second electrode ELT2. In this case, the first contact electrode CNE1 and/or the second contact electrode CNE2 may be selectively formed.

In the embodiment of FIG. 6B, each first light-emitting element LD1 may include a first end portion EP1 disposed to face the first electrode ELT1 and a second end portion EP2 disposed to face the second electrode ELT2. Each first light-emitting element LD1 may overlap the first and/or second electrodes ELT1 and ELT2 or may not overlap the first and/or second electrodes ELT1 and ELT2.

The first end portions EP1 of the first light-emitting elements LD1 may be connected to the first electrode ELT1, and the second end portions EP2 of the first light-emitting elements LD1 may be connected to the second electrode ELT2. For example, the first end portions EP1 of the first light-emitting elements LD1 may be electrically connected to the first electrode ELT1 through the first contact electrode CNE1, and the second end portions EP2 of the first light-emitting elements LD1 may be electrically connected to the second electrode ELT2 through the second contact electrode CNE2. In another embodiment, the first end portions EP1 of the first light-emitting elements LD1 may be in direct contact with the first electrode ELT1 to be electrically connected to the first electrode ELT1. Similarly, the second end portions EP2 of the first light-emitting elements LD1 may be in direct contact with the second electrode ELT2 to be electrically connected to the second electrode ELT2. In this case, the first contact electrode CNE1 and/or the second contact electrode CNE2 may be selectively formed.

Each second light-emitting element LD2 may include a first end portion EP1 disposed to face the third electrode ELT3 and a second end portion EP2 disposed to face the fourth electrode ELT4. Each second light-emitting element LD2 may overlap the third and/or fourth electrodes ELT3 and ELT4 or may not overlap the third and/or fourth electrodes ELT3 and ELT4.

The first end portions EP1 of the second light-emitting elements LD2 may be connected to the third electrode ELT3, and the second end portions EP2 of the second light-emitting elements LD2 may be connected to the fourth electrode ELT4. For example, the first end portions EP1 of the second light-emitting elements LD2 may be electrically connected to the third electrode ELT3 through the second contact electrode CNE2, and the second end portions EP2 of the second light-emitting elements LD2 may be electrically connected to the fourth electrode ELT4 through the third contact electrode CNE3. In some embodiments, the first end portions EP1 of the second light-emitting elements LD2 may be connected to the second end portions EP2 of the first light-emitting elements LD1 and the second electrode ELT2 through the second contact electrode CNE2. In another embodiment, the first end portions EP1 of the second light-emitting elements LD2 may be in direct contact with to the third electrode ELT3 to be electrically connected to the third electrode ELT3. Similarly, the second end portions EP2 of the second light-emitting elements LD2 may be in direct contact with the fourth electrode ELT4 to be electrically connected to the fourth electrode ELT4. In this case, the second contact electrode CNE2 and/or the third contact electrode CNE3 may be selectively formed.

The light-emitting elements LD may be provided dispersed in a certain solution and may be supplied to the emission area EMA of each pixel PXL (e.g., the emission area EMA of each pixel PXL through various methods such as an inkjet method or a slit coating method). For example, the light-emitting elements LD may be mixed in a volatile solvent and supplied to the emission area EMA of each pixel PXL. In this case, when an alignment voltage (e.g., a set or predetermined alignment voltage) (or alignment signal) is applied to the pixel electrodes, an electric field is formed between the pixel electrodes, and thus, the light-emitting elements LD are aligned. After the light-emitting elements LD are aligned, the solvent may be volatilized or removed through other methods to stably arrange the light-emitting elements LD between the pixel electrodes.

According to some embodiments, each contact electrode may be formed on the first and second end portions EP1 and EP2 of the light-emitting elements LD. For example, in the embodiment of FIG. 6A, the first contact electrode CNE1 and the second contact electrode CNE2 may be formed on the first and second end portions EP1 and EP2 of the light-emitting elements LD, respectively. Accordingly, the light-emitting elements LD may be more stably connected between the first electrode ELT1 and the second electrode ELT2. In the embodiment of FIG. 6B, the first contact electrode CNE1 and the second contact electrode CNE2 may be respectively formed on the first and second end portions EP1 and EP2 of the first light-emitting elements LD1, and the second contact electrode CNE2 and the third contact electrode CNE3 may be respectively formed on the first and second end portions EP1 and EP2 of the second light-emitting elements LD2. Accordingly, the first and second light-emitting elements LD1 and LD2 may be more stably connected between the first electrode ELT1 and the second electrode ELT2 and between the third electrode ELT3 and the fourth electrode ELT4, respectively.

Hereinafter, when at least one contact electrode of the first to third contact electrodes CNE1 to CNE3 is arbitrarily described, or the first to third contact electrodes CNE1 to CNE3 are collectively described, the contact electrodes refer to "contact electrodes CNE."

In one embodiment, in order to increase the utilization rate of the light-emitting elements LD supplied to each emission area EMA, an alignment signal may be adjusted or a magnetic field may be formed to deflect and align the light-emitting elements LD such that a more number (or ratio) of the light-emitting elements LD are aligned in a specific direction. In this case, it is possible to connect the pixel electrodes according to the arrangement direction of the more number of the light-emitting elements LD using the contact electrodes CNE. Accordingly, it is possible to improve the utilization rate of the light-emitting elements LD and improve the luminous efficiency of the pixel PXL.

The first contact electrode CNE1 may be disposed on the first electrode ELT1 and the first end portion EP1 of the light-emitting element LD so as to overlap the first electrode ELT1 and the first end portion EP1 of at least one light-emitting element LD (or at least one first light-emitting element LD1) adjacent thereto. The first contact electrode CNE1 may be disposed on the first electrode ELT1 and the first end portions EP1 of the light-emitting elements LD so as to overlap the first electrode ELT1 and the first end portions EP1 of the plurality of light-emitting elements LD adjacent thereto.

The first contact electrode CNE1 may connect the first electrode ELT1 and the first end portions EP1 of the light-emitting elements LD. In some embodiments, the first contact electrode CNE1 may stably fix the first end portions EP1 of the light-emitting elements LD. In another embodiment, when the first contact electrode CNE1 is not formed, the first end portions EP1 of the light-emitting elements LD may be disposed to overlap the first electrode ELT1 adjacent thereto and connected directly to the first electrode ELT1. In this case, the third insulating film INS3 may be at least partially removed.

The second contact electrode CNE2 may be disposed on the second electrode ELT2 and the second end portion EP2 of the light-emitting element LD so as to overlap the second electrode ELT2 and the second end portion EP2 of at least one light-emitting element LD (or at least one first light-emitting element LD1) adjacent thereto. The second contact electrode CNE2 may be disposed on the second electrode ELT2 and the second end portions EP2 of the light-emitting elements LD so as to overlap the second electrode ELT2 and the second end portions EP2 of the plurality of light-emitting elements LD adjacent thereto.

The second contact electrode CNE2 may connect the second electrode ELT2 and the second end portions EP2 of the light-emitting elements LD. In some embodiments, the second contact electrode CNE2 may stably fix the second end portions EP2 of the light-emitting elements LD. In another embodiment, when the second contact electrode CNE2 is not formed, the second end portions EP2 of the light-emitting elements LD may be disposed to overlap the second electrode ELT2 adjacent thereto and connected directly to the second electrode ELT2. In this case, the third insulating film INS3 may be at least partially removed.

In the embodiment of FIG. 6B, the second contact electrode CNE2 may also be disposed on the third electrode ELT3 and the first end portion EP1 of the second light-emitting element LD2 so as to overlap the third electrode ELT3 and the first end portion EP1 of at least one second light-emitting element LD2 adjacent thereto. As an example, the second contact electrode CNE2 may be disposed on the third electrode ELT3 and the first end portions EP1 of the second light-emitting elements LD2 so as to overlap the third electrode ELT3 and the first end portions EP1 of the plurality of second light-emitting element LD2 adjacent thereto.

The second contact electrode CNE2 may connect the third electrode ELT3 and the first end portions EP1 of the second light-emitting elements LD2. In some embodiments, the second contact electrode CNE2 may stably fix the first end portions EP1 of the second light-emitting elements LD2. In another embodiment, when the second contact electrode CNE2 is not formed, the second end portions EP2 of the second light-emitting elements LD2 may be disposed to overlap the third electrode ELT3 adjacent thereto and connected directly to the third electrode ELT3. In this case, the third insulating film INS3 may be at least partially removed.

The third contact electrode CNE3 may be disposed on the fourth electrode ELT4 and the second end portions EP2 of the second light-emitting elements LD2 so as to overlap the fourth electrode ELT4 and the second end portions EP2 of the plurality of second light-emitting element LD2 adjacent thereto. As an example, the third contact electrode CNE3 may be disposed on the fourth electrode ELT4 and the second end portions EP2 of the second light-emitting elements LD2 so as to overlap the fourth electrode ELT4 and the second end portions EP2 of the plurality of second light-emitting element LD2 adjacent thereto.

The third contact electrode CNE3 may connect the fourth electrode ELT4 to the second end portions EP2 of the second light-emitting elements LD2. In some embodiments, the third contact electrode CNE3 may stably fix the second end portions EP2 of the second light-emitting elements LD2. In another embodiment, when the third contact electrode CNE3 is not formed, the second end portions EP2 of the second light-emitting elements LD2 may be disposed to overlap the fourth electrode ELT4 adjacent thereto and connected directly to the fourth electrode ELT4. In this case, the third insulating film INS3 may be at least partially removed.

The contact electrodes CNE may be made of various transparent conductive materials. As an example, the contact electrodes CNE may include at least one selected from various transparent conductive materials such as ITO, IZO, ITZO, ZnO, AZO, GZO, ZTO, GTO, and FTO and may be implemented to be substantially transparent or semi-transparent so as to satisfy a transmittance (e.g. a set or predetermined transmittance). Accordingly, light emitted from the light-emitting elements LD through the first and second end portions EP1 and EP2 may pass through the contact electrodes CNE to be emitted to the outside of the pixel PXL.

In one embodiment, the contact electrodes CNE may be concurrently formed in the same process (e.g., formed at the same time in the same process). In this case, as illustrated in FIGS. 8A and 9, the contact electrodes CNE may be disposed at the same layer on the base layer BSL.

In another embodiment, one pair of contact electrodes CNE may be separated from each other with at least one insulating film interposed therebetween and may be sequentially formed. For example, as illustrated in FIG. 8B, the fourth insulating film INS4 may be disposed on the first contact electrode CNE1, and one end of the fourth insulating film INS4 may be interposed between the first contact electrode CNE1 and the second contact electrode CNE2. In this case, the first contact electrode CNE1, the fourth insulating film INS4, and the second contact electrode CNE2 may be sequentially formed.

An overcoat layer OC or the like may be disposed on the display layer DPL. The overcoat layer OC includes at least one inorganic insulating material and/or organic insulating material and may be formed as a single-layer or multi-layer.

In the above-described embodiments, each light-emitting element LD electrically connected in a forward direction between the first electrode ELT1 and the second electrode ELT2 may constitute an effective light source of a corresponding pixel PXL. The effective light sources may be clustered to constitute the light-emitting unit EMU of the pixel PXL.

In the present disclosure, the configuration and layout structure of the circuit layer PCL and/or the display layer DPL are not limited to the embodiments illustrated in FIGS. 6A-10 and may be variously changed. In addition, the circuit layer PCL and the display layer DPL may be designed to be related to each other or may be designed independently of each other to be designed to be connected through the first and second contact portions CNT1 and CNT2.

According to the above-described embodiments, the reflective film RFL may be under the light-emitting units EMU of the pixels PXL, thereby securing the front luminous efficiency of the pixels PXL. For example, because the front luminous efficiency of each pixel PXL can be secured without forming a protruding reflective partition around the light-emitting elements LD, it is possible to simplify a manufacturing process as compared with embodiments in which the protruding reflective partition is formed. In some embodiments, because a step difference due to the protruding reflective partition does not occur, a process of forming the light-emitting unit EMU may be facilitated.

FIGS. 11A-11K are cross-sectional views illustrating a method of manufacturing a display device according to one embodiment. For example, FIGS. 11A-11K sequentially illustrate manufacturing operations of a display device including the reflective film RFL according to the embodiments of FIGS. 6A-8. In FIGS. 11A-11K, cross-sections corresponding to the embodiment of FIG. 6A are illustrated, and the method of manufacturing a display device according to one embodiment of the present disclosure will be based on a method of forming a first insulating film INS1, the reflective film RFL, a second insulating film INS2, and a display layer DPL on a circuit layer PCL.

Referring to FIGS. 6A-11A, the circuit layer PCL is formed on a base layer BSL. For example, circuit elements of a corresponding pixel PXL and conductive patterns CDP connected to the circuit elements may be formed in each pixel area on the base layer BSL. The circuit layer PCL may be formed through a typical backplane process, and accordingly, detailed descriptions of a method of forming the circuit layer PCL will be omitted.

In some embodiments, the conductive patterns CDP to be connected to the display layer DPL in a subsequent process may be formed as a double-film including a metal film MTL and a transparent conductive film TCL. Accordingly, it is possible to prevent or protect the conductive patterns CDP from being damaged in a process of forming contact portions CNT on the conductive patterns CDP.

Figure 11A:
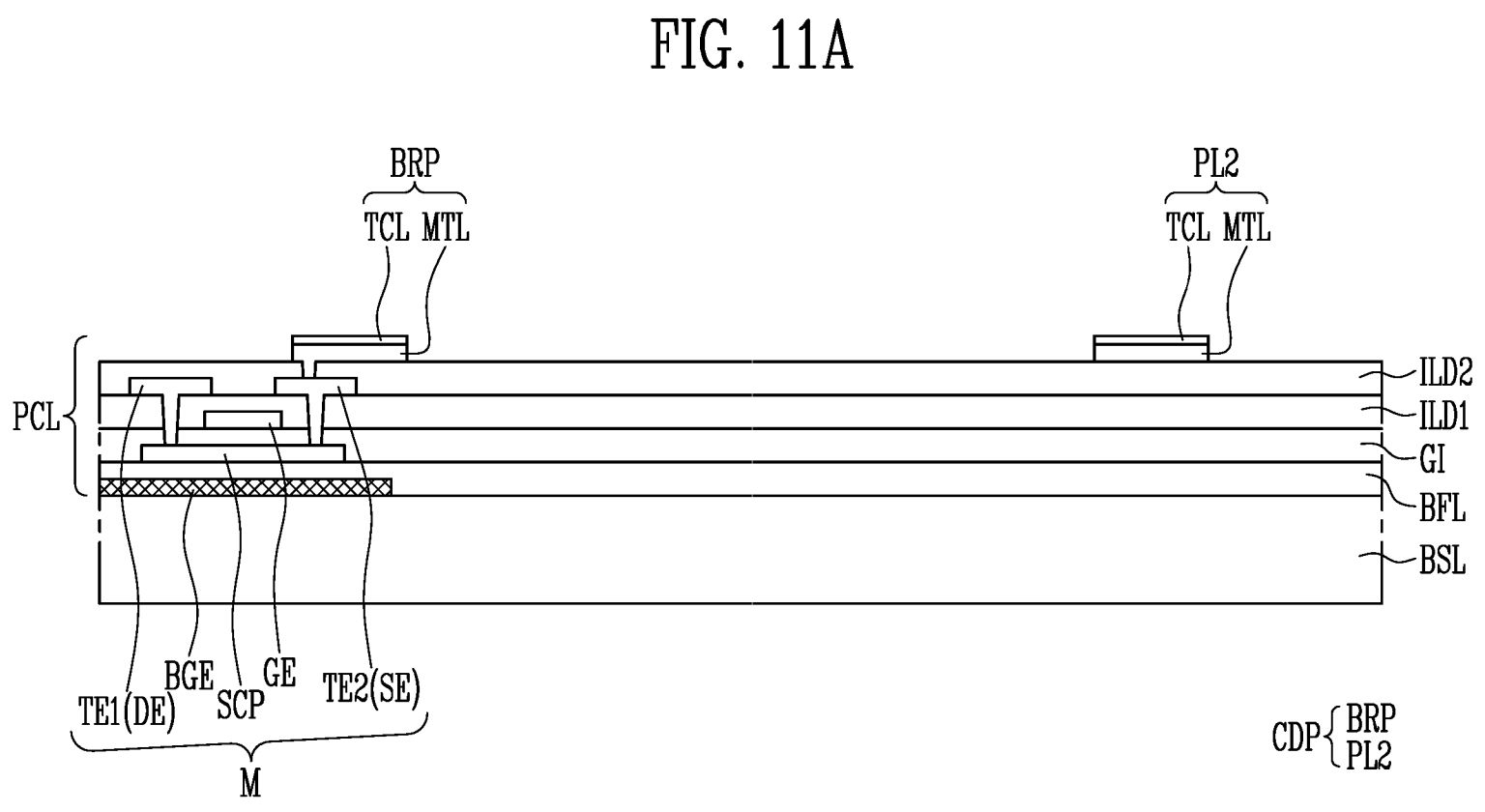
Figure 11B:
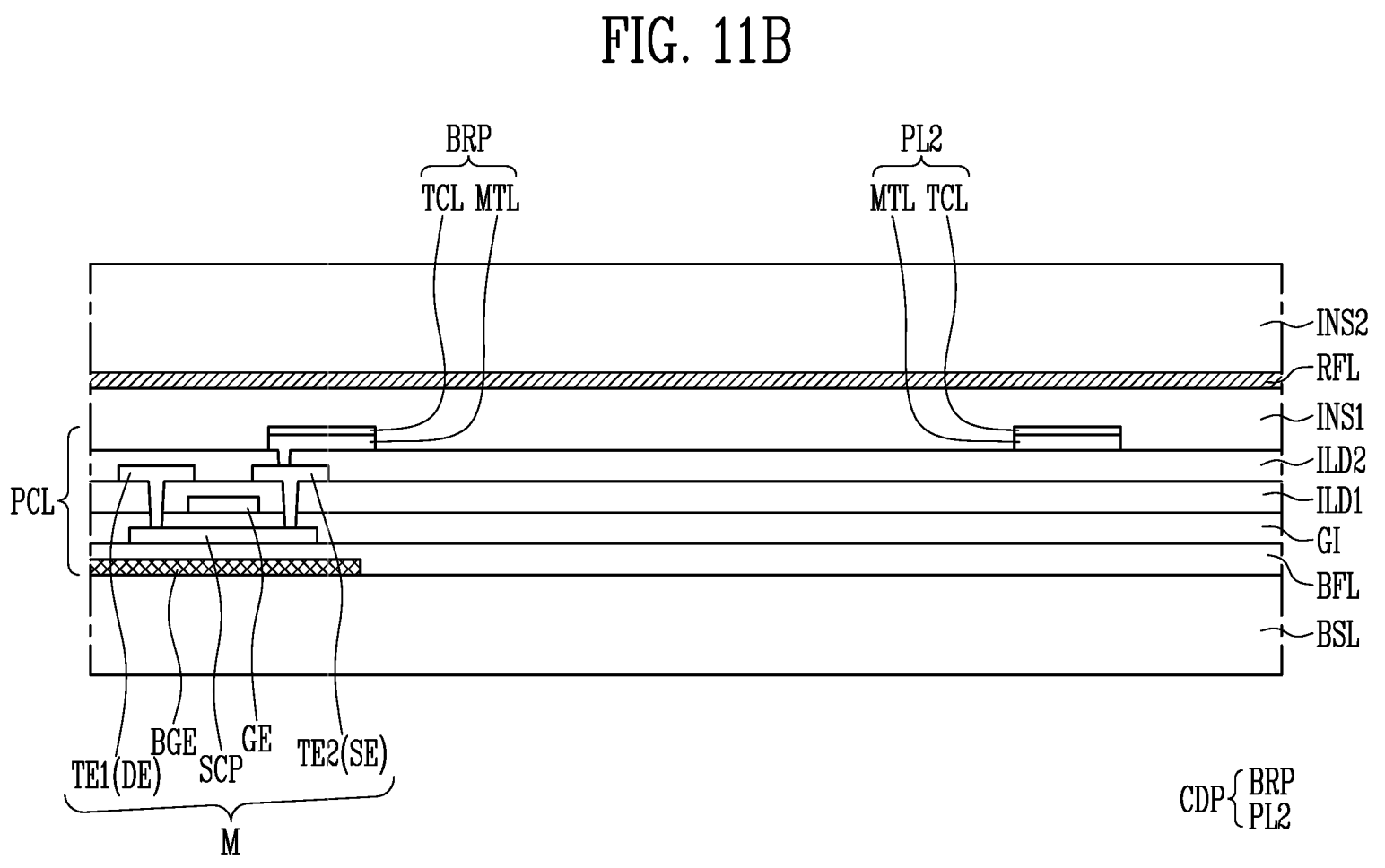

Referring to FIG. 11B, the first insulating film INS1, the reflective film RFL, and the second insulating film INS2 are sequentially formed on the circuit layer PCL. As an example, at least one layer of an insulating film including an inorganic and/or organic insulating material may be deposited on the circuit layer PCL to form the first insulating film INS1, and at least one layer of a metal film may be deposited on the first insulating film INS1 to form the reflective film RFL. The second insulating film INS2 may be formed by applying a photosensitive organic insulating material on the reflective film RFL. However, a material and/or method for forming each of the first insulating film INS1, the reflective film RFL, and the second insulating film INS2 are not limited thereto.

Figure 11C:
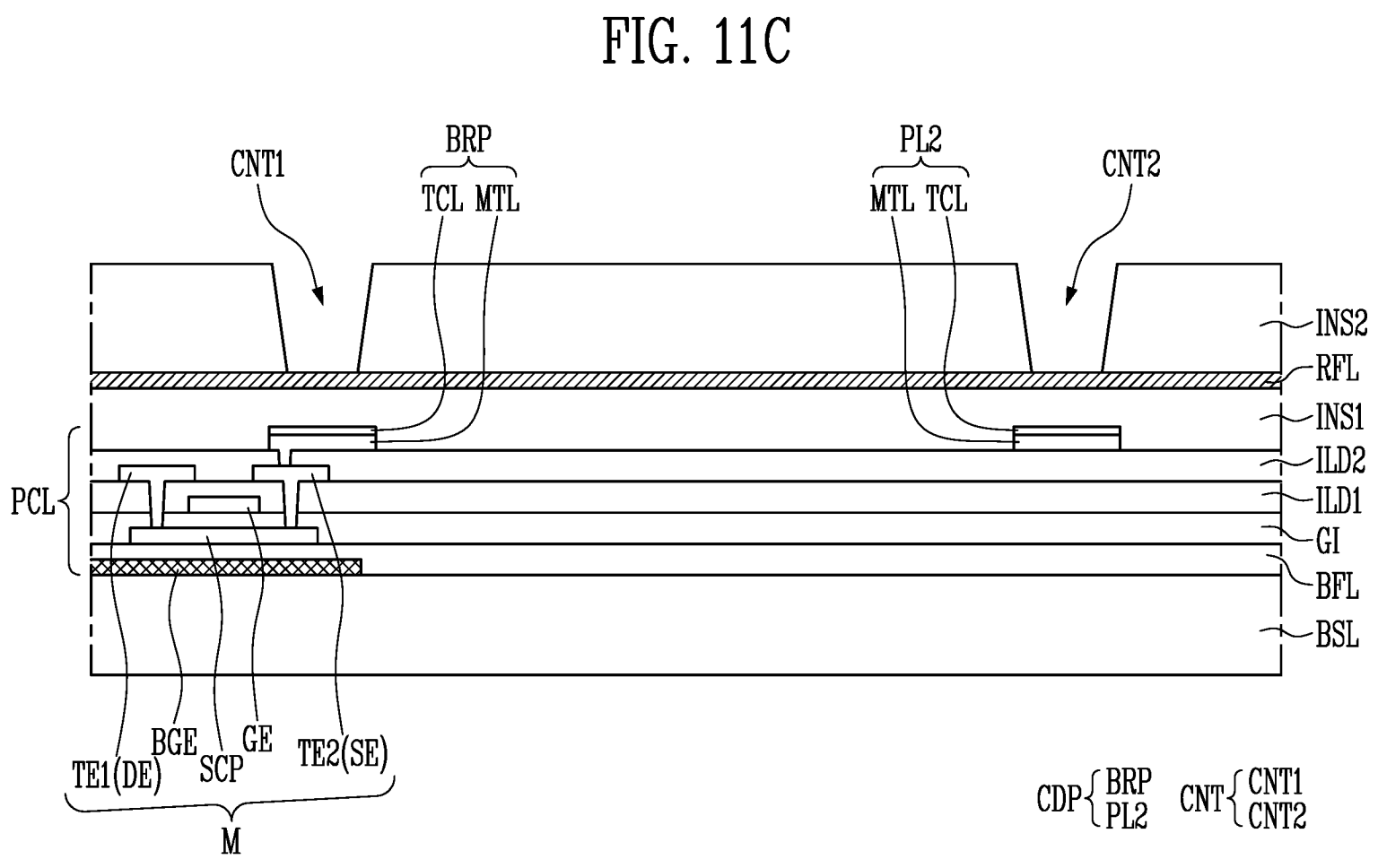

Referring to FIG. 11C, the second insulating film INS2 is etched such that the reflective film RFL is exposed in each of the contact portions CNT corresponding to the conductive patterns CDP (e.g., set or predetermined conductive patterns CDP) to be connected to the display layer DPL. As an example, the second insulating film INS2 may be etched through a photo process such that the reflective film RFL is exposed in a first contact portion CNT1 on a bridge pattern BRP and a second contact portion CNT2 on a second power line PL2. Thereafter, the second insulating film INS2 may be cured through soft baking.

Figure 11D:
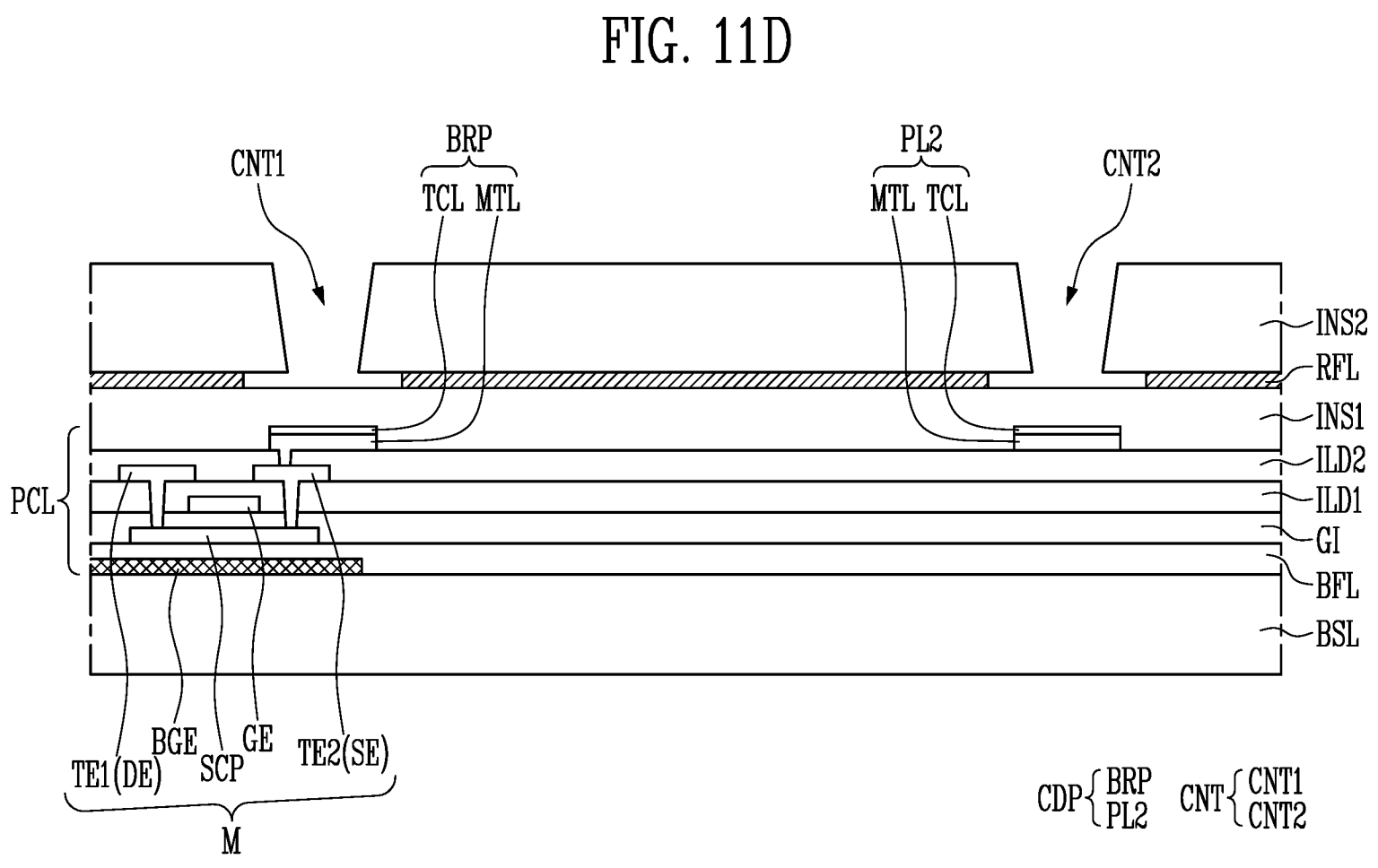
Figure 11E:
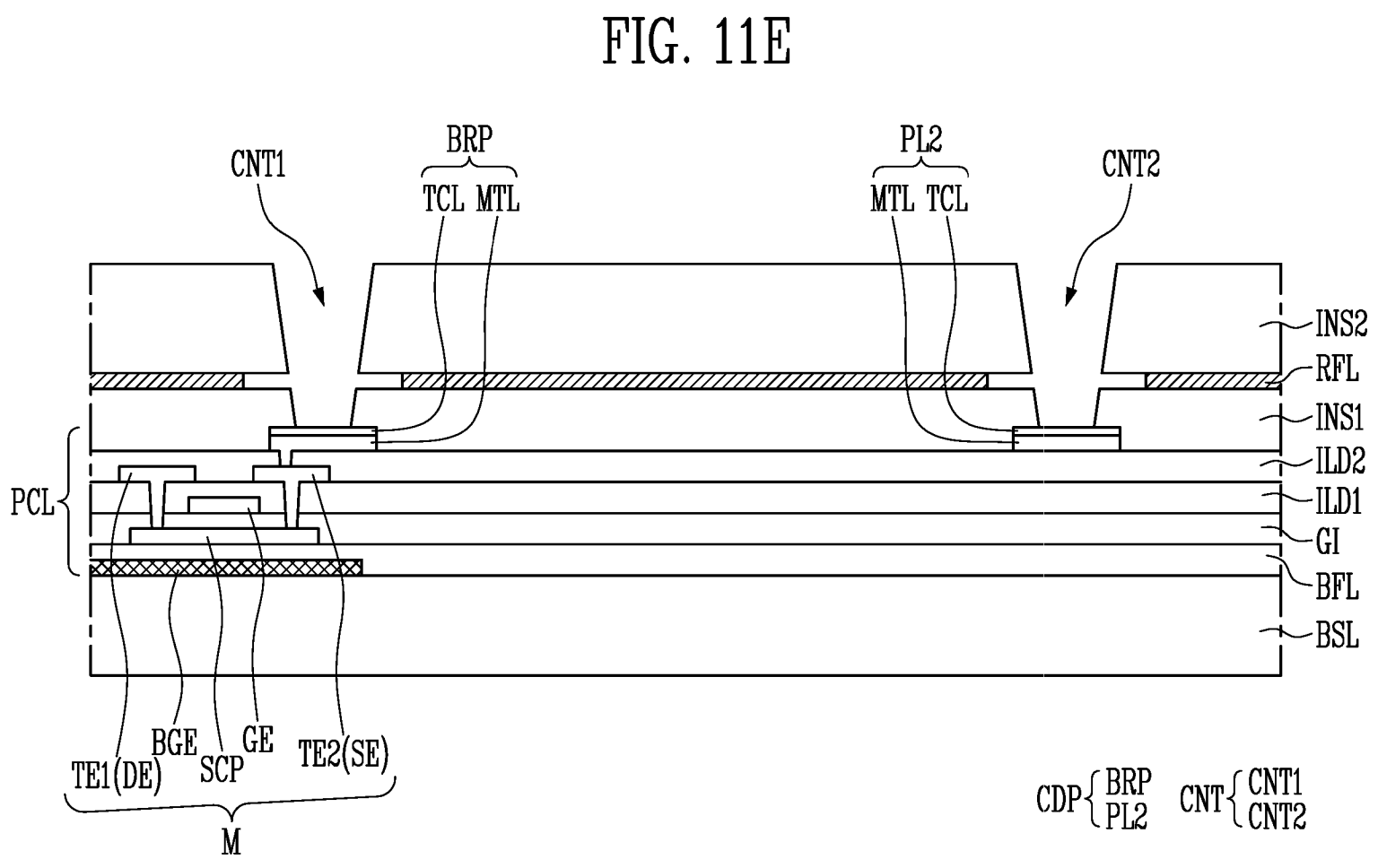

Referring to FIGS. 11D and 11E, by using the second insulating film INS2 as a mask, the reflective film RFL and the first insulating film INS1 are sequentially etched such that the conductive pattern CDP is exposed in each contact portion CNT. For example, the reflective film RFL and the first insulating film INS1 may be sequentially etched using the second insulating film INS2 as a mask.

The reflective film RFL may be opened in each contact portion CNT through wet etching using the second insulating film INS2 as a mask. The first insulating film INS1 may be opened in each contact portion CNT through dry etching using the second insulating film INS2 as a mask.

In this case, the reflective film RFL may be over-etched to be opened wider than the first insulating film INS1 and the second insulating film INS2 in each contact portion CNT. Accordingly, it is possible to prevent short circuit defects from occurring due to the reflective film RFL being in contact with a first electrode ELT1 or a second electrode ELT2 to be formed in a subsequent process.

Figure 11F:
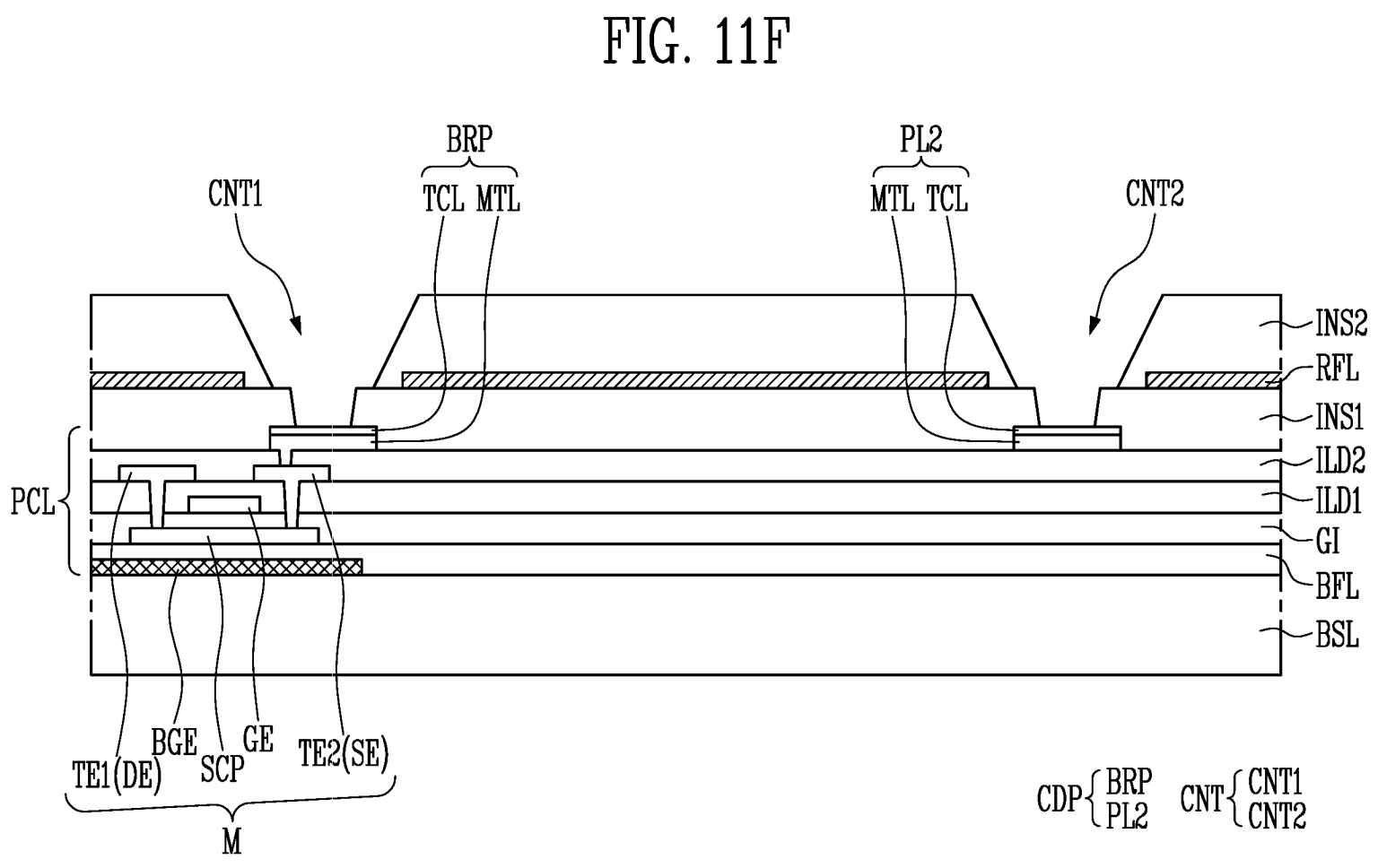

Referring to FIG. 11F, a reflow process is performed on the second insulating film INS2 such that a periphery (e.g., circumference) of the reflective film RFL exposed in each contact portion CNT is covered with the second insulating film INS2. For example, after an etching process of the reflective film RFL and the first insulating film INS1, the second insulating film INS2 may be cured through hard baking. In such a process, the periphery (e.g., circumference) of the reflective film RFL exposed in each contact portion CNT may be completely covered with the second insulating film INS2 by using a reflow phenomenon of the second insulating film INS2

Referring to FIGS. 11G-11K, the display layer DPL connected to each conductive pattern CDP through each contact portion CNT is formed on the second insulating film INS2.

Figure 11G:
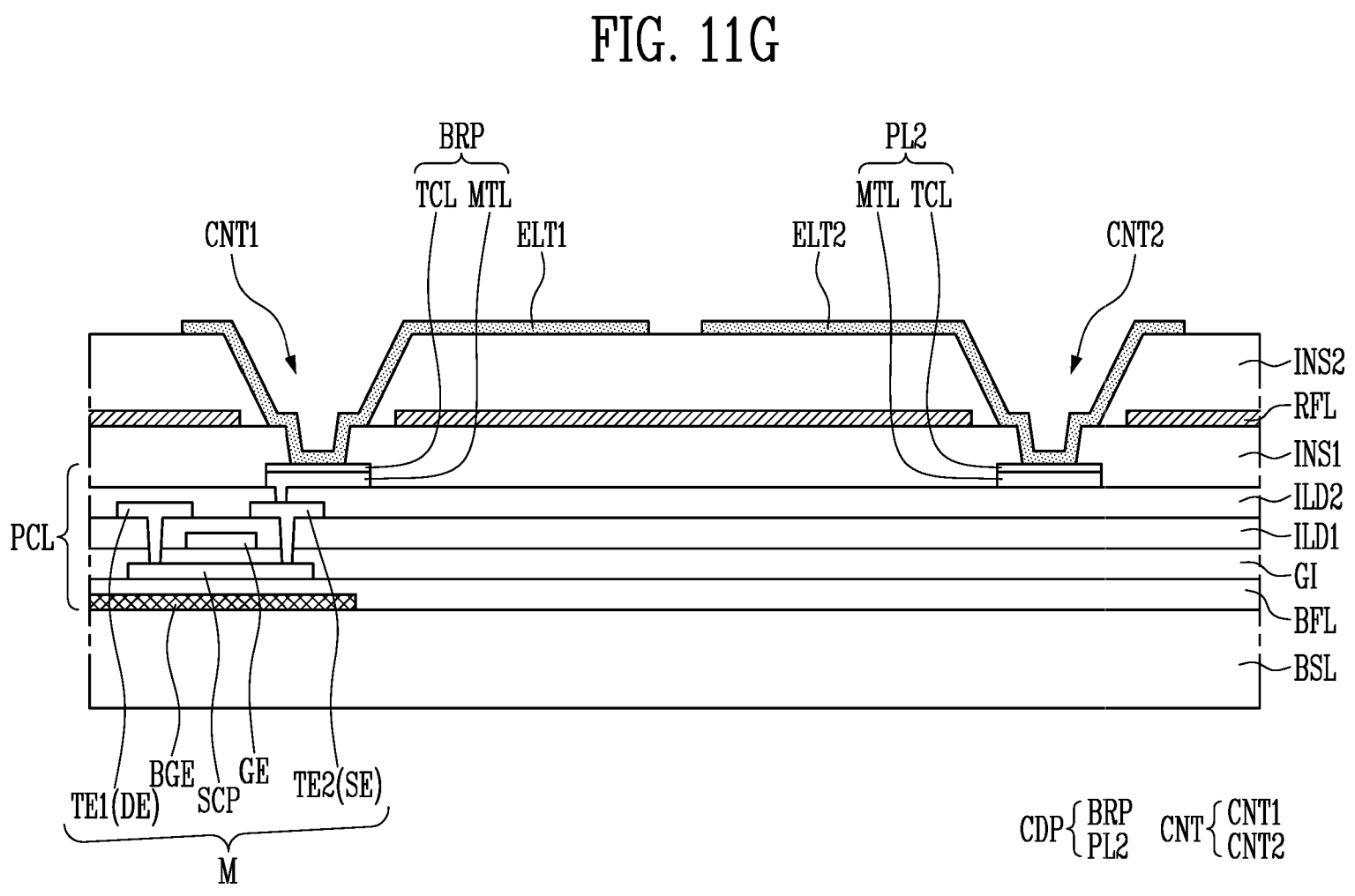

For example, as illustrated in FIG. 11G, pixel electrodes, for example, a first electrode ELT1 and a second electrode ELT2 may be formed in each pixel area on the second insulating film INS2. For example, a transparent conductive film may be formed on the second insulating film INS2 and then may be etched to form the first electrode ELT1 and the second electrode ELT2 of each pixel PXL. In this case, the first and second electrodes ELT1 and ELT2 may be formed such that the first electrode ELT1 is connected to the bridge pattern BRP through the first contact portion CNT1, and the second electrode ELT2 is connected to a second power line PL2 through the second contact portion CNT2. When the first and second electrodes ELT1 and ELT2 are formed using a transparent conductive material, there is an advantage in that a fine pattern can be elaborately formed.

Figure 11H:
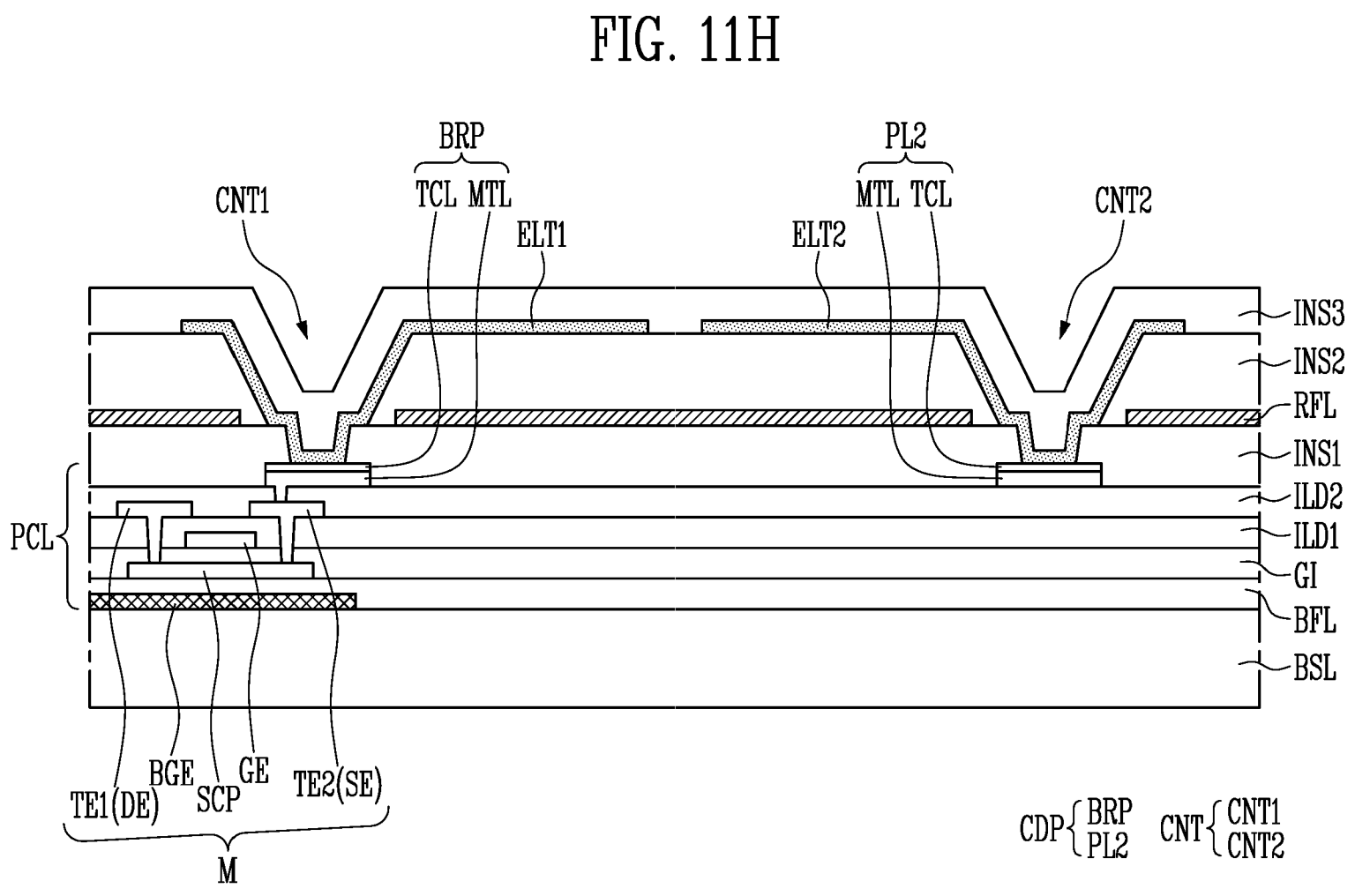

Thereafter, as illustrated in FIG. 11H, a third insulating film INS3 including at least one layer of an organic film and/or inorganic layer may be formed on one surface of the base layer BSL including the first and second electrodes ELT1 and ELT2.

Figure 11I:
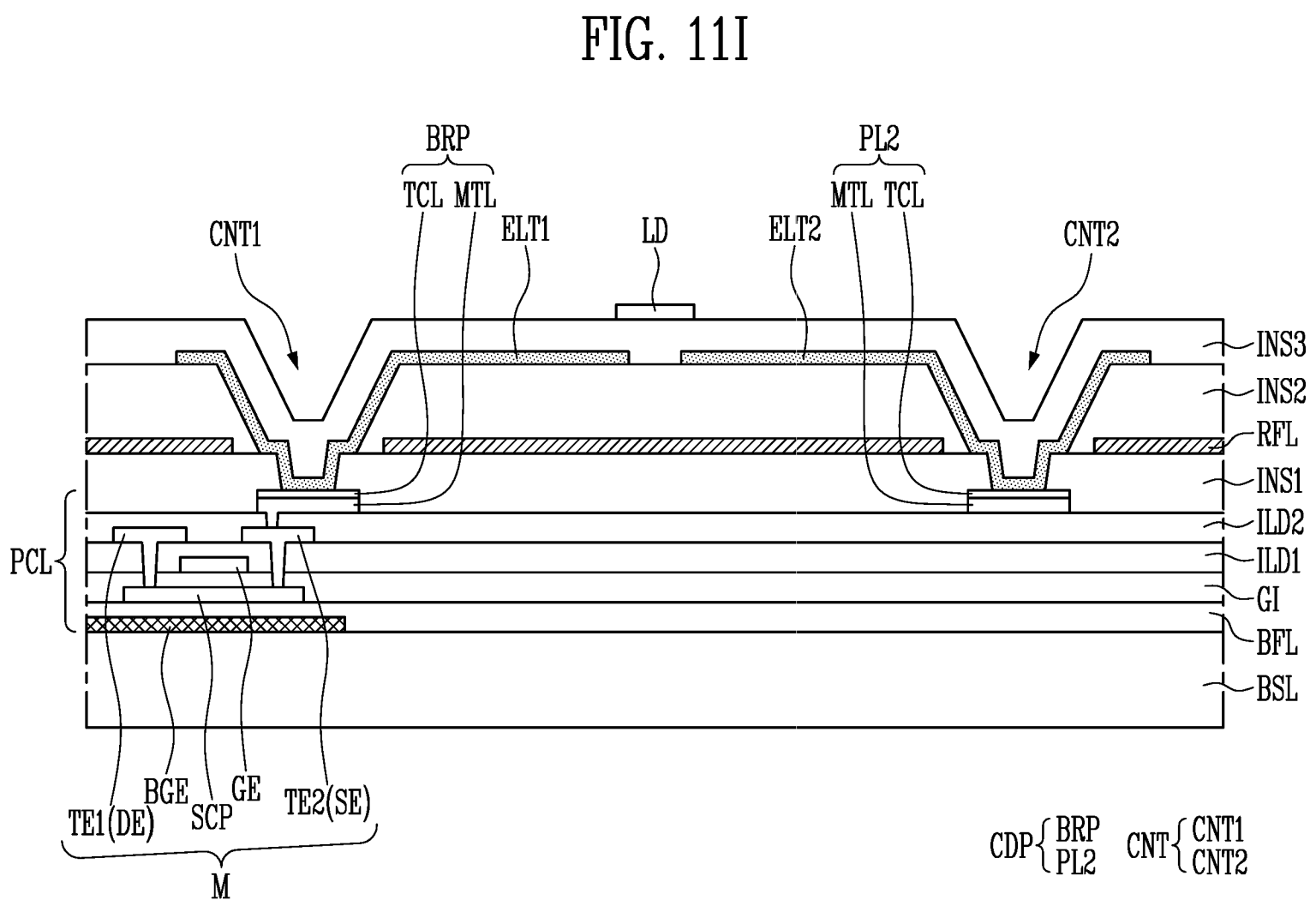

Thereafter, as illustrated in FIG. 11I, light-emitting elements LD (for example, a plurality of light-emitting elements LD) may be supplied to each pixel area on the third insulating film INS3, and an electric field may be formed between the first electrode ELT1 and the second electrode ELT2. Accordingly, the light-emitting elements LD may be aligned between the first electrode ELT1 and the second electrode ELT2.

Figure 11J:
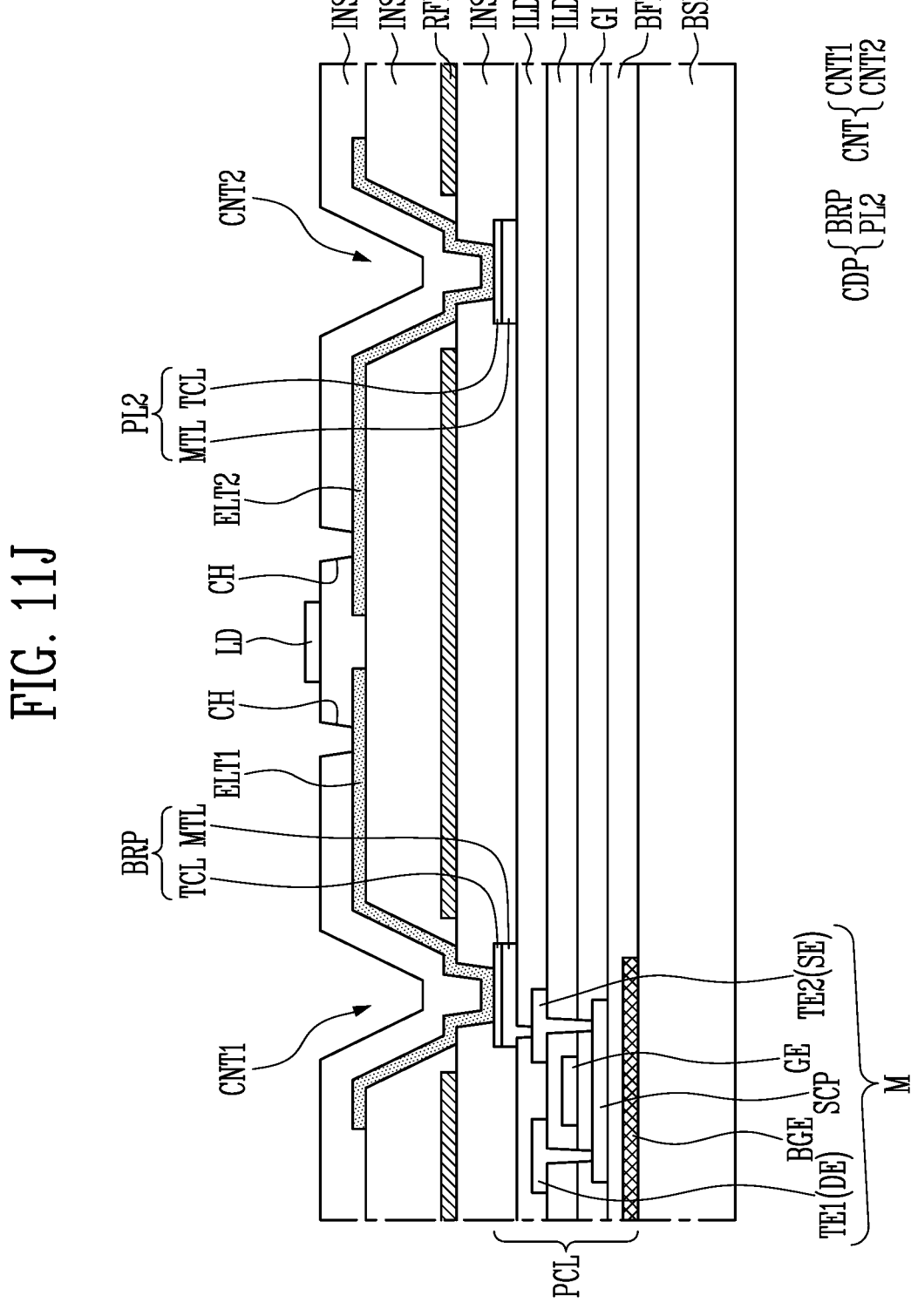
Figure 11K:
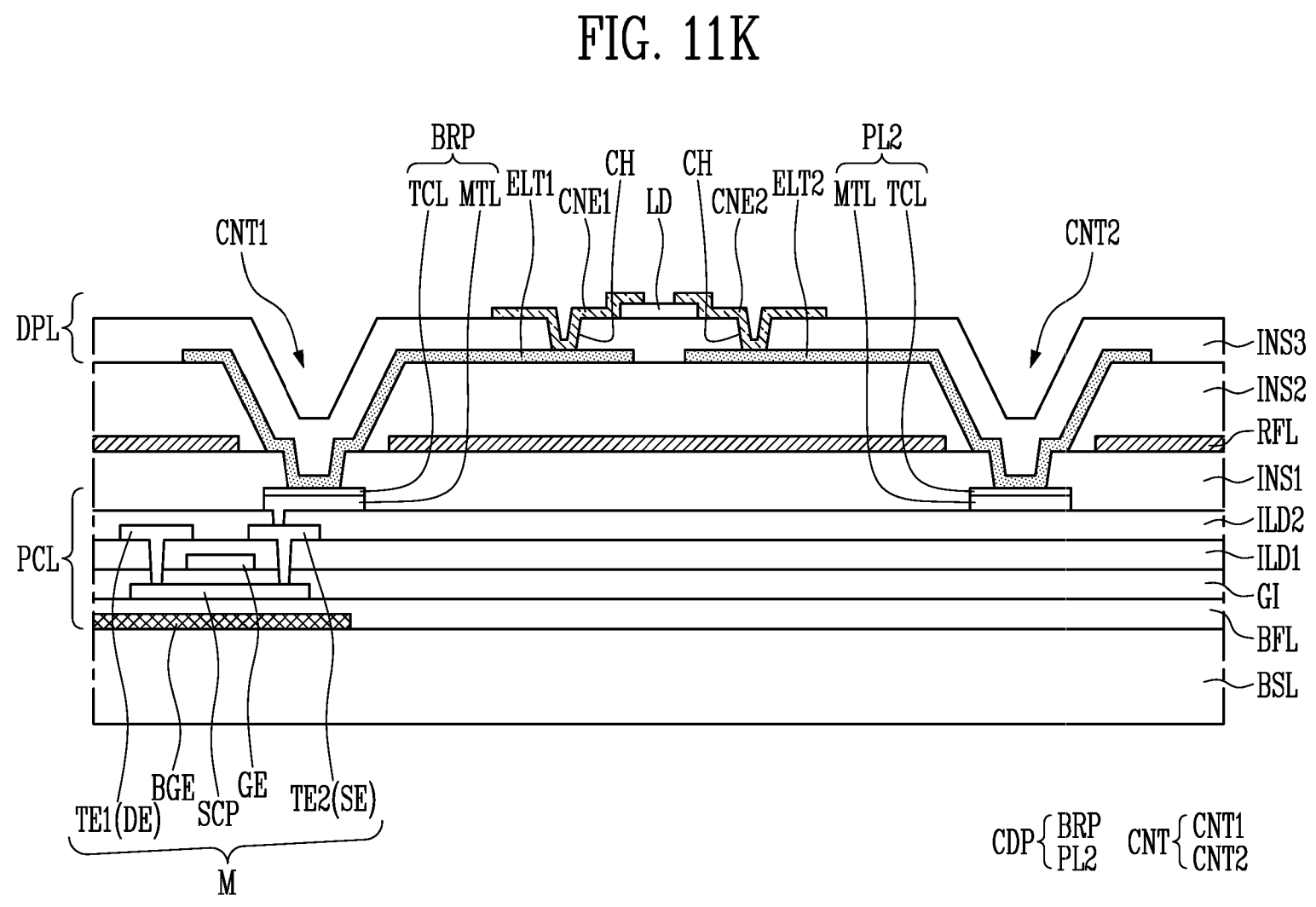

Thereafter, as illustrated in FIGS. 11J and 11K, contact electrodes CNE, for example, first and second contact electrodes CNE1 and CNE2, may be formed to connect the light-emitting-elements LD between the first electrode ELT1 and the second electrode ELT2. For example, as illustrated in FIG. 11J, the third insulating film INS3 may etched to expose one area of each of the first and second electrodes ELT1 and ELT2 to form contact holes CH corresponding to the first and second electrodes ELT1 and ELT2. Thereafter, as illustrated in FIG. 11K, the first contact electrode CNE1 and the second contact electrode CNE2 connected to the first electrode ELT1 and the second electrode ELT2 through the contact holes CH may be formed on the third insulating film INS3.

In some embodiments, when the pixel PXL according to the embodiment of FIG. 8B is to be formed, the first contact electrode CNE1, a fourth insulating film INS4, and the second contact electrode CNE2 may be sequentially formed to connect the light-emitting elements LD between the first electrode ELT1 and the second electrode ELT2.

After the display layer DPL including the first and second electrodes ELT1 and ELT2, the light-emitting elements LD, and the first and second contact electrodes CNE1 and CNE2 are formed, the overcoat layer OC of FIG. 8A may be formed on the display layer DPL.

Figure 12:
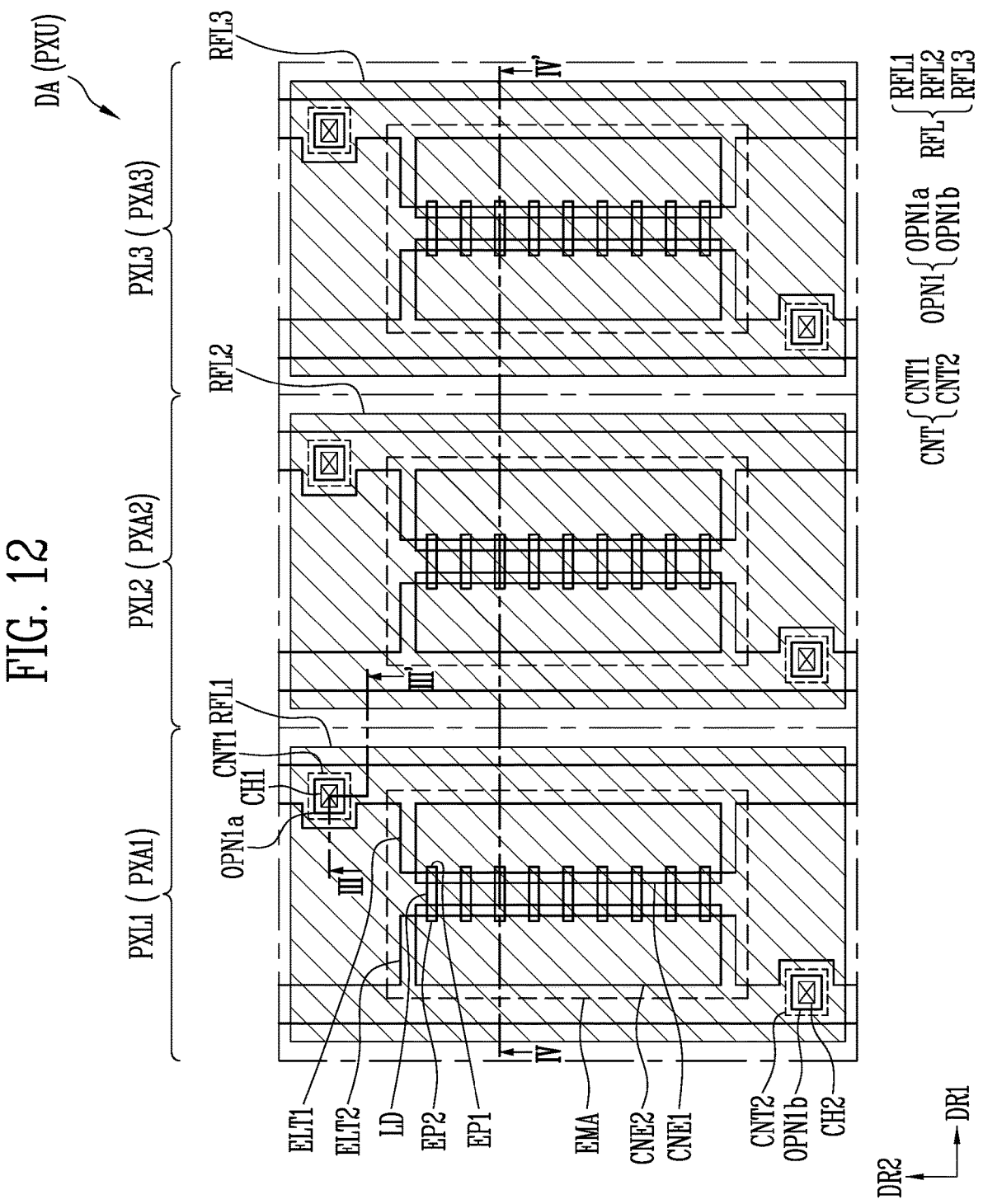
FIG. 12 is a plan view illustrating a display area according to one embodiment of the present disclosure.
Figure 13:
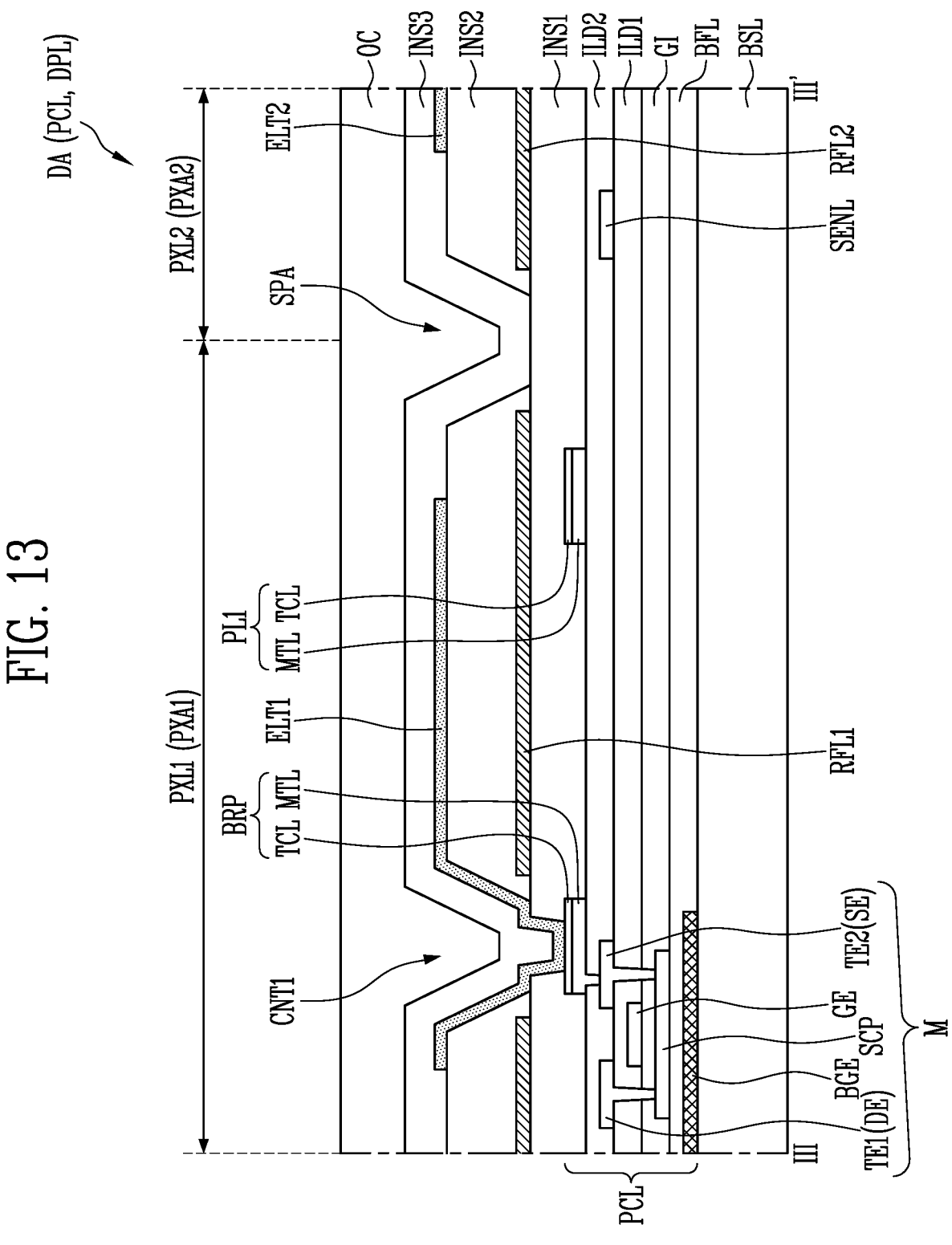
FIG. 13 is a cross-sectional view illustrating the display area according to one embodiment of the present disclosure.

FIG. 12 is a plan view illustrating a display area DA according to one embodiment of the present disclosure. For example, as compared to FIG. 7, FIG. 12 illustrates a different embodiment of a reflective film RFL. FIG. 13 is a cross-sectional view illustrating the display area DA according to one embodiment of the present disclosure. For example, FIG. 13 illustrates an embodiment of a cross section taken along the line III to III' of FIG. 12. In the embodiments of FIGS. 12 and 13, components similar or identical to those of the embodiments of FIGS. 6A-10 are denoted by the same reference numerals, and detailed descriptions thereof will be omitted.

Referring to FIGS. 12 and 13, a reflective film RFL may be divided into a plurality of division patterns in a display area DA. For example, the reflective film RFL may include the plurality of division patterns disconnected in a peripheral area of a pixel area and separated from each other. As an example, a first reflective film pattern RFL1, a second reflective film pattern RFL2, and a third reflective film pattern RFL3 may be respectively disposed in a first pixel area PXA1 in which a first color pixel PXL1 is formed, a second pixel area PXA2 in which a second color pixel PXL2 is formed, and a third pixel area PXA3 in which a third color pixel PXL3 is formed, and the first to third reflective film patterns RFL1, RFL2, and RFL3 may be separated from each other. To this end, the reflective film RFL may be etched in a separation area SPA (e.g., a set predetermined separation area SPA) defined between adjacent pixels PXL (for example, between the first color pixel PXL1 and the second color pixel PXL2 and thus may be separated into the plurality of division patterns.

The size and position of the separation area SPA may be variously changed according to embodiments. For example, each division pattern may be disposed to overlap or not overlap one or more lines (for example, a first power line PL1 and/or a sensing line SENL) disposed in a peripheral area of each pixel PXL.

In one embodiment, other conductive patterns disposed at the same layer as the conductive patterns CDP positioned in the contact portions CNT may have substantially the same or similar cross-sectional structure as the conductive patterns CDP. For example, like a bridge pattern BRP, the first power line PL1 may include a metal film MTL and a transparent conductive film TCL. In another embodiment, only the conductive patterns CDP disposed in the contact portions CNT may be formed as a multi-layer, and the remaining conductive patterns disposed at the same layer may be formed as a single-layer.

As in the above-described embodiment, when the reflective film RFL is separated into the plurality of division patterns, the deformation of a display panel PNL (see FIG. 3) can be prevented or reduced. For example, even when the reflective film RFL is deformed by heat applied to the reflective film RFL in a subsequent process, it is possible to prevent the display panel PNL from bending due to the deformation of the reflective film RFL.

FIGS. 14A-14G are cross-sectional views illustrating a method of manufacturing a display device according to one embodiment. For example, FIGS. 14A-14G sequentially illustrate manufacturing operations of the display device according to the embodiment of FIGS. 12 and 13. In the embodiments of FIGS. 14A-14G, detailed descriptions of components similar or identical to those of the embodiments of FIGS. 11A-11K will be omitted.

Referring to FIGS. 12-14A, a circuit layer PCL, a first insulating film INS1, a reflective film RFL, and a second insulating film INS2 are sequentially formed on a base layer BSL.

Figure 14A:
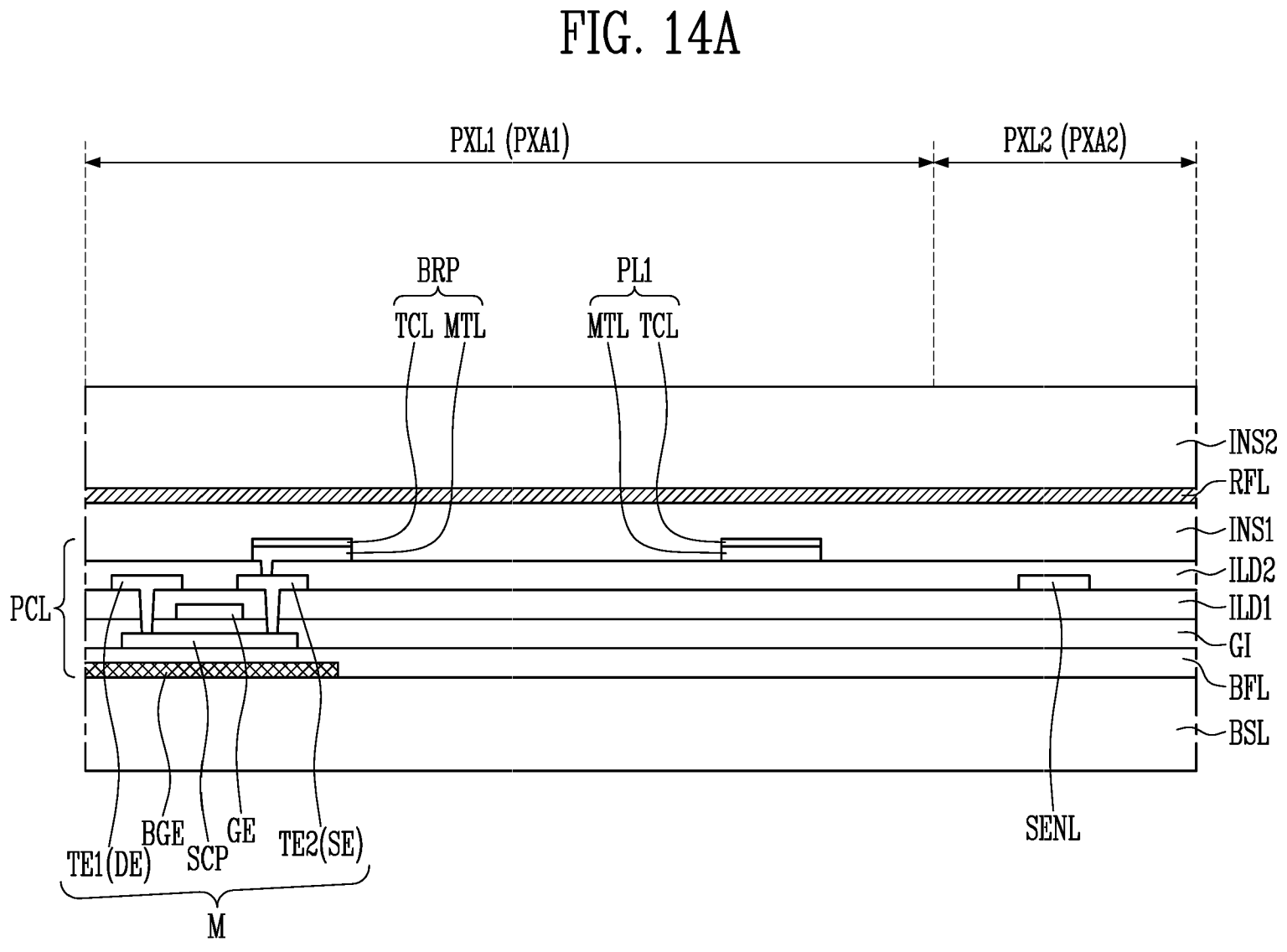
Figure 14B:
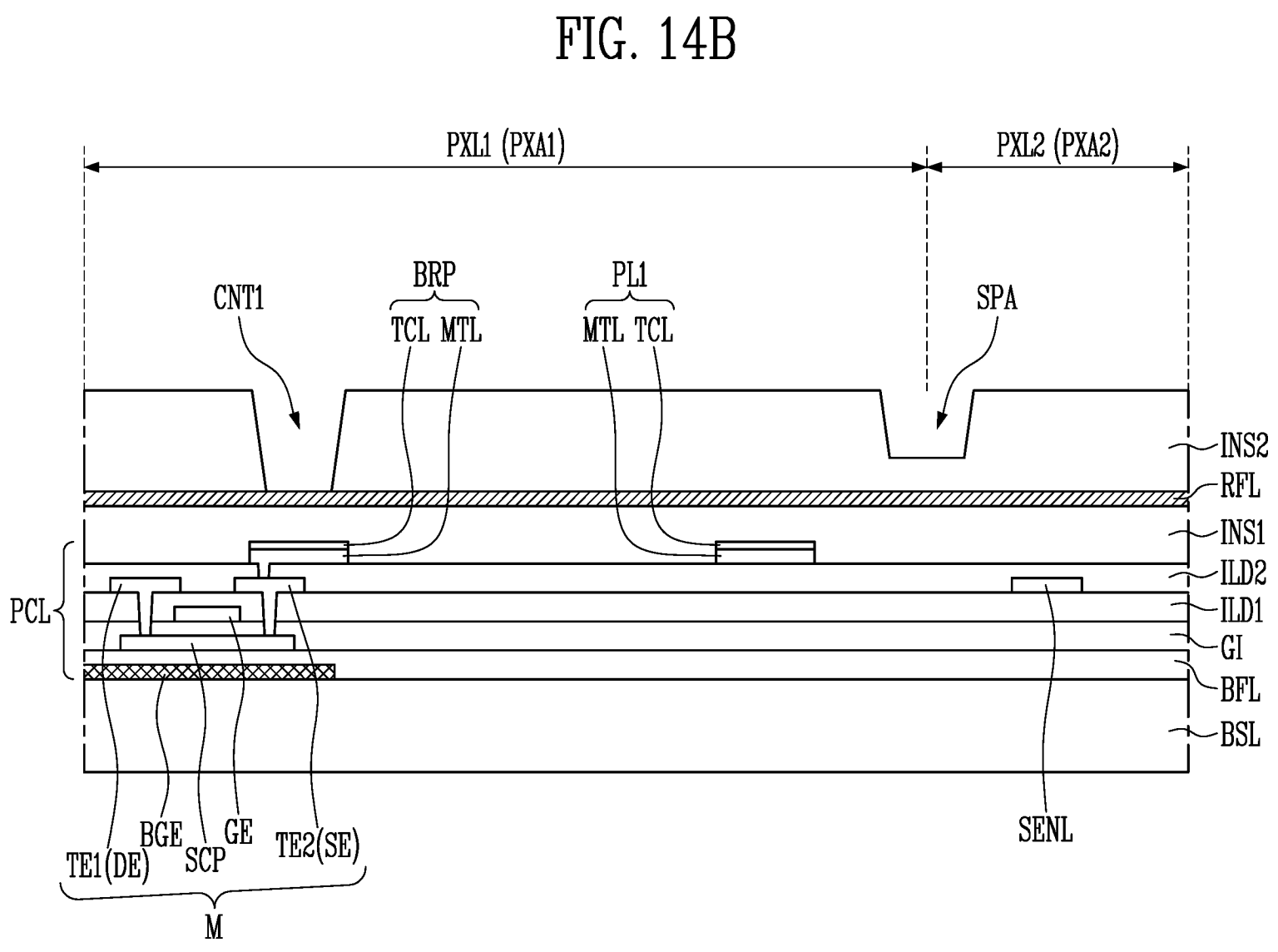

Referring to FIG. 14B, by using a halftone mask, the second insulating film INS2 is etched in each of separation areas SPA corresponding to each contact portion CNT including a first contact portion CNT1 on a bridge pattern BRP, a peripheral area of each pixel PXL, and/or an area between adjacent pixels PXL. For example, the second insulating film INS2 may be etched by the entire thickness thereof such that the reflective film RFL is exposed in each contact portion CNT, and the second insulating film INS2 may be etched by only a partial thickness thereof such that the reflective film RFL is not exposed in each separation area SPA. Thereafter, the second insulating film INS2 may be cured through soft baking.

Figure 14C:
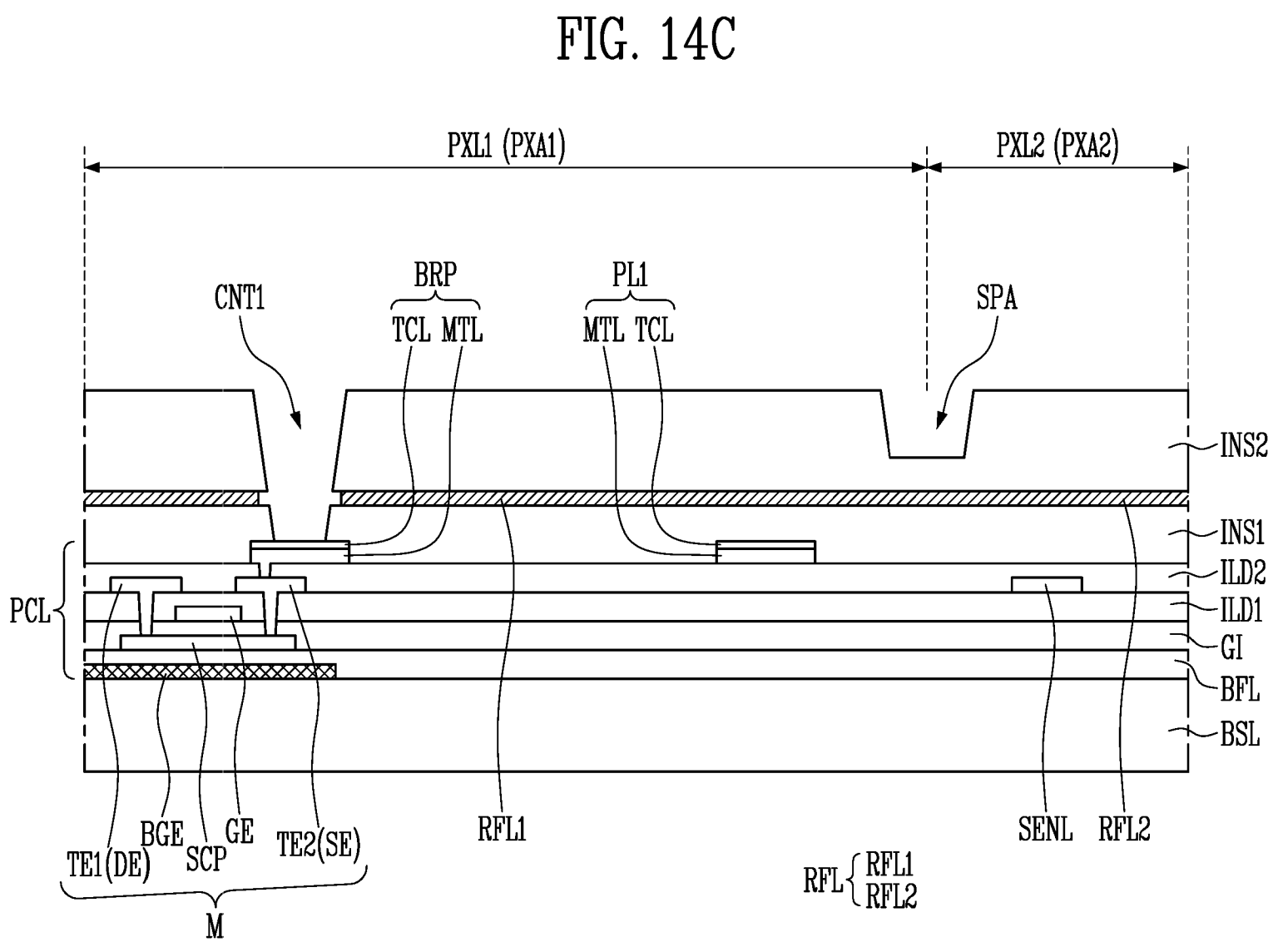

Referring to FIG. 14C, by using the second insulating film INS2 as a mask, the reflective film RFL and the first insulating film INS1 are sequentially etched such that a conductive pattern CDP is exposed in each contact portion CNT. In this case, the reflective film RFL may be over-etched to be opened wider than the first insulating film INS1 and the second insulating film INS2 in each contact portion CNT.

Figure 14D:
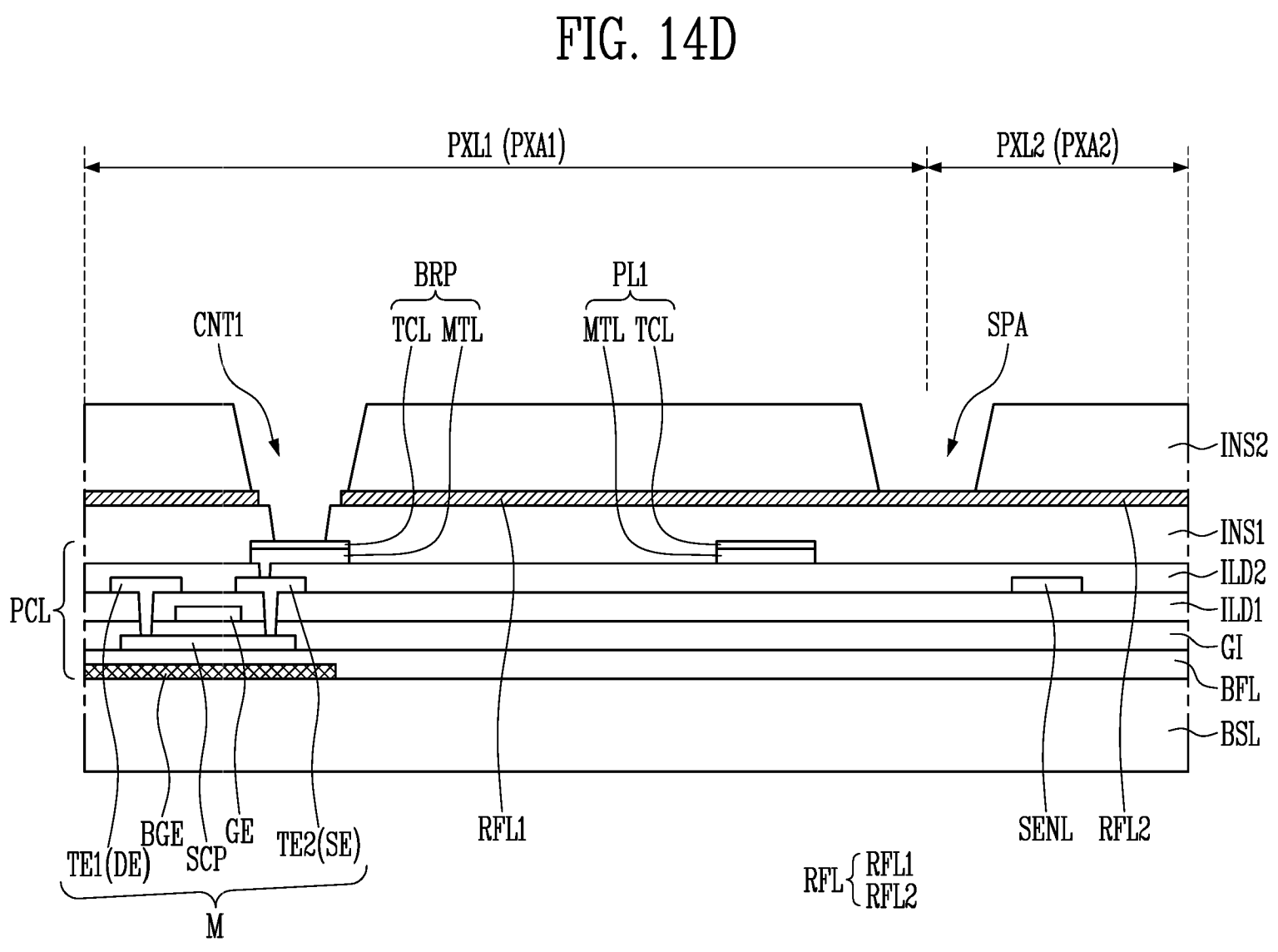

Referring to FIG. 14D, an ashing process is performed on the second insulating film INS2 to expose a peripheral area around an opening of the reflective film RFL (the first opening OPN1 of FIG. 8) in each contact portion CNT and also concurrently expose the reflective film RFL in the separation area SPA at the same time.

Figure 14E:
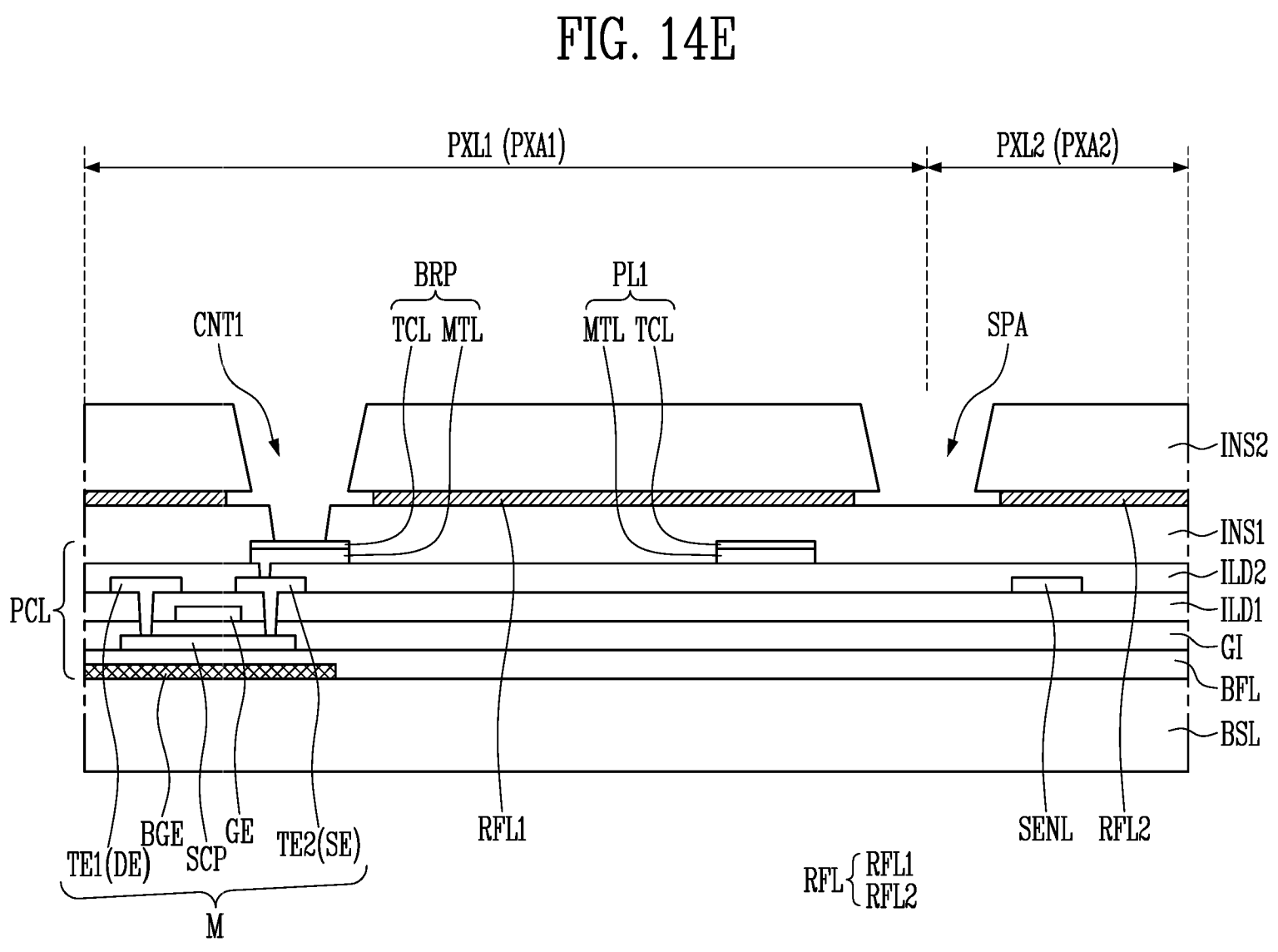

Referring to FIG. 14E, the reflective film RFL is secondarily etched using the second insulating film INS2 as a mask. For example, through wet etching using the second insulating film INS2 as a mask, the reflective film RFL in each contact portion CNT is opened to be wider than the ashed second insulating film INS2, and concurrently, the reflective film RFL is secondarily etched to be disconnected in each separation area SPA.

Figure 14F:
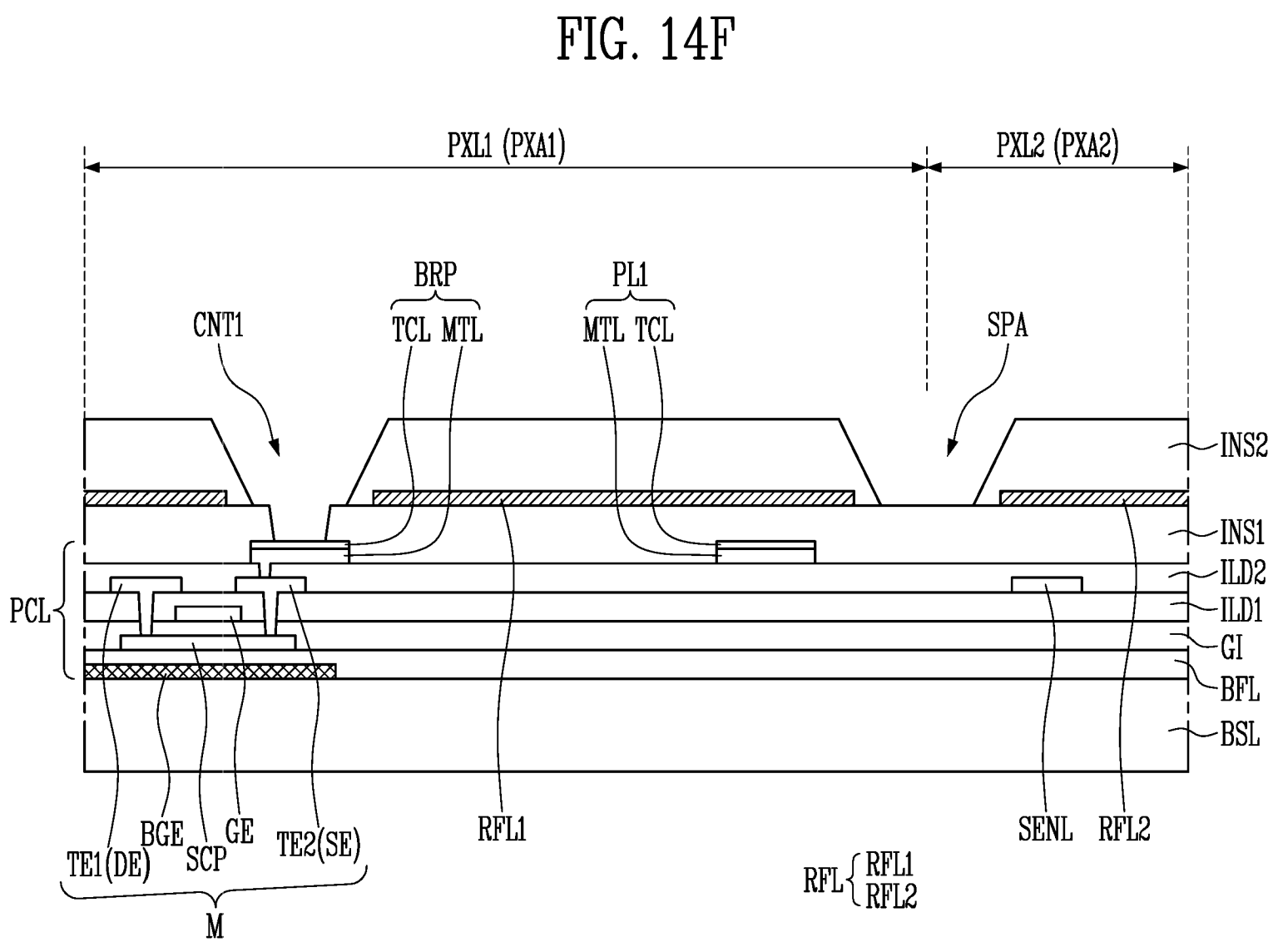

Referring to FIG. 14F, a reflow process is performed on the second insulating film INS2 such that the peripheries of the reflective film RFL exposed in each contact portion CNT and the separation area SPA is covered with the second insulating film INS2.

Figure 14G:
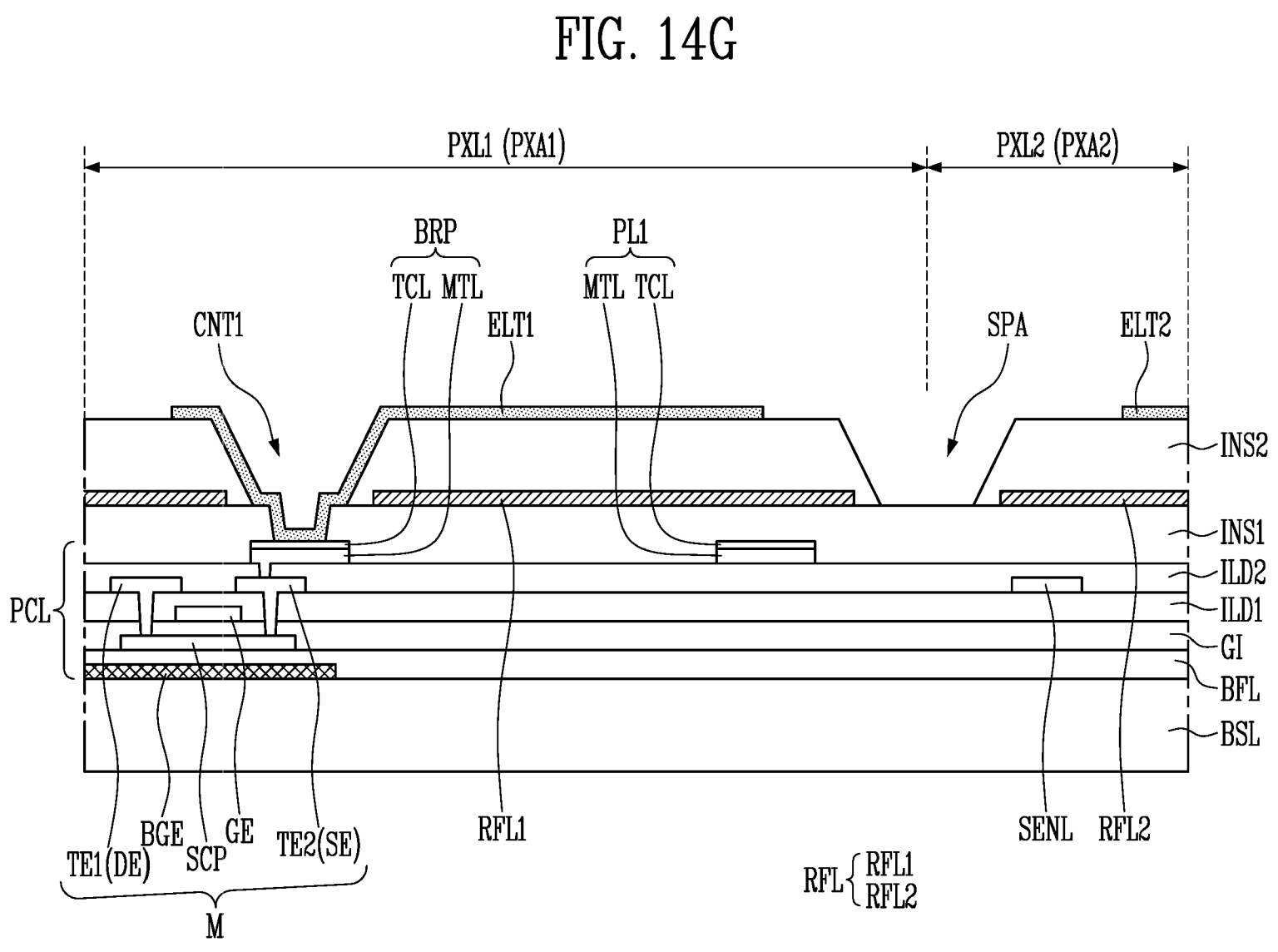

Referring to FIG. 14G, pixel electrodes including a first electrode ELT1 and a second electrode ELT2 are formed in each pixel area on the second insulating film INS2. Thereafter, as illustrated in FIGS. 11H-11K, a process of forming a third insulating film INS3, a process of supplying and aligning light-emitting elements LD, and a process of forming contact electrodes CNE are sequentially performed, thereby forming a display layer DPL.

According to various embodiments of the present disclosure as described above, the reflective film RFL is disposed under light-emitting units EMU of the pixels PXL. Accordingly, it is possible to secure the front luminous efficiency of the pixels PXL. For example, without forming protruding reflective partition wall around the light-emitting elements LD, it is possible to secure the front luminous efficiency of the pixels PXL.

Further, according to embodiments of the present disclosure, in forming respective contact portions CNT for connections between the circuit layer PCL and the display layer DPL in respective pixels PXL, the reflective film RFL and the first insulating film INS1 under the reflective film RFL are sequentially etched using the second insulating film INS2 disposed on the reflective film RFL as a mask. Accordingly, the number of masks required to form the pixels PXL can be reduced. In some embodiments, after etching the reflective film RFL and the first insulating film INS1, a reflow process is performed on the second insulating film INS2 to cover the periphery of the reflective film RFL, thereby preventing short circuit defect due to the reflective film RFL.

According to some embodiments of the present disclosure, the conductive pattern CDP, which is connected to a corresponding light-emitting unit EMU through a corresponding contact portion CNT, is formed as a multi-layer including a metal film MTL and a transparent conductive film TCL thereon, thereby preventing damage to the conductive pattern CDP exposed in the contact portion CNT while an etching process is performed on the reflective film RFL or the like.

According to one embodiment of the present disclosure, the reflective film RFL is disconnected in a peripheral area of each pixel area in addition to the contact portions CNT, thereby preventing the display panel PNL from being deformed in a subsequent process.

That is, according to the embodiments of the present disclosure, it is possible to secure the front luminous efficiency of each of the pixels PXL including respective light-emitting elements LD, it is possible to improve a manufacturing efficiency by reducing the number of masks, and it is possible to secure the electrical stability of the contact portions CNT.

Figure 15:
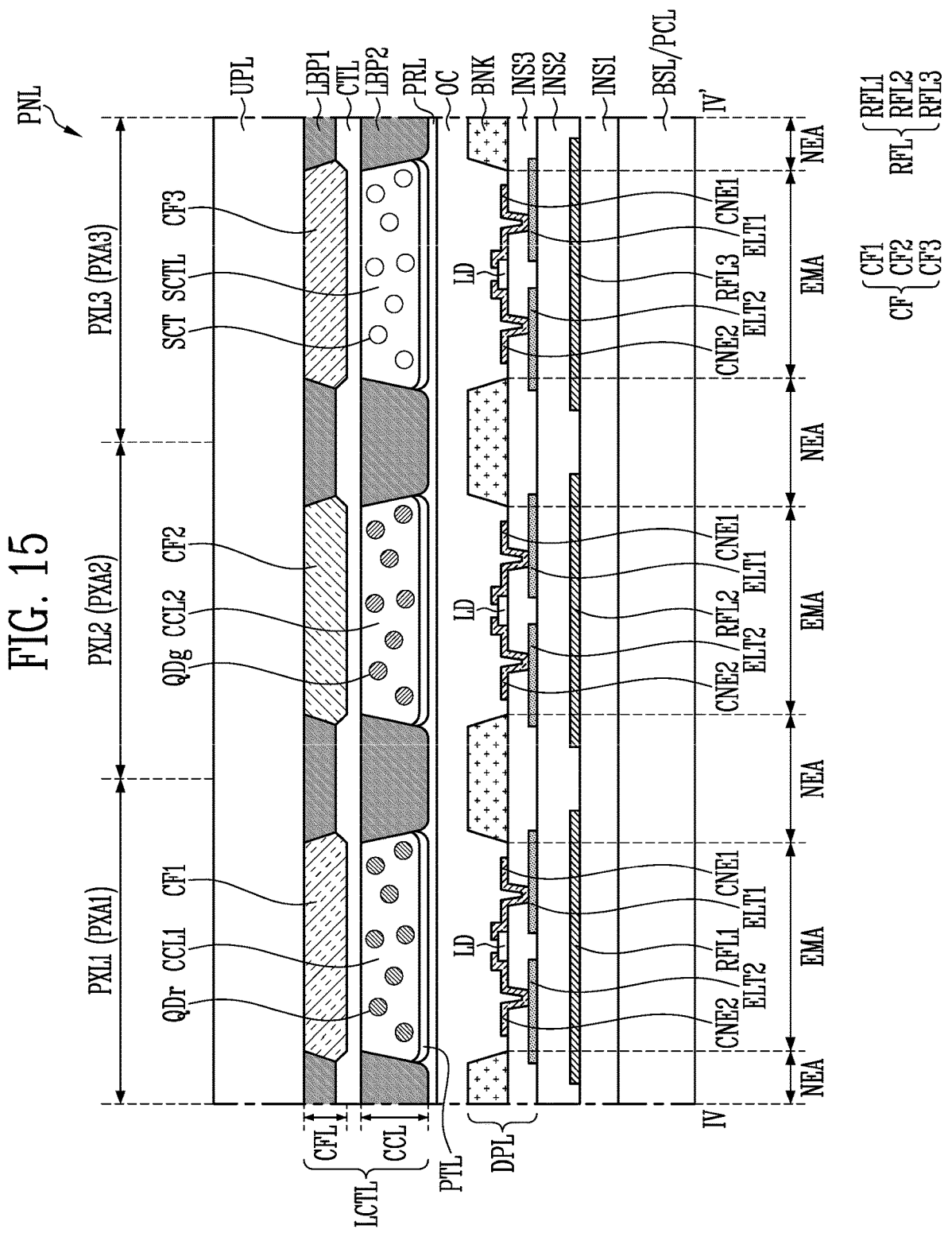
Figure 16:
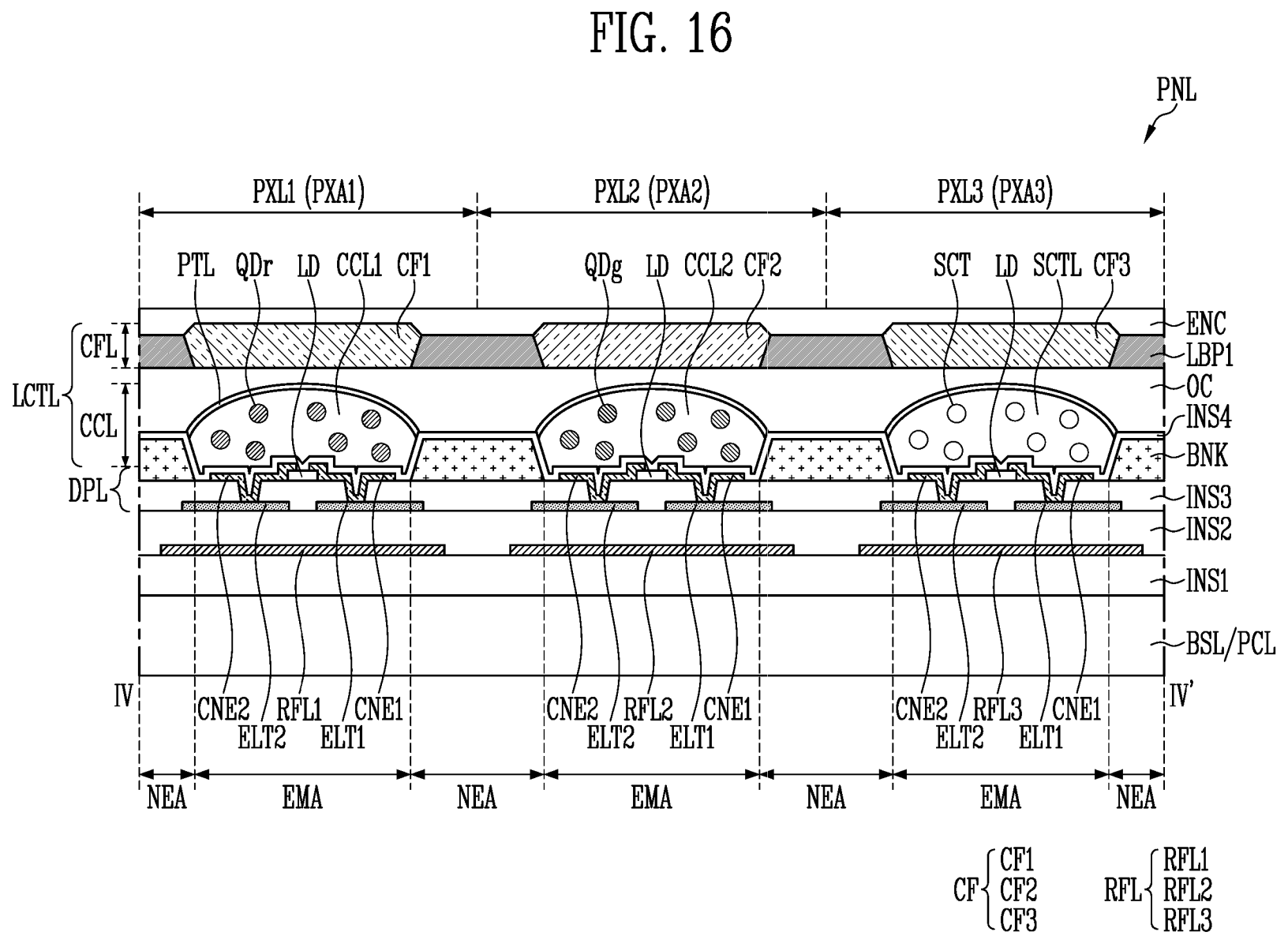

FIGS. 15 and 16 are cross-sectional views each illustrating a display panel PNL according to one embodiment of the present disclosure. For example, FIGS. 15 and 16 illustrate different embodiments of a cross section of a display panel PNL corresponding to an area of a display area DA corresponding to the line IV-IV' of FIG. 12. In some embodiments, FIGS. 15 and 16 illustrate the display panel PNL including the display area DA according to the embodiment of FIG. 12, but the present disclosure is not limited thereto. For example, the display panel PNL including the display area DA according to the embodiment of FIG. 7 may also include a light control layer LCTL described in the embodiments of FIGS. 15 and 16. In the embodiments of FIGS. 15 and 16, components similar or identical to those of the above-described embodiments are denoted by the same reference numerals, and detailed descriptions thereof will be omitted.

First, referring to FIGS. 3-15, the display panel PNL may include a base layer BSL, and a circuit layer PCL and/or a display layer DPL provided on one surface of the base layer BSL. The display layer DPL may include light-emitting units EMU provided in an emission area EMA of each of pixels PXL and may further include a bank BNK provided in a non-emission area NEA so as to have an opening corresponding to each emission area EMA.

The bank BNK may be disposed in the non-emission area NEA between the emission areas EMA. For example, the bank BNK may be provided in the non-emission area NEA to surround each emission area EMA. In one embodiment, the bank BNK may be disposed on a third insulating film INS3, but the position of the bank BNK may vary according to embodiments.

The bank BNK may be formed as a dam structure defining each emission area EMA to which the light-emitting elements LD should be supplied in a process of providing light-emitting elements LD to each pixel PXL. For example, each emission area EMA may be partitioned by the bank BNK, thereby supplying a desired type and/or amount of light-emitting element ink to the emission area EMA.

The bank BNK may include at least one light-blocking material and/or reflective material to prevent light leakage between adjacent pixels PXL. For example, the bank BNK may include at least one black matrix material (for example, at least one light-blocking material currently known) selected from various types of black matrix materials, and/or a color filter material of a specific color. For example, the bank BNK may be formed in a black opaque pattern capable of blocking transmission of light. In one embodiment, a reflective film may be formed on a surface (for example, a sidewall) of the bank BNK so as to increase the luminous efficiency of each pixel PXL.

An overcoat layer OC and the like may be disposed on one surface of the base layer BSL on which the pixels PXL, the bank BNK, and the like are provided. The overcoat layer OC may planarize one surface of the base layer BSL on which the pixels PXL, the bank BNK, and the like are provide. In one embodiment, the overcoat layer OC may include a filler layer having a low refractive index so as to increase the luminous efficiency of light generated from the pixels PXL, but the present disclosure is not limited thereto.

Furthermore, the display panel PNL may further include the light control layer LCTL and an upper substrate UPL disposed on the display layer DPL.

The light control layer LCTL may include at least one of a color filter layer CFL and a color conversion layer CCL. In one embodiment, a light-transmitting intermediate layer CTL having a low refractive index may be selectively interposed between the color filter layer CFL and the color conversion layer CCL, and a light-transmitting protective layer PRL (or capping layer) may be selectively disposed on a surface of the light control layer LCTL (for example, a surface facing one surface of the base layer BSL on which the pixels PXL are provided).

The color filter layer CFL may include a color filter CF corresponding to a color of each pixel PXL. For example, the color filter layer CFL may include a first color filter CF1 disposed on a first color pixel PXL1 to selectively transmit light generated in the first color pixel PXL1, a second color filter CF2 disposed on a second color pixel PXL2 to selectively transmit light generated in the second color pixel PXL2, and a third color filter CF3 disposed on a third color pixel PXL3 to selectively transmit light generated in the third color pixel PXL3. In one embodiment, the first color filter CF1, the second color filter CF2, and the third color filter CF3 may be a red color filter, a green color filter, and a blue color filter, respectively but are not limited thereto.

The first color filter CF1 may be disposed between the first color pixel PXL1 and the upper substrate UPL and may include a color filter material that selectively transmits first color light generated in the first color pixel PXL1. For example, when the first color pixel PXL1 is a red color pixel, the first color filter CF1 may include a red color filter material.

The second color filter CF2 may be disposed between the second color pixel PXL2 and the upper substrate UPL and may include a color filter material that selectively transmits second color light generated in the second color pixel PXL2. For example, when the second color pixel PXL2 is a green color pixel, the second color filter CF2 may include a green color filter material.

The third color filter CF3 may be disposed between the third color pixel PXL3 and the upper substrate UPL and may include a color filter material that selectively transmits third color light generated in the third color pixel PXL3. For example, when the third color pixel PXL3 is a blue color pixel, the third color filter CF3 may include a blue color filter material.

A first light-blocking pattern LBP1 may be disposed between the color filters CF. For example, the first light-blocking pattern LBP1 may be provided in the non-emission area NEA so as to overlap the bank BNK. The first light-blocking pattern LBP1 may be opened in an area corresponding to each emission area EMA.

The first light-blocking pattern LBP1 may include at least one black matrix material (for example, at least one light-blocking material currently known) selected from various types of black matrix materials, and/or a color filter material of a specific color. In some embodiments, the first light-blocking pattern LBP1 may be made of the same material as the bank BNK, but the present disclosure is not limited thereto. That is, the first light-blocking pattern LBP1 and the bank BNK may include the same or different materials.

The color conversion layer CCL (also referred to as "light conversion layer") may be selectively provided between the display layer DPL and the color filter layer CFL. For example, the first to third color pixels PXL1, PXL2, and PXL3 may include the light-emitting elements LD that emit light having the same color. As an example, the first, second, and third color pixels PXL1, PXL2, and PXL3 may include blue light-emitting elements LD that emit blue light having a wavelength of about 400 nm to 500 nm.

In this case, the color conversion layer CCL including at least one type of color conversion particles may be disposed on at least some pixels PXL from among the first, second, and third color pixels PXL1, PXL2, and PXL3. In one embodiment, the color conversion particles may be quantum dots corresponding to a color (e.g., a set or predetermined color) but are not limited thereto. In some embodiments, when the first, second, and third color pixels PXL1, PXL2, and PXL3 include the light-emitting elements LD having different colors corresponding to colors of the pixel PXLs, the display layer DPL may not include the color conversion layer CCL.

The color conversion layer CCL may include a first color conversion layer CCL1 (also referred to as "first light conversion layer" or "first wavelength conversion layer") provided on the emission area EMA of the first color pixel PXL1, and a second color conversion layer CCL2 (also referred to as "second light conversion layer" or a "second wavelength conversion layer") provided on the emission area EMA of the second color pixel PXL2. In some embodiments, the color conversion layer CCL may selectively further include a light-scattering layer SCTL (also referred to as "third light conversion layer") provided on the emission area EMA of the third color pixel PXL3.

In one embodiment, a protective layer PTL may be provided on a surface of each of the first color conversion layer CCL1, the second color conversion layer CCL2, and the light-scattering layer SCTL. The protective layer PTL may be provided as a capping layer for protecting the first color conversion layer CCL1, the second color conversion layer CCL2, and the light-scattering layer SCTL. The protective layer PTL may be formed as at least one layer of an inorganic insulating film, but the present disclosure is not limited thereto.

The first color conversion layer CCL1 may be disposed on the first color pixel PXL1 to convert a color of light emitted from the light-emitting elements LD of the first color pixel PXL1 into another color. For example, the first color conversion layer CCL1 may be disposed between the light-emitting elements LD of the first color pixel PXL1 and the first color filter CF1 and may include first color conversion particles.

As an example, when the light-emitting elements LD disposed in the first color pixel PXL1 are blue light-emitting elements and the first color pixel PXL1 is a red color pixel, the first color conversion layer CCL1 may include red color quantum dot QDr that convert blue color light emitted from the blue light-emitting elements into red color light. In this case, the first color filter CF1 may be a red color filter.

For example, the first color conversion layer CCL1 may include the plurality of red color quantum dots QDr dispersed in a matrix material (e.g., a set or predetermined matrix material) such as a transparent resin. The red color quantum dots QDr may absorb blue color light and shift a wavelength according to an energy transition to emit red color light in a wavelength of about 620 nm to 780 nm. In some embodiments, when the first color pixel PXL1 is a different color pixel, the first color conversion layer CCL1 may include first quantum dots corresponding to a color of the first color pixel PXL1.

The second color conversion layer CCL2 may be disposed on the second color pixel PXL2 to convert a color of light emitted from the light-emitting elements LD of the second color pixel PXL2 into another color. For example, the second color conversion layer CCL2 may be disposed between the light-emitting elements LD of the second color pixel PXL2 and the second color filter CF2 and may include second color conversion particles.

As an example, when the light-emitting elements LD disposed in the second color pixel PXL2 are blue light-emitting elements and the second color pixel PXL2 is a green color pixel, the second color conversion layer CCL2 may include green color quantum dots QDg for converting blue color light emitted from the blue light-emitting elements into green color light. In this case, the second color filter CF2 may be a green color filter.

For example, the second color conversion layer CCL2 may include the plurality of green color quantum dots QDg dispersed in a matrix material (e.g., a set or predetermined matrix material) such as a transparent resin. The second quantum dots QDr may absorb blue color light and shift a wavelength according to an energy transition to emit green color light in a wavelength of about 500 nm to about 570 nm.

In some embodiments, when the second color pixel PXL2 is a different color pixel, the second color conversion layer CCL2 may include second quantum dots corresponding to a color of the second color pixel PXL2.

The light-scattering layer SCTL may be disposed on the third color pixel PXL3. For example, the light-scattering layer SCTL may be disposed between the light-emitting elements LD of the third color pixel PXL3 and the third color filter CF3. In some embodiments, the light-scattering layer SCTL may be omitted.

According to some embodiments, when the light-emitting elements LD disposed in the third color pixel PXL3 are blue light-emitting elements and the third color pixel PXL3 is a blue color pixel, the light-scattering layer SCTL may be selectively provided in order to efficiently utilize light emitted from the blue light-emitting elements. The light-scattering layer SCTL may include at least one type of light-scattering particles SCT. In this case, the third color filter CF3 may be a blue color filter.

For example, the light-scattering layer SCTL may include the plurality of light-scattering particles SCT dispersed in a matrix material (e.g., a set or predetermined matrix material). As an example, the light-scattering layer SCLT may include light-scattering particles SCT of titanium dioxide (TiO2) such as titanium dioxide (TiO2), or silica, but the present disclosure is limited thereto. In some embodiments, the light-scattering particles SCT do not have to be disposed only on the third color pixel PXL3. As an example, the first and/or second color conversion layers CCL1 and CCL2 may also selectively include the light-scattering particles SCT.

According to some embodiments, blue color light having a relatively short wavelength in a visible light region may be incident on each of the red color quantum dots QDr and the green color quantum dots QDg, thereby increasing an absorption coefficient of the red color quantum dots QDr and the green color quantum dots QDg. Accordingly, the efficiency of light emitted from the first and second color pixels PXL1 and PXL2 can be finally increased, and excellent color reproducibility can also be secured. In some embodiments, when the light-emitting units EMU of the first, second, and third color pixels PXL1, PXL2, and PXL3 are formed using the same color light-emitting elements LD (for example, the blue light-emitting elements LD), it is possible to increase the manufacturing efficiency of the display device.

A second light-blocking pattern LBP2 may be disposed between the first color conversion layer CCL1, the second color conversion layer CCL2, and/or the light-scattering layer SCTL. For example, the second light-blocking pattern LBP2 may be provided in the non-emission area NEA so as to overlap the first light-blocking pattern LBP1 and the bank BNK. As an example, the second light-blocking pattern LBP2 may be disposed between the first light-blocking pattern LBP1 and the bank BNK. The second light-blocking pattern LBP2 may be opened in an area corresponding to each emission area EMA.

The second light-blocking pattern LBP2 may include at least one black matrix material (for example, at least one light-blocking material currently known) selected from various types of black matrix materials, and/or a color filter material of a specific color. In some embodiments, the second light-blocking pattern LBP2 may be made of the same material as the first light-blocking pattern LBP1 and/or the bank BNK, but the present disclosure is not limited thereto. That is, the first light-blocking pattern LBP1, the second light-blocking pattern LBP2, and/or the bank BNK may include the same or different materials.

The upper substrate UPL (also referred to as "encapsulation substrate" or "color filter substrate") may be disposed on the base layer BSL on which the pixels PXL and the like are provided. In one embodiment, the light control layer LCTL or the like may be provided on one surface of the upper substrate UPL facing the pixels PXL.

The upper substrate UPL may be a rigid or flexible substrate (or film). In one embodiment, when the upper substrate UPL is the rigid substrate, the upper substrate UPL may be one of a glass substrate, a quartz substrate, a glass ceramic substrate, and a crystalline glass substrate. In another embodiment, when the upper substrate UPL is the flexible substrate, the upper substrate UPL may be one of a film substrate and a plastic substrate including a polymer organic material. In some embodiments, the upper substrate UPL may include fiber glass reinforced plastic (FRP).

In some embodiments, FIG. 15 illustrates the embodiment in which the upper substrate UPL is disposed on the base layer BSL on which the pixels PXL are disposed is disclosed, but the present disclosure is not limited thereto. For example, at least a portion of the light control layer LCTL (for example, the color conversion layer CCL and/or the color filter layer CFL) may be disposed on one surface of the base layer BSL on which the pixels PXL are disposed, and one surface of the base layer BSL may be sealed using a thin film encapsulation layer or the like.

Referring to FIGS. 3-16, the display panel PNL (or display layer DPL) may further include a fourth insulating film INS4 formed on a display area DA in which the electrodes and the light-emitting elements LD of each pixel PXL, the bank BNK, and the like are formed. The light control layer LCTL and an encapsulation layer ENC may be sequentially formed on one surface of the base layer BSL on which the fourth insulating film INS4 is formed. In this case, the display panel PNL may not include the upper substrate UPL.

The fourth insulating film INS4 may be selectively formed on the display area DA in which the electrodes and the light-emitting elements LD of each pixel PXL, and the bank BNK are formed. The fourth insulating film INS4 may include at least one inorganic insulating material and/or organic insulating material. For example, the fourth insulating film INS4 may include various types of organic/inorganic insulating materials such as silicon nitride (SiN$_x$), silicon oxide (SiO$_x$), and aluminum oxide (Al$_x$O$_y$). In some embodiments, the fourth insulating film INS4 may be formed as a single-layer or multi-layer.

In one embodiment, the fourth insulating film INS4 may include only an inorganic layer and may have a surface profile according to the electrodes, the insulating layers, and/or the bank BNK thereunder. In another embodiment, the fourth insulating film INS4 may include an organic layer and may planarize one surface of the base layer BSL on which the bank BNK and the like is formed. In still another embodiment, the fourth insulating film INS4 may be formed only in the emission areas EMA by being removed on the bank BNK.

The light control layer LCTL may include at least one of the color conversion layer CCL and the color filter layer CFL. The color conversion layer CCL may include the first color conversion layer CCL1, the second color conversion layer CCL2, and/or the light-scattering layer SCTL formed on the emission area EMA in which the fourth insulating film INS4 is selectively provided. In one embodiment, when formation areas of the first color conversion layer CCL1, the second color conversion layer CCL2, and/or the light-scattering layer SCTL can be sufficiently partitioned by the bank BNK, the second light-blocking pattern LBP2 described in the embodiment of FIG. 15 may be omitted or integrated with the bank BNK. In another embodiment, the second light-blocking pattern LBP2 may be formed on the bank BNK.

In one embodiment, the overcoat layer OC may be formed on the color conversion layer CCL, and the color filter layer CFL may be formed on the overcoat layer OC. In another embodiment, the overcoat layer OC may be first formed on one surface of the base layer BSL, and the color conversion layer CCL and the color filter layer CFL may be formed on the overcoat layer OC).

The encapsulation layer ENC may be provided on one surface of the base layer BSL on which the pixels PXL and the light control layer LCTL are formed.

The encapsulation layer ENC may be a single-layered or multi-layered thin film encapsulation layer. When the encapsulation layer ENC is the multi-layered thin film encapsulation layer, the encapsulation layer ENC may include an inorganic layer and/or an organic layer. For example, the encapsulation layer ENC may have a multi-layered structure in which an inorganic film, an organic film, and an inorganic film are sequentially stacked. The encapsulation layer ENC may protect the pixels PXL from external air and moisture.

According to a display device and a method of manufacturing the same according to various embodiments of the present disclosure, it is possible to secure a front luminous efficiency of a pixel including a light-emitting element and also reduce the number of masks to improve manufacturing efficiency. In addition, it is possible to secure the electrical stability of a contact portion for connecting a circuit unit and a light-emitting unit of each pixel.

The technical spirit of the preset disclosure has been described according to the embodiments, but it is to be noted that the embodiments are provided for the description thereof and are not for the limitation thereof. Further, those skilled in the art will appreciate that various modifications may be made without departing from the scope and spirit of the present disclosure.

The scope of the present disclosure is not limited to the details described in the detailed description of the specification but should be defined by the claims. In addition, it shall be understood that all modifications and embodiments conceived from the meaning and scope of the claims and their equivalents are included in the scope of the present disclosure.

What is claimed is:

1. A display device comprising:
   a base layer on which a display area of the display device is defined;
   a circuit layer comprising a conductive pattern in a pixel area of the display area;
   a first insulating film on the circuit layer, the first insulating film having a first opening exposing the conductive pattern;
   a contact hole comprising the first opening of the first insulating film and a second opening of a second insulating film;
   a reflective film on the first insulating film and including a third opening that corresponds to the contact hole;
   the second insulating film on the reflective film and including the second opening overlapping the contact hole; and
   a display layer on the second insulating film, connected to the conductive pattern through the contact hole, and comprising a first electrode, a second electrode, and a light-emitting element overlapping the reflective film,
   wherein the third opening of the reflective film overlaps the second opening of the second insulating film,
   wherein the third opening of the reflective film is larger than the second opening of the second insulating film, and
   wherein a peripheral area around the second opening of the second insulating film covers a peripheral area around the third opening of the reflective film, wherein a slope of the second insulating film in the second opening is different from a slope of the first insulating film in the first opening and a slope of the reflective film in the third opening.

2. The display device of claim 1, wherein the second insulating film completely covers a surface of the reflective film including a side surface of the reflective film.

3. The display device of claim 1, wherein the conductive pattern is formed as a multi-layer pattern comprising a metal film and a transparent conductive film on the metal film.

4. The display device of claim 3, wherein, in the contact hole, the first electrode is in contact with an upper surface of the transparent conductive film to be connected to the conductive pattern.

5. The display device of claim 1, wherein the reflective film is formed as a metal film comprising at least one type of a metal or an alloy.

6. The display device of claim 1, wherein the reflective film includes a plurality of third openings corresponding to respective contact holes positioned in respective pixel areas, and
   the second insulating film includes a plurality of second openings respectively overlapping the plurality of third openings at all points at which the plurality of third openings is located.

7. The display device of claim 1, wherein the reflective film completely overlaps at least one area of each of the first electrode and the second electrode and a lower portion of an emission area in which the light-emitting element is located.

8. The display device of claim 7, wherein each of the first electrode and the second electrode comprises a transparent conductive material.

9. The display device of claim 1, wherein the first electrode and the second electrode are spaced from each other on the second insulating film, and
   wherein the light-emitting element is between the first electrode and the second electrode.

10. The display device of claim 9, wherein the display layer further comprises:
   a first contact electrode connecting a first end portion of the light-emitting element to the first electrode; and
   a second contact electrode connecting a second end portion of the light-emitting element to the second electrode.

11. The display device of claim 1, wherein the circuit layer comprises circuit elements and lines in respective pixel areas, and
   the conductive pattern comprises at least one of a bridge pattern connecting at least one of the circuit elements and the first electrode, and a power line connected to the second electrode.

12. The display device of claim 11, wherein the contact hole comprises at least one of a first contact hole and a second contact hole, the bridge pattern and the first electrode being connected through the first contact hole, and the power line and the second electrode being connected through the second contact hole.

13. The display device of claim 1, wherein the reflective film comprises a plurality of division patterns disconnected at a peripheral area of the pixel area to be separated from each other.

* * * * *